United States Patent
Sugisawa et al.

(10) Patent No.: US 9,224,976 B2
(45) Date of Patent: Dec. 29, 2015

(54) LIGHT-EMITTING ELEMENT, LIGHT-EMITTING DEVICE, ELECTRONIC DEVICE, AND LIGHTING DEVICE

(75) Inventors: Nozomu Sugisawa, Kanagawa (JP); Toshiki Sasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1007 days.

(21) Appl. No.: 12/620,294

(22) Filed: Nov. 17, 2009

(65) Prior Publication Data

US 2010/0123152 A1    May 20, 2010

(30) Foreign Application Priority Data

Nov. 19, 2008  (JP) ................... 2008-296047

(51) Int. Cl.
*H01L 33/40* (2010.01)
*H01L 51/52* (2006.01)
*H01L 51/50* (2006.01)

(52) U.S. Cl.
CPC ........ *H01L 51/5206* (2013.01); *H01L 51/5052* (2013.01); *H01L 51/5088* (2013.01); *H01L 51/5234* (2013.01); *H01L 2251/5315* (2013.01)

(58) Field of Classification Search
USPC .......................................................... 257/79
See application file for complete search history.

(56) References Cited

U.S. PATENT DOCUMENTS

| | | |
|---|---|---|
| 5,404,075 A | 4/1995 | Fujikawa et al. |
| 5,989,737 A | 11/1999 | Xie et al. |
| 6,013,384 A | 1/2000 | Kido et al. |
| 6,380,687 B1 | 4/2002 | Yamazaki |
| 6,423,429 B2 | 7/2002 | Kido et al. |
| 6,483,236 B1 | 11/2002 | Hung |
| 6,486,601 B1 | 11/2002 | Sakai et al. |
| 6,489,638 B2 | 12/2002 | Seo et al. |
| 6,518,700 B1 | 2/2003 | Friend et al. |
| 6,552,496 B2 | 4/2003 | Yamazaki |
| 6,573,650 B2 | 6/2003 | Aoki et al. |
| 6,589,673 B1 | 7/2003 | Kido et al. |
| 6,642,544 B1 | 11/2003 | Hamada et al. |
| 6,650,047 B2 | 11/2003 | Aoki et al. |

(Continued)

FOREIGN PATENT DOCUMENTS

| | | |
|---|---|---|
| EP | 0 855 848 A2 | 7/1998 |
| EP | 0 948 063 A2 | 10/1999 |

(Continued)

OTHER PUBLICATIONS

Nakada, T. et al., "Multi Photon Emission Organic EL Devices Using Charge-Transfer Complex as Charge Generation Layer," 63rd Applied Physics-Related Combined Seminar—Seminar Proceedings, Sep. 24, 2002, p. 1165 (with English translation).

(Continued)

*Primary Examiner* — David Vu
*Assistant Examiner* — Jonathan Han
(74) *Attorney, Agent, or Firm* — Husch Blackwell LLP

(57) ABSTRACT

Provided is a light-emitting element including an anode over a substrate, a layer containing a composite material in which a metal oxide is added to an organic compound, a light-emitting layer, and a cathode having a light-transmitting property. The anode is a stack of a film of an aluminum alloy and a film containing titanium or titanium oxide. The film containing titanium or titanium oxide is in contact with the layer containing a composite material.

9 Claims, 25 Drawing Sheets

(56) References Cited

U.S. PATENT DOCUMENTS

| | | |
|---|---|---|
| 6,774,573 B2 | 8/2004 | Yamazaki |
| 6,794,278 B2 | 9/2004 | Kido et al. |
| 6,830,494 B1 * | 12/2004 | Yamazaki et al. ............... 445/24 |
| 6,831,408 B2 | 12/2004 | Hirano et al. |
| 6,993,214 B2 | 1/2006 | Nishimura et al. |
| 7,074,500 B2 | 7/2006 | Pfeiffer et al. |
| 7,126,269 B2 | 10/2006 | Yamada |
| 7,276,297 B2 | 10/2007 | Lee et al. |
| 7,321,196 B2 | 1/2008 | Cheng et al. |
| 7,323,225 B2 | 1/2008 | Aoki et al. |
| 7,374,828 B2 | 5/2008 | Kondakova et al. |
| 7,687,986 B2 | 3/2010 | Nakayama |
| 7,851,989 B2 | 12/2010 | Noda |
| 8,362,688 B2 | 1/2013 | Noda |
| 2001/0004190 A1 | 6/2001 | Nishi et al. |
| 2001/0025959 A1 | 10/2001 | Yamazaki et al. |
| 2001/0041270 A1 | 11/2001 | Maruyama et al. |
| 2001/0043046 A1 | 11/2001 | Fukunaga |
| 2001/0046611 A1 | 11/2001 | Kido et al. |
| 2001/0053559 A1 | 12/2001 | Nagao et al. |
| 2002/0093290 A1 | 7/2002 | Yamazaki |
| 2003/0111666 A1 | 6/2003 | Nishi et al. |
| 2003/0189401 A1 | 10/2003 | Kido et al. |
| 2003/0214246 A1 | 11/2003 | Yamazaki |
| 2004/0140758 A1 | 7/2004 | Raychaudhuri et al. |
| 2004/0160154 A1 | 8/2004 | Nishimura et al. |
| 2005/0006667 A1 | 1/2005 | Yamazaki |
| 2005/0035708 A1 | 2/2005 | Yamazaki et al. |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2005/0170208 A1 | 8/2005 | Yatsunami et al. |
| 2005/0248267 A1 | 11/2005 | Gyoutoku et al. |
| 2006/0008740 A1 | 1/2006 | Kido et al. |
| 2006/0186804 A1 | 8/2006 | Sakakura et al. |
| 2006/0232203 A1 | 10/2006 | Noda |
| 2006/0263638 A1 * | 11/2006 | Kawakami et al. ............ 428/690 |
| 2007/0080630 A1 * | 4/2007 | Egawa et al. .................. 313/504 |
| 2007/0200125 A1 | 8/2007 | Ikeda et al. |
| 2008/0121522 A1 | 5/2008 | Ehira et al. |
| 2009/0001373 A1 * | 1/2009 | Ochi et al. ......................... 257/59 |
| 2009/0026935 A1 * | 1/2009 | Matsunami et al. ........... 313/504 |
| 2009/0108254 A1 | 4/2009 | Lee et al. |
| 2010/0032186 A1 | 2/2010 | Gotou et al. |
| 2013/0119379 A1 | 5/2013 | Noda |

FOREIGN PATENT DOCUMENTS

| | | |
|---|---|---|
| EP | 1 009 198 A1 | 6/2000 |
| EP | 1 065 723 A2 | 1/2001 |
| EP | 1 089 361 A2 | 4/2001 |
| EP | 1 093 167 A2 | 4/2001 |
| EP | 1 128 438 A1 | 8/2001 |
| EP | 1 160 891 A2 | 12/2001 |
| EP | 1 261 042 A1 | 11/2002 |
| EP | 1 351 558 A1 | 10/2003 |
| EP | 1 424 732 A2 | 6/2004 |
| EP | 1 524 706 A2 | 4/2005 |
| EP | 1 524 707 A2 | 4/2005 |
| EP | 1 530 245 A2 | 5/2005 |
| EP | 1 923 479 A1 | 5/2008 |
| JP | 1-312873 A | 12/1989 |
| JP | 2-139892 A | 5/1990 |
| JP | 3-114197 A | 5/1991 |
| JP | 3-190088 A | 8/1991 |
| JP | 3-274695 A | 12/1991 |
| JP | 4-357694 A | 12/1992 |
| JP | 5-182766 A | 7/1993 |
| JP | 6-267658 A | 9/1994 |
| JP | 6-290873 A | 10/1994 |
| JP | 7-312289 A | 11/1995 |
| JP | 9-63771 A | 3/1997 |
| JP | 10-008245 A | 1/1998 |
| JP | 10-255985 A | 9/1998 |
| JP | 10-270171 A | 10/1998 |
| JP | 10-308284 A | 11/1998 |
| JP | 2824411 | 11/1998 |
| JP | 10-324530 A | 12/1998 |
| JP | 11-251067 A | 9/1999 |
| JP | 11-297474 A | 10/1999 |
| JP | 11-307259 A | 11/1999 |
| JP | 11-307264 A | 11/1999 |
| JP | 2000-223276 A | 8/2000 |
| JP | 2000-315580 A | 11/2000 |
| JP | 2000-315581 A | 11/2000 |
| JP | 2001-43980 | 2/2001 |
| JP | 2001-76868 A | 3/2001 |
| JP | 2001-185354 A | 7/2001 |
| JP | 2001-244079 A | 9/2001 |
| JP | 2002-15873 A | 1/2002 |
| JP | 2002-332567 A | 11/2002 |
| JP | 2002-367784 A | 12/2002 |
| JP | 2003-109775 | 4/2003 |
| JP | 2003-229278 A | 8/2003 |
| JP | 2003-272860 A | 9/2003 |
| JP | 2004-134395 A | 4/2004 |
| JP | 2004-514257 A | 5/2004 |
| JP | 2004-178930 A | 6/2004 |
| JP | 2004-349007 A | 12/2004 |
| JP | 2005-26121 A | 1/2005 |
| JP | 2005-32618 A | 2/2005 |
| JP | 2005-56848 | 3/2005 |
| JP | 2005-123094 A | 5/2005 |
| JP | 2005-123095 A | 5/2005 |
| JP | 2005-166637 A | 6/2005 |
| JP | 2005-251587 A | 9/2005 |
| JP | 2006-303463 | 11/2006 |
| JP | 2007-5784 | 1/2007 |
| JP | 2007-103303 | 4/2007 |
| JP | 2008-122941 | 5/2008 |
| JP | 2008-127624 A | 6/2008 |
| JP | 2008-216490 A | 9/2008 |
| JP | 2008-234885 A | 10/2008 |
| WO | WO 00/01203 A1 | 1/2000 |
| WO | WO 02/41414 A1 | 5/2002 |
| WO | WO 03/030592 A1 | 4/2003 |
| WO | WO 2005/006460 A1 | 1/2005 |
| WO | WO 2007/129874 A1 | 11/2007 |

OTHER PUBLICATIONS

Tokito, S. et al., "Metal Oxides as a Hole-Injecting Layer for an Organic Electroluminescent Device," Journal of Physics D: Applied Physics, 1996, vol. 29, pp. 2750-2753.

* cited by examiner

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element using electroluminescence. Further, the present invention relates to a light-emitting device and an electronic device using the light-emitting element. The present invention relates to a lighting device using the light-emitting device.

2. Description of the Related Art

In recent years, research and development of light-emitting elements using electroluminescence have been extensively conducted. In the basic structure of such a light-emitting element, a layer including a light-emitting substance is interposed between a pair of electrodes. By applying a voltage to this element, light emission can be obtained from the light-emitting substance.

Since this type of light-emitting element is a self-luminous type, it has advantages over a liquid crystal display in that visibility of a pixel is high and that no backlight is needed. Therefore, light-emitting elements are thought to be suitable as display elements. Further, such a light-emitting element also has advantages in that the element can be formed to be thin and lightweight and that response speed is very high.

Further, since this type of a light-emitting element can be formed to have a film shape, surface light emission can be easily obtained. This feature is difficult to realize with point light sources typified by a filament lamp and an LED or with linear light sources typified by a fluorescent light. Therefore, such light-emitting elements also have a high utility value as surface light source that can be applied to lighting apparatuses or the like.

Light-Emitting elements using electroluminescence are broadly classified according to whether they use an organic compound or an inorganic compound as a light-emitting substance.

When an organic compound is used as a light-emitting substance, by application of a voltage to a light-emitting element, electrons and holes are injected into a layer including the light-emitting organic compound from a pair of electrodes, whereby a current flows. Then, carriers (i.e., electrons and holes) recombine to place the light-emitting organic compound into an excited state. The light-emitting organic compound returns to a ground state from the excited state, thereby emitting light. Because of such a mechanism, the light-emitting element is called a current-excitation light-emitting element.

Note that as types of an excited state of an organic compound, a singlet excited state and a triplet excited state are known. It is thought that light emission can be obtained through either of the excited states.

In an attempt to improve element characteristics, there are many problems which depend on a material used, and in order to solve these problems, improvement of element structure, development of a material, and the like have been carried out.

For example, to apply a light-emitting element to an active matrix type display device, usually, the light-emitting element is formed over an element substrate provided with a transistor that controls light emission and the like. A problem with such a structure has been that a bottom emission structure where light emitted from a light-emitting element is extracted to the outside through an element substrate provided with a transistor and the like could decrease aperture ratio due to a wiring, the transistor, or the like.

In order to solve this problem, a structure by which emitted light is extracted from the side opposite an element substrate provided with a transistor and the like (a top emission structure) is disposed (see Patent Document 1, for example). Use of a top emission structure contributes to improvement of the aperture ratio, resulting in an increase in emission efficiency.

REFERENCE

Patent Document

[Patent Document 1] Japanese Published Patent Application No. 2001-043980

SUMMARY OF THE INVENTION

For an anode formed over a substrate in a top emission structure, a high work function metal is desirably used in terms of hole-injection property. According to the description in Patent Document 1, a metal selected from chromium, molybdenum, tungsten, and niobium is included in a portion of an anode formed on the lower side which is in contact with an organic layer. However, it is said that properties of these metals are deficient in reflectivity. In addition, the metals are relatively expensive to increase the cost of manufacturing a light-emitting element.

It is therefore an object of one embodiment of the present invention to apply highly versatile materials so that the cost of manufacturing a light-emitting element can be reduced. Another object is to reduce the costs of manufacturing a light-emitting device, an electronic device, and a lighting device.

Still another object of one embodiment of the present invention is to improve emission efficiency of a light-emitting element.

Yet another object of one embodiment of the present invention is to reduce drive voltage of a light-emitting element.

A still further object of one embodiment of the present invention is to reduce power consumption of a light-emitting element, a light-emitting device, an electronic device, and a lighting device.

Through detailed studies, the inventors have found that the above problems can be solved with a structure where an anode is a stack of a film of an alloy including aluminum and a film including a metal or a metal oxide and a layer including a composite material in which a metal oxide is added to an organic compound is used as a layer in contact with the anode.

Specifically, one embodiment of the present invention is a light-emitting element including an anode formed over a substrate, a layer including a composite material in which a metal oxide is added to an organic compound, a light-emitting layer, and a cathode having a light-transmitting property. The anode is a stack of a film of an alloy including aluminum and a film including titanium or titanium oxide. The film including titanium or titanium oxide is in contact with the layer including a composite material.

Another embodiment of the present invention is a light-emitting element including an anode formed over a substrate, a layer including a composite material in which a metal oxide is added to an organic compound, a light-emitting layer, a buffer layer, and a cathode having a light-transmitting property. The anode is a stack of a film of an alloy including aluminum and a film including titanium or titanium oxide. The film including titanium or titanium oxide is in contact with the layer including a composite material. The cathode is a stack of a film of an alloy including magnesium and silver and a film having a light-transmitting property. The buffer layer is in contact with the film including magnesium and silver.

In the above structures, it is preferable that the film having a light-transmitting property be any one of an indium oxide-tin oxide film, an indium oxide-tin oxide film including silicon or silicon oxide, an indium oxide-zinc oxide film, an indium oxide film including tungsten oxide and zinc oxide, a molybdenum oxide film, a tin oxide film, a zinc oxide film, a magnesium oxide film, a silicon oxide film, an aluminum oxide film, a titanium oxide film, a zirconium oxide film, a silicon nitride film, an aluminum nitride film, a titanium nitride film, a zirconium nitride film, a silicon carbide film, and an aluminum carbide film. In addition, the buffer layer preferably includes an alkali metal, an alkaline earth metal or a rare-earth metal, or a compound thereof. Also preferably, the volume ratio of silver to magnesium in the film of an alloy including magnesium and silver is 8:2 (=Ag:Mg) or higher.

In the above structures, the layer including a composite material preferably includes an organic compound and a transition metal oxide. In addition, the film of an alloy including aluminum is preferably a film of an alloy of aluminum and titanium, a film of an alloy of aluminum and neodymium, or a film of an alloy of aluminum and nickel.

In the above structures, the transition metal oxide is preferably molybdenum oxide.

Besides, one embodiment of the present invention encompasses a light-emitting device including the above-described light-emitting element.

Thus, one embodiment of the present invention is a light-emitting device which includes the above-described light-emitting element and a control circuit which controls light emission of the light-emitting element.

Note that the term light-emitting device in this specification includes an image display device, a light-emitting device, and a light source (including a lighting device). Further, the category of the light-emitting device includes: a module in which a connector such as an FPC (flexible printed circuit), TAB (tape automated bonding) tape, or a TCP (tape carrier package) is attached to a panel provided with a light-emitting element; a module in which the top of a TAB tape or a TCP is provided with a printed wire board; a module in which an IC (integrated circuit) is directly mounted on a light-emitting element by a COG (chip on glass) technique; and the like.

Further, the present invention also includes, in its category, an electronic device in which the above light-emitting element of one embodiment of the present invention is used for a display portion. Thus, an electronic device of one embodiment of the present invention has a display portion including the above-described light-emitting element and a control circuit which controls light emission of the light-emitting element.

Furthermore, the present invention also includes, in its category, a lighting device using the light-emitting device of one embodiment of the present invention. Thus, a lighting device of one embodiment of the present invention has the light-emitting device including the above-described light-emitting element and a control circuit which controls light emission of the light-emitting element.

According to one embodiment of the present invention, an aluminum alloy and titanium which are relatively inexpensive materials are used for an electrode, whereby the cost of manufacturing a light-emitting element can be reduced. In addition, the costs of manufacturing a light-emitting device, an electronic device, and a lighting device can be reduced.

By application of one embodiment of the present invention, emission efficiency of a light-emitting element can be improved.

Application of one embodiment of the present invention makes it possible to reduce drive voltage of a light-emitting element.

Application of one embodiment of the present invention can lead to a reduction in power consumption of a light-emitting element, a light-emitting device, an electronic device, or a lighting device.

DETAILED DESCRIPTION OF THE INVENTION

Hereinafter, the embodiments and examples of the present invention will be described in detail with reference to the accompanying drawings. Note that the present invention is not limited to description given below, and various changes and modifications for the modes and details thereof will be apparent to those skilled in the art unless such changes and modifications depart from the spirit and scope of the invention. Therefore, the present invention is not construed as being limited to the following description of the embodiments and examples.

Embodiment 1

Figure 1:
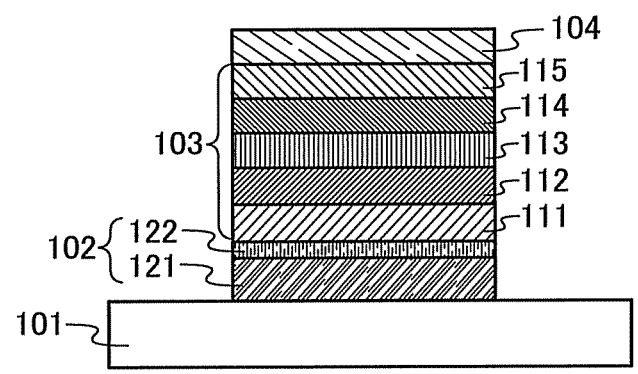
FIG. 1 illustrates a light-emitting element of one embodiment of the present invention.

In this embodiment, one mode of the light-emitting element to which one embodiment of the present invention is applied will be described using FIG. 1.

A light-emitting element described in this embodiment has a plurality of layers between a pair of electrodes. The plurality of layers are a stack of layers each including a substance with a high carrier-injection property or a substance with a high carrier-transport property such that a light-emitting region is formed in a region away from the electrodes, i.e., such that carriers recombine in an area away from the electrodes.

In this embodiment, the light-emitting element includes a first electrode 102, a second electrode 104, and an EL layer 103 provided between the first electrode 102 and the second electrode 104. Note that description will be made below in this embodiment on the assumption that the first electrode 102 functions as an anode and the second electrode 104 functions as a cathode. In other words, the description will be made below regarding light emission as being obtained when a voltage is applied to the first electrode 102 and the second electrode 104 so that the potential of the first electrode 102 is higher than that of the second electrode 104.

A substrate 101 is used as a support of the light-emitting element. The substrate 101 can be formed using, for example, glass, plastic, metal, or the like. Note that materials other than glass or plastic can be used as long as they can function as a support of a light-emitting element.

The first electrode 102 is an electrode that functions as an anode and as a reflective electrode. By using a stack of a film of an alloy including aluminum (hereinafter, referred to as an aluminum alloy film) 121 and a film 122 including a metal or a metal oxide, an electrode having excellent reflectivity can be obtained. Forming the film 122 including a metal or a metal oxide over the aluminum alloy film 121 can suppress oxidation of the aluminum alloy to facilitate hole injection from the first electrode 102 to the EL layer 103. Examples of the aluminum alloy include an alloy of aluminum and titanium, an alloy of aluminum and neodymium, an alloy of aluminum and nickel, and the like. As examples of a material for the film including a metal or a metal oxide which is formed over the aluminum alloy film, there are titanium, titanium oxide, and the like. Further, the above materials are preferable, because they are present in large amounts in the Earth's crust and inexpensive to achieve a reduction in the cost of manufacturing a light-emitting element. In particular, aluminum and titanium are further preferable since they are abundant materials in the Earth's crust.

The EL layer 103 described in this embodiment includes a layer 111 including a composite material, a hole-transport layer 112, a light-emitting layer 113, an electron-transport layer 114, and an electron-injection layer (also referred to as a buffer layer) 115, and the like. Note that, as long as the EL layer 103 includes the light-emitting layer 113 and the layer 111 including a composite material which is provided so as to be contact with the first electrode 102, there is no particular limitation on a stack structure of the other layers. In other words, the EL layer 103 is formed in such a way that a light-emitting layer and a layer including a composite material are combined with layers including a substance having a high electron-transport property, a substance having a high hole-transport property, a substance having a high electron-injection property, a substance having a high hole-injection property, a bipolar substance (a substance having a high electron-transport property and a high hole-transport property), a substance having a high light-emitting property, and/or the like, as appropriate. For example, it is possible to combine a hole-injection layer, a hole-transport layer, a light-emitting layer, an electron-transport layer, an electron-injection layer, and/or the like to form the EL layer 103. Specific materials used to form the layers will be given below.

The layer 111 including a composite material is a layer including a composite material in which an acceptor substance is added to a substance having a high hole-transport property. Note that by the use of the composite material in which an acceptor substance is added to a substance having a high hole-transport property, hole injection from the first electrode 102 is facilitated, which leads to a reduction in the drive voltage of the light-emitting element. Such a composite material can be formed by co-evaporation of a substance having a high hole-transport property and an acceptor substance. Providing this layer 111 including this composite material makes it easy to inject holes from the film 122 including a metal or a metal oxide, such as titanium or titanium oxide, to the EL layer 103.

Note that in the present specification, "composition" means not only a simple mixture of two materials but also a mixture of a plurality of materials in a condition where electric charge can be transferred between the materials.

As the organic compound used for the composite material, any of a variety of compounds such as aromatic amine compounds, carbazole derivatives, aromatic hydrocarbons, or high molecular compounds (oligomers, dendrimers, polymers, etc.) can be used. Note that an organic compound used for the composite material preferably has a high hole-transport property. Specifically, a substance having a hole mobility of $10^{-6}$ cm$^2$/Vs or more is preferably used. Further, any other substance may be used as long as it is a substance in which the hole-transport property is higher than the electron-transport property. Organic compounds that can be used for the composite material are specifically given below.

Examples of the organic compounds that can be used for the composite material include aromatic amine compounds such as 4,4',4"-tris(N,N-diphenylamino)triphenylamine (abbreviated to TDATA), 4,4',4"-tris[N-(3-methylphenyl)-N-phenylamino]triphenylamine (abbreviated to MTDATA), 4,4'-bis[N-(4-diphenylaminophenyl)-N-phenylamino]biphenyl (abbreviated to DPAB), N,N'-bis[4-[bis(3-methylphenyl)amino]phenyl]-N,N-diphenyl-[1,1'-biphenyl]-4,4'-diamine (abbreviated to DNTPD), 1,3,5-tris[N-(4-diphenylaminophenyl)-N-phenylamino]benzene (abbreviated to DPA3B), 3-[N-(9-phenylcarbazol-3-yl)-N-phenylamino]-9-phenylcarbazole (abbreviated to PCzPCA1), 3,6-bis[N-(9-phenylcarbazol-3-yl)-N-phenylamino]-9-phenylcarbazole abbreviated to PCzPCA2), 3-[N-(1-naphthyl)-N-(9-phenylcarbazol-3-yl)amino]-9-phenylcarbazole (abbreviated to PCzPCN1), 4,4'-bis[N-(1-naphthyl)-N-phenylamino]biphenyl (abbreviated to NPB or α-NPD), and N,N'-bis(3-methylphenyl)-N,N'-diphenyl-[1,1'-biphenyl]-4,4'-diamine (abbreviated to TPD); carbazole derivatives such as 4,4'-di(N-carbazolyl)biphenyl (abbreviated to CBP), 1,3,5-tris[4-(N-carbazolyl)phenyl]benzene (abbreviated to TCPB), 9-[4-(10-phenyl-9-anthracenyl)phenyl]-9H-carbazole (abbreviated to CzPA), and 1,4-bis[4-(N-carbazolyl)phenyl]-2,3,5,6-tetraphenylbenzene; and aromatic hydrocarbons such as 2-tert-butyl-9,10-di(2-naphthyl)anthracene (abbreviated to t-BuDNA), 2-tert-butyl-9,10-di(1-naphthyl)anthracene, 9,10-bis(3,5-diphenylphenyl)anthracene (abbreviated to DPPA), 2-tert-butyl-9,10-bis(4-phenylphenyl)anthracene (abbreviated to t-BuDBA), 9,10-di(2-naphthyl)anthracene (abbreviated to DNA), 9,10-diphenylanthracene (abbreviated to DPAnth), 2-tert-butylanthracene (abbreviated to t-BuAnth), 9,10-bis(4-methyl-1-naphthyl)anthracene (abbreviated to DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviated to DPVBi), and 9,10-bis[4-(2,2-diphenylvinyl) phenyl]anthracene (abbreviated to DPVPA). Further, a high molecular compound (such as an oligomer, a dendrimer, or a polymer) can be used. For example, the following high molecular compounds can be used: poly(N-vinylcarbazole) (abbreviated to PVK), poly(4-vinyltriphenylamine) (abbreviated to PVTPA), poly[N-(4-{N'-[4-(4-diphenylamino)phenyl]phenyl-N'-phenylamino}phenyl)methacrylamide] (abbreviated to PTPDMA), poly[N,N'-bis(4-butylphenyl)-N,N'-bis(phenyl)benzidine] (abbreviated to Poly-TPD), and the like.

Further, as examples of the acceptor substance, there are organic compounds such as 7,7,8,8-tetracyano-2,3,5,6-tetrafluoroquinodimethane (abbreviated to $F_4$-TCNQ) and chloranil, and transition metal oxides. In particular, oxides of metals belonging to Group 4 to Group 8 of the periodic table are preferable. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in air and its hygroscopic property is low so that it can be easily handled.

The hole-transport layer 112 is a layer including a substance having a high hole-transport property. As a substance having a high hole-transport property, a low molecular organic compound can be used, and examples thereof include aromatic amine compounds such as NPB (or α-NPD), TPD, 4,4'-bis[N-(9,9-dimethylfluoren-2-yl)-N-phenylamino]biphenyl (abbreviated to DFLDPBi), and 4,4'-bis[N-(spiro-9,9'-bifluoren-2-yl)-N-phenylamino]biphenyl (abbreviated to BSPB). The substances mentioned here are mainly substances having a hole mobility of $10^{-6}$ $cm^2/Vs$ or more. However, any other substance may also be used as long as it is a substance in which the hole-transport property is higher than the electron-transport property. Note that the hole-transport layer is not limited to a single layer but may be a stack of two or more layers including any of the above-mentioned substances.

Further, for the hole-transport layer 112, a high molecular compound such as PVK, PVTPA, PTPDMA, or Poly-TPD can be used.

Furthermore, for the hole-transport layer 112, the above-mentioned composite material in which an acceptor substance is added to a substance having a high hole-transport property may be used.

Alternatively, the hole-transport property may be adjusted by adding an organic compound having a hole-trapping property, a substance having a high electron-transport property, or a hole-blocking material to the hole-transport layer 112. The organic compound having a hole-trapping property preferably has an ionization potential lower than a substance having a high hole-transport property which is included in the hole-transport layer by 0.3 eV or higher. In addition, as the substance having a high electron-transport property, there are the later-given substances that can be used for the electron-transport layer, and the like. Further, the hole-blocking material preferably has an ionization potential of 5.8 eV or higher, or has an ionization potential higher than a substance having a high hole-transport property which is included in the hole-transport layer by 0.5 eV or higher. Note that the organic compound having a hole-trapping property or substance having a high electron-transport property which is added may emit light, the emission color of which is preferably similar to that of light emitted by the light-emitting layer in order to ensure excellent color purity.

The light-emitting layer 113 is a layer including a substance having a high light-emitting property and can be formed using any of a variety of materials. As the substance having a high light-emitting property, a fluorescent compound which emits fluorescence or a phosphorescent compound which emits phosphorescence can be used, for example. A phosphorescent compound is preferable because of its high emission efficiency.

Examples of the phosphorescent compound that can be used for the light-emitting layer are given below. As light-emitting materials for blue light emission, there are bis[2-(4',6'-difluorophenyl)pyridinato-N,$C^{2'}$]iridium(III)tetrakis(1-pyrazolyl)borate (abbreviated to FIr6), bis[2-(4',6'-difluorophenyl)pyridinato-N,$C^{2'}$]iridium(III)picolinate (abbreviated to FIrpic), bis[2-(3',5'-bistrifluoromethylphenyl)pyridinato-N,$C^{2'}$]iridium(III)picolinate (abbreviated to Ir($CF_3$ppy)$_2$(pic)), bis[2-(4',6'-difluorophenyl)pyridinato-N,$C^{2'}$]iridium(III)acetylacetonate (abbreviated to FIracac), and the like. As light-emitting materials for green light emission, there are tris(2-phenylpyridinato-N,$C^{2'}$)iridium(III) (abbreviated to Ir(ppy)$_3$), bis(2-phenylpyridinato-N,$C^{2'}$)iridium(III) acetylacetonate (abbreviated to Ir(ppy)$_2$(acac)), bis(1,2-diphenyl-1H-benzimidazolato)iridium(III)acetylacetonate (abbreviated to Ir(pbi)$_2$(acac)), bis(benzo[h]quinolinato)iridium(III)acetylacetonate (abbreviated to Ir(bzq)$_2$(acac)), and the like. As light-emitting materials for yellow light emission, there are bis(2,4-diphenyl-1,3-oxazolato-N,$C^{2'}$)iridium(III) acetylacetonate (abbreviated to Ir(dpo)$_2$(acac)), bis[2-(4'-(perfluorophenylphenyl)pyridinato]iridium(III)acetylacetonate (abbreviated to Ir(p-PF-ph)$_2$(acac)), bis(2-phenylbenzothiazolato-N,$C^{2'}$)iridium(III)acetylacetonate (abbreviated to Ir(bt)$_2$(acac)), and the like. As light-emitting materials for orange light emission, there are tris(2-phenylquinolinato-N,$C^{2'}$)iridium(III) (abbreviated to Ir(pq)$_3$), bis(2-phenylquinolinato-N,$C^{2'}$)iridium(III)acetylacetonate (abbreviated to Ir(pq)$_2$(acac)), and the like. As light-emitting materials for red light emission, there are organic metal complexes such as bis[2-(2'-benzo[4,5-α]thienyl)pyridinato-N,C$^{3'}$)iridium(III)acetylacetonate (abbreviated to Ir(btp)$_2$(acac)), bis(1-phenylisoquinolinato-N,C$^{2'}$)iridium(III) acetylacetonate (abbreviated to Ir(piq)$_2$(acac), (acetylacetonato)bis[2,3-bis(4-fluorophenyl)quinoxalinato] iridium(III) (abbreviated to Ir(Fdpq)$_2$(acac)), and 2,3,7,8,12,13,17,18-octaethyl-21H,23H-porphine platinum(II) (abbreviated to PtOEP). In addition, rare earth metal complexes such as tris(acetylacetonato)(monophenanthroline)terbium (III) (abbreviated to Tb(acac)$_3$(Phen)), tris(1,3-diphenyl-1,3-propanedionato)(monophenanthroline)europium(III) (abbreviated to Eu(DBM)$_3$(Phen)), and tris[1-(2-thenoyl)-3,3,3-trifluoroacetonato](monophenanthroline)europium(III) (abbreviated to Eu(TTA)$_3$(Phen)) emit light from a rare earth metal ion (electron transition between different multiplicities); therefore, such rare earth metal complexes can be used as a phosphorescent compound.

The following materials are examples of fluorescent compounds that can be used for the light-emitting layer. Examples of materials for blue light emission include N,N'-bis[4-(9H-carbazol-9-yl)phenyl]-N,N'-diphenylstilbene-4,4'-diamine (abbreviated to YGA2S), 4-(9H-carbazol-9-yl)-4'-(10-phenyl-9-anthryl)triphenylamine (abbreviated to YGAPA), and the like. Examples of materials for green light emission include N-(9,10-diphenyl-2-anthryl)-N,9-diphenyl-9H-carbazol-3-amine (abbreviated to 2PCAPA), N-[9,10-bis(1,1'-biphenyl-2-yl)-2-anthryl]-N,9-diphenyl-9H-carbazol-3-amine (abbreviated to 2PCABPhA), N-(9,10-diphenyl-2-anthryl)-N,N',N'-triphenyl-1,4-phenylenediamine (abbreviated to 2DPAPA), N-[9,10-bis(1,1'-biphenyl-2-yl)-2-anthryl]-N,N',N'-triphenyl-1,4-phenylenediamine (abbreviated to 2DPABPhA), N-[9,10-bis(1,1'-biphenyl-2-yl)]-N-[4-(9H-carbazol-9-yl)phenyl]-N-phenylanthracen-2-amine (abbreviated to 2YGABPhA), N,N,9-triphenylanthracen-9-amine (abbreviated to DPhAPhA), and the like. Further, examples of materials for yellow light emission include rubrene, 5,12-bis(1,1'-biphenyl-4-yl)-6,11-diphenyltetracene (abbreviated to BPT), and the like. Furthermore, examples of materials for red light emission include N,N,N',N'-tetrakis(4-methylphenyl)tetracene-5,11-diamine (abbreviated to p-mPhTD), 7,14-diphenyl-N,N,N',N'-tetrakis(4-methylphenyl)acenaphtho[1,2-α]fluoranthene-3,10-diamine (abbreviated to p-mPhAFD), 2-(2-{2-[4-(dimethylamino)phenyl]ethenyl}-6-methyl-4H-pyran-4-ylidene)propanedinitrile (abbreviated to DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviated to DCM2), and the like.

Note that the light-emitting layer may have a structure in which any of the above substances having a high light-emitting property (a guest material) is dispersed into another substance (a host material). As a substance in which the substance with a light-emitting property is dispersed, various kinds of substances can be used, and it is preferable to use a substance whose lowest unoccupied molecular orbital (LUMO) level is higher and highest occupied molecular orbital (HOMO) level is lower than that of the substance with a light-emitting property.

As the substance in which the substance having a light-emitting property is dispersed, specifically, any of the following materials can be used: metal complexes such as tris(8-quinolinolato)aluminum(III) (abbreviated to Alq), tris(4-methyl-8-quinolinolato)aluminum(III) (abbreviated to Almq$_3$), bis(10-hydroxybenzo[h]quinolinato)beryllium(II) (abbreviated to BeBq$_2$), bis(2-methyl-8-quinolinolato)(4-phenylphenolato)aluminum(III) (abbreviated to BAlq), bis(8-quinolinolato)zinc(II) (abbreviated to Znq), bis[2-(2-benzoxazolyl)phenolato]zinc(II) (abbreviated to ZnPBO), and bis[2-(2-benzothiazolyl)phenolato]zinc(II) (abbreviated to ZnBTZ); heterocyclic compounds such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazol-2-yl]benzene (abbreviated to OXD-7), 3-(4-biphenylyl)-4-phenyl-5-(4-tert-butylphenyl)-1,2,4-triazole (abbreviated to TAZ), 2,2',2''-(1,3,5-benzenetriyl)tris(1-phenyl-1H-benzimidazole) (abbreviated to TPBI), bathophenanthroline (abbreviated to BPhen), and bathocuproine (BCP); condensed aromatic compounds such as 9-[4-(10-phenyl-9-anthryl)phenyl]-9H-carbazole (abbreviated to CzPA), 3,6-diphenyl-9-[4-(10-phenyl-9-anthryl)phenyl]-9H-carbazole (abbreviated to DPCzPA), 9,10-bis(3,5-diphenylphenyl)anthracene (abbreviated to DPPA), 9,10-di(2-naphthyl)anthracene (abbreviated to DNA), 2-tert-butyl-9,10-di(2-naphthyl)anthracene (abbreviated to t-BuDNA), 9,9'-bianthryl (abbreviated to BANT), 9,9'-(stilbene-3,3'-diyl)diphenanthrene (abbreviated to DPNS), 9,9'-(stilbene-4,4'-diyl)diphenanthrene (abbreviated to DPNS2), 3,3',3''-(benzene-1,3,5-triyl)tripyrene (abbreviated to TPB3), 9,10-diphenylanthracene (abbreviated to DPAnth), and 6,12-dimethoxy-5,11-diphenylchrysene; aromatic amine compounds such as N,N-diphenyl-9-[4-(10-phenyl-9-anthryl)phenyl]-9H-carbazol-3-amine (abbreviated to CzA1PA), 4-(10-phenyl-9-anthryl)triphenylamine (abbreviated to DPhPA), N,9-diphenyl-N-[4-(10-phenyl-9-anthryl)phenyl]-9H-carbazol-3-amine (abbreviated to PCAPA), N,9-diphenyl-N-{4-[4-(10-phenyl-9-anthryl)phenyl]phenyl}-9H-carbazol-3-amine (abbreviated to PCAPBA), N-(9,10-diphenyl-2-anthryl)-N,9-diphenyl-9H-carbazol-3-amine (abbreviated to 2PCAPA), NPB (or α-NPD), TPD, DFLDPBi, and BSPB; or the like.

As a substance in which the substance with a light-emitting property is dispersed, a plurality of kinds of substances can be used. For example, in order to suppress crystallization, a substance such as rubrene, which suppresses crystallization, may be further added. In order to efficiently transfer energy to the substance having a light-emitting property, NPB, Alq or the like may be further added.

When a structure in which the substance with a high light-emitting property is dispersed in another substance is employed, crystallization of the light-emitting layer 113 can be suppressed. Further, concentration quenching due to high concentration of the substance having a high light-emitting property can be suppressed.

As the light-emitting layer 113, a high molecular compound can also be used. Specifically, examples of materials for blue light emission include poly(9,9-dioctylfluorene-2,7-diyl) (abbreviated to POF), poly[(9,9-dioctylfluorene-2,7-diyl)-co-(2,5-dimethoxybenzene-1,4-diyl)] (abbreviated to PF-DMOP), poly {(9,9-dioctylfluorene-2,7-diyl)-co-[N,N-di-(p-butylphenyl)-1,4-diaminobenzene]} (abbreviated to TAB-PFH), and the like. Further, examples of materials for green light emission include poly(p-phenylenevinylene) (abbreviated to PPV), poly[(9,9-dihexylfluorene-2,7-diyl)-alt-co-(benzo[2,1,3]thiadiazole-4,7-diyl)] (abbreviated to PFBT), poly[(9,9-dioctyl-2,7-divinylenefluorenylene)-alt-co-(2-methoxy-5-(2-ethylhexyloxy)-1,4-phenylene)], and the like. Furthermore, examples of materials for orange to red light emission include poly[2-methoxy-5-(2'-ethylhexoxy)-1,4-phenylenevinylene] (abbreviated to MEH-PPV), poly(3-butylthiophene-2,5-diyl) (abbreviated to R4-PAT), poly{[9,9-dihexyl-2,7-bis(1-cyanovinylene)fluorenylene]-alt-co-[2,5-bis(N,N'-diphenyl amino)-1,4-phenylene]}, poly{[2- methoxy-5-(2-ethylhexyloxy)-1,4-bis(1-cyanovinylenephenylene)]-alt-co-[2,5-bis(N,N'-diphenylamino)-1,4-phenylene]} (abbreviated to CN-PPV-DPD), and the like.

Further, the light-emitting layer is not limited to a single layer but may be a stack of two or more layers including any of the above-mentioned substances The electron-transport layer 114 is a layer including a substance with a high electron-transport property. As examples of low molecular compounds, there are metal complexes such as tris(8-quinolinolato)aluminum(III) (abbreviated to Alq), tris(4-methyl-8-quinolinolato)aluminum(III) (abbreviated to Almq$_3$), bis(10-hydroxybenzo[h]quinolinato)beryllium(II) (abbreviated to BeBq$_2$), bis(2-methyl-8-quinolinolato)(4-phenylphenolato)aluminum(III) (abbreviated to BAlq), bis(8-quinolinolato)zinc(II) (abbreviated to Znq), bis[2-(2-benzoxazolyl)phenolato]zinc(II) (abbreviated to ZnPBO), and bis[2-(2-benzothiazolyl)phenolato]zinc(II) (abbreviated to ZnBTZ). Besides the metal complexes, it is possible to use a heterocyclic compound such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-biphenylyl)-4-phenyl-5-(4-tert-butylphenyl)-1,2,4-triazole (abbreviated to TAZ01), bathophenanthroline (abbreviated to BPhen), bathocuproine (abbreviated to BCP), or the like. The substances described here are mainly substances having electron mobility of $10^{-6}$ cm$^2$/Vs or more. Note that a substance other than the above substances may be used as long as it has a higher electron-transport property than a hole-transport property. Further, the electron-transport layer is not limited to a single layer but may be a stack of two or more layers containing the aforementioned substances.

For the electron-transport layer, a high molecular compound can also be used. For example, poly[(9,9-dihexylfluorene-2,7-diyl)-co-(pyridine-3,5-diyl)] (abbreviated to PF-Py), poly[(9,9-dioctylfluorene-2,7-diyl)-co-(2,2'-bipyridine-6,6'-diyl)] (abbreviated to PF-BPy), and the like can be used.

Further, by addition of an organic compound having an electron-trapping property or a substance having a high hole-transport property to the electron-transport layer 114, the electron-transport property may be controlled. The organic compound having an electron-trapping property is preferably an organic compound having an electron affinity larger than the substance having a high electron-transport property which is included in the electron-transport layer by 0.30 eV or higher. In addition, as the substance having a high hole-transport property, substances that can be used for the hole-transport layer and the like are given. Note that the organic compound having an electron-trapping property or substance having a high hole-transport property which is added may emit light, the color of which is preferably similar to the emission color of the light-emitting layer in order to ensure high color purity.

The electron-injection layer (buffer layer) 115 is a layer including a substance having a high electron-injection property. As the substance having a high electron-injection property, any of the following alkali metals, alkaline earth metals, rare earth metals, or compounds thereof can be used: lithium (Li), cesium (Cs), magnesium (Mg), calcium (Ca), ytterbium (Yb), lithium fluoride (LiF), calcium fluoride (CaF$_2$), cesium fluoride (CsF), magnesium fluoride (MgF$_2$), lithium carbonate (Li$_2$CO$_3$), cesium carbonate (Cs$_2$CO$_3$), lithium oxide (Li$_2$O), erbium fluoride (ErF$_3$), lithium acetylacetonate (abbreviated to Li(acac)), 8-quinolinolato-lithium (abbreviated to Liq), and the like. In particular, it is preferable to use a lithium compound such as lithium fluoride (LiF), lithium oxide (Li$_2$O), lithium carbonate (Li$_2$CO$_3$), lithium acetylacetonate (abbreviated to Li(acac)), or 8-quinolinolato-lithium (abbreviated to Liq) because of their excellent electron-injection properties.

Further, the electron-injection layer (buffer layer) 115 may be formed by adding a donor substance to a layer including a substance having an electron-transport property. As the donor substance, there is an alkali metal, an alkaline earth metal, a rare earth metal, or a compound thereof. For example, a layer of Alq which includes magnesium (Mg), a layer of Alq which includes magnesium (Li), or the like can be used Furthermore, the electron-injection layer (buffer layer) 115 is not limited to a single layer but may be a stack of two or more layers including the aforementioned substances.

The second electrode 104 is an electrode that functions as a cathode and has a light-transmitting property. In order to extract light generated in the light-emitting layer to the outside, the second electrode 104 preferably has a transmissivity of 30% or more with respect to light in the visible light region (wavelength range from 400 nm to 800 nm). Further, when a micro-cavity (micro resonator) structure is applied, the second electrode 104 preferably has a transmissivity of 30 to 80% and a reflectivity of 30 to 60%.

As the second electrode 104, any of a variety of metals, alloys, and electrically conductive compounds, and a mixture thereof can be used. Specifically, it is possible to use a film of a light-transmitting conductive metal oxide such as indium oxide-tin oxide (ITO: indium tin oxide), indium oxide-tin oxide which contains silicon or silicon oxide, indium oxide-zinc oxide (IZO: indium zinc oxide), or indium oxide containing tungsten oxide and zinc oxide (IWZO). Preferably, this conductive metal oxide film has excellent transmissivity of visible light and a thickness of about 70 to 100 nm in consideration of conductivity. Such conductive metal oxide films are generally formed by sputtering; however, the films may be formed by applying a sol-gel method. For example, a film of indium oxide-zinc oxide (IZO) can be formed by a sputtering method using indium oxide, to which zinc oxide is added at 1 to 20 wt %, as a target. A film of indium oxide containing tungsten oxide and zinc oxide (IWZO) can be formed by a sputtering method using a target in which tungsten oxide and zinc oxide are mixed at 0.5 to 5 wt % and 0.1 to 1 wt %, respectively, with indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), and the like are given. By forming a thin film using such a metal film, this film can be an electrode having a sufficient light-transmitting property. In consideration of transmissivity and reflectivity, the thickness of the film is preferably 5 to 20 nm.

In addition, the second electrode 104 is preferably formed using a metal or an alloy which has a low work function (specifically, 3.8 eV or lower), or the like. For example, aluminum (Al), silver (Ag), an alloy containing aluminum (e.g., AlSi), or the like can be used. Moreover, any of the following materials can be used: elements that belong to Group 1 or Group 2 of the periodic table, that is, alkali metals such as lithium (Li) and cesium (Cs) or alkaline-earth metals such as magnesium (Mg), calcium (Ca), or strontium (Sr), or alloys thereof (e.g., magnesium-silver alloy (Mg—Ag) and aluminum-lithium alloy (Al—Li)); rare earth metals such as europium (Eu) or ytterbium (Yb), or alloys thereof; or the like. By forming a thin film is formed using such an alkali metal, an alkaline earth metal, or an alloy thereof, this film can be an electrode having a sufficient light-transmitting property. In consideration of transmissivity and reflectivity, the thickness of the film is preferably 5 to 20 nm. In addition, since an alkali metal, an alkaline earth metal, or an alloy thereof has high conductivity, a film formed using such a material sufficiently functions as an electrode as long as it has a thickness of 5 to 20 nm. A film of an alkali metal, an alkaline earth metal, or an alloy thereof can be formed by a vacuum evaporation method. Alternatively, a film of an alloy including an alkali metal or an alkaline earth metal can be formed by a sputtering method. Further, a silver paste or the like can be applied by an inkjet method to form the second electrode 104.

Among films of the above-mentioned materials, a silver (Ag) film is preferable because it enables more efficient extraction of emitted light. Yet, because an Ag film has difficulty in injecting electrons to the EL layer, the buffer layer preferably has a structure where a donor substance is added to a layer including a substance having an electron-transport property. At the same time, in terms of mass productivity, it is preferable that the buffer layer have a structure where no donor substance such as lithium fluoride is added, not the structure in which a donor substance is added. Even in the structure where a donor substance (e.g., a lithium compound such as lithium fluoride) is not added, magnesium-silver alloy (Mg—Ag), which is an alloy including silver, can smoothly inject electrons to the EL layer as the buffer layer and has good conductivity. When the magnesium-silver alloy (Mg—Ag) that includes magnesium in large amounts is used, the amount of light absorbed by Mg is increased, so that extraction of emitted light is less efficient. Therefore, the volume ratio of silver to magnesium in a magnesium-silver alloy film is preferably 8:2 (=Ag:Mg) or higher. The structure in which a magnesium-silver alloy film is formed over the buffer layer provides high productivity and is preferable, where good properties can be achieved without addition of a donor substance to the buffer layer.

Further, the second electrode 104 is not limited to a single layer but may be a stack of two or more layers. For example, the second electrode 104 may have a structure in which, over the thin film of the above-described alkali metal, alkaline earth metal, or alloy thereof, a film of a light-transmitting conductive metal oxide such as indium oxide-tin oxide (ITO: indium tin oxide), indium oxide-tin oxide which contains silicon or silicon oxide, indium oxide-zinc oxide (IZO: indium zinc oxide), or indium oxide containing tungsten oxide and zinc oxide (IWZO) is stacked.

Over the above-described second electrode 104, a film having a light-transmitting property may further be formed. For example, any of the following materials can be used: oxides such as molybdenum oxide, tin oxide, zinc oxide, magnesium oxide, silicon oxide, aluminum oxide, titanium oxide, and zirconium oxide; nitrides such as silicon nitride, aluminum nitride, titanium nitride, and zirconium nitride; carbides such as silicon carbide and aluminum carbide; organic compounds such as Alq and NPB; or the like. Films of these materials can be formed by a sputtering method, a vacuum evaporation method, or the like.

Any of a variety of methods can be used for forming the EL layer regardless of whether it is a dry process or a wet process. For example, a vacuum evaporation method, an inkjet method, a spin coating method, or the like may be used. As described above, the EL layer includes the layer including a composite material, the hole-transport layer, the light-emitting layer, the electron-transport layer, the electron-injection layer (buffer layer), and the like. In forming the layers, film formation methods which are suitable for the respective layers are preferably used, but one common film formation method can be used. Note that a similar way can be applied to formation of the electrodes, as described above.

For example, the EL layer may be formed using a high molecular compound selected from the above-described materials by a wet process. Alternatively, a low molecular organic compound can be used by a wet process to form the EL layer. Furthermore, the EL layer may be formed using a low molecular organic compound by a dry process such as a vacuum evaporation method.

Further, the electrodes may be formed using a sol-gel method by a wet process, or may also be formed using metal paste by a wet process. Furthermore, the electrode may be formed by a dry process such as a sputtering method or a vacuum evaporation method.

For example, to fabricate a display device by applying the light-emitting element described in this embodiment and using a large substrate, the light-emitting layer is preferably formed by a wet process. Employing an inkjet method makes it easier to separately form a light-emitting layer for each color even with the use of a large substrate.

In the light-emitting element having the structure as described above, by application of a voltage, a current flows between the first electrode 102 and the second electrode 104, and holes and electrons recombine in the EL layer 103, whereby light is emitted.

In the light-emitting element described in this embodiment, light emission is extracted to the outside through the second electrode 104. That is, emitted light is extracted from the side opposite the substrate 101.

Note that the structure of the layers provided between the first electrode 102 and the second electrode 104 is not limited to the aforementioned one. In other words, there is no particular limitation on a structure of the layers, and the light-emitting layer and the layer including a composite material are combined with the layers including a substance having a high electron-transport property, a substance having a high hole-transport property, a substance having a high electron-injection property, a substance having a high hole-injection property, a bipolar substance (a substance having a high electron-transport property and a high hole-transport property), and/or the like.

Note that in this embodiment, the light-emitting element is formed over a substrate formed using glass, plastic, or the like. By forming a plurality of such light-emitting elements over one substrate, a passive matrix light-emitting device can be manufactured. In addition, a thin film transistor (TFT) may be formed over a substrate formed using glass, plastic, or the like and a light-emitting element may be manufactured over an electrode that is electrically connected to the TFT. Thus, an active matrix light-emitting device in which driving of the light-emitting elements is controlled by the TFTs can be manufactured. There is no particular limitation on the structure of such TFTs. A staggered TFT or an inverted staggered TFT may be employed. Further, a driver circuit formed over a TFT substrate may be formed using both of an n-type TFT and a p-type TFT or only either an n-type TFT or a p-type TFT. Furthermore, there is no particular limitation on the crystallinity of a semiconductor film used for the TFT. Either an amorphous semiconductor film or a crystalline semiconductor film may be used for the TFT. Alternatively, a single-crystal semiconductor film may be used. A single-crystal semiconductor film can be manufactured using a Smart Cut (registered trademark) method or the like.

The first electrode described in this embodiment has a high reflectivity even without including a relatively expensive material such as chromium, molybdenum, tungsten, or niobium. An aluminum alloy, titanium, or the like which is an abundant material in the Earth's crust and is relatively inexpensive is used for the first electrode, whereby the cost of manufacturing a light-emitting element can be reduced.

Further, by including a material that is used in a process of manufacturing a general element substrate having a transistor and the like, the first electrode described in this embodiment is highly suitable for use in a process of manufacturing an element substrate. Accordingly, the manufacturing cost of a light-emitting element can be reduced. In particular, the light-emitting element of one embodiment of the present invention can be effectively and preferably applied to an active matrix type light-emitting device.

Further, the light-emitting element described in this embodiment has high emission efficiency, since it has a top emission structure in which light is extracted from the side opposite the substrate and includes the first electrode of high reflectivity. Furthermore, light propagated through the substrate or the like can be suppressed to enable efficient extraction of emitted light. In addition, a structure or a material for further improving the extraction efficiency can be provided over the second electrode. Accordingly, a light-emitting element having high emission efficiency can be obtained.

Further, the light-emitting element described in this embodiment can be more effectively applied to an active matrix type light-emitting device, where a reduction in aperture ratio, which is caused by a transistor, a wiring, or the like Banned over the substrate, can be prevented to achieve high aperture ratio.

Furthermore, in a light-emitting element described in this embodiment, hole injection from the first electrode to the EL layer is facilitated to reduce drive voltage. Therefore, a light-emitting element having reduced power consumption can be obtained.

Embodiment 2

In this embodiment, description is provided for a mode of a light-emitting element with a structure in which plural light-emitting units of one embodiment of the present invention are stacked (hereinafter referred to as a stacked type light-emitting element) with reference to FIG. 2. This light-emitting element is a stacked type light-emitting element having a plurality of light-emitting units between a first electrode and a second electrode. Each light-emitting unit can have a structure similar to the structure described in Embodiment 1. In other words, the light-emitting element shown in Embodiment 1 is a light-emitting element having one light-emitting unit.

Figure 2:
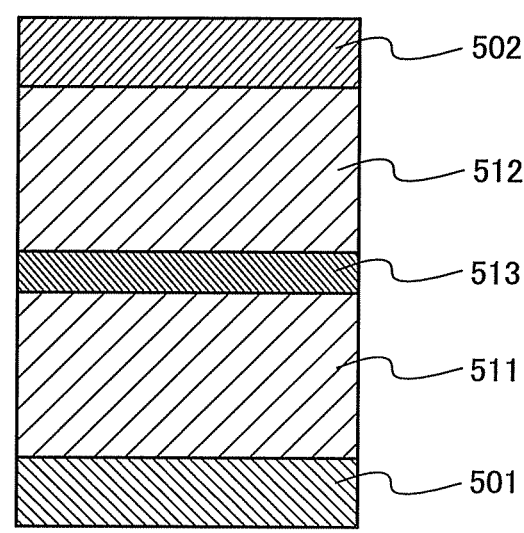
FIG. 2 illustrates a light-emitting element of one embodiment of the present invention.

In FIG. 2, a first light-emitting unit 511 and a second light-emitting unit 512 are stacked between a first electrode 501 and a second electrode 502, and a charge generation layer 513 is provided between the first light-emitting unit 511 and the second light-emitting unit 512. The structures described in Embodiment 1 can be applied to the first electrode 501 and the second electrode 502. The first light-emitting unit 511 and the second light-emitting unit 512 may have the same structure or different structure, which may be similar to those described in Embodiment 1.

The charge-generating layer 513 is a layer that injects electrons into a light-emitting unit on one side and injects holes into a light-emitting unit on the other side when a voltage is applied to the first electrode 501 and the second electrode 502, and may be either a single layer or a stack structure of two or more layers. As a stack structure of plural layers, a structure in which a layer that injects holes and a layer that injects electrons are stacked is preferable.

As the layer that injects holes, a semiconductor or an insulator, such as molybdenum oxide, vanadium oxide, rhenium oxide, or ruthenium oxide, can be used. A structure in which an acceptor substance is added to a substance having a high hole-transport property may alternatively be used. The layer including a substance having a high hole-transport property and an acceptor substance is formed using the composite material described in Embodiment 1 and includes, as the acceptor substance, 7,7,8,8-tetracyano-2,3,5,6-tetrafluoro-quinodimethane (abbreviated to $F_4$-TCNQ) or a metal oxide such as vanadium oxide, molybdenum oxide, or tungsten oxide. As the substance having a high hole-transport property, a variety of compounds such as an aromatic amine compound, a carbazole derivative, an aromatic hydrocarbon, or a high molecular compound (such as an oligomer, a dendrimer, or a polymer) can be used. Note that a substance having a hole mobility of $10^{-6}$ cm$^2$/Vs or higher is preferably employed as the substance having a high hole-transport property. However, other materials may also be used as long as the hole-transport property is higher than the electron-transport property. Since the composite material of the substance having a high hole-transport property and the acceptor substance has excellent carrier injection and transport properties, which leads to driving at low voltage and low current.

As the layer which injects electrons, a semiconductor or an insulator, such as molybdenum oxide, vanadium oxide, rhenium oxide, or ruthenium oxide, can be used. A structure in which a donor substance is added to a substance having a high electron-transport property may alternatively be used. As the donor substance, an alkali metal, an alkaline earth metal, a rare earth metal, a metal that belongs to Group 13 of the periodic table, or an oxide or carbonate of them may be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transporting property, the materials described in Embodiment 1 can be used. Note that a substance having a hole mobility of $10^{-6}$ cm$^2$/Vs or more is preferably employed as the substance having a high electron-transport property. However, any other substance may also be used as long as it is a substance in which the electron-transport property is higher than the hole-transport property. The composite material which includes the substance having a high electron-transport property and the donor substance has an excellent carrier injection and transport property, so that low-voltage driving and low-current driving can be realized.

Further, the electrode materials described in Embodiment 1 can be used for the charge-generating layer 513. For example, the charge-generating layer 513 may be formed by combining a layer including a substance having a high hole-transport property and a metal oxide with a transparent conductive film. Note that a layer having a high light-transmitting property is preferably used as the charge-generating layer in terms of light extraction efficiency.

In any case, the charge generation layer 513 sandwiched between the first light-emitting unit 511 and the second light-emitting unit 512 is acceptable as long as electrons are injected into one light-emitting unit and holes are injected into the other light-emitting unit when a voltage is applied between the first electrode 501 and the second electrode 502. For example, any layer can be employed as the charge generation layer 513 as long as the layer injects electrons into the first light-emitting unit 511 and holes into the second light-emitting unit 512 when a voltage is applied so that the potential of the first electrode is higher than that of the second electrode.

In this embodiment, a light-emitting element having two light-emitting units is explained; however, the present embodiment can be similarly applied to a light-emitting element in which three or more light-emitting units are stacked. When the charge generation layer is provided between the pair of electrodes so as to partition the plural light-emitting units like the light-emitting element of this embodiment, light emission in a high luminous region can be obtained while low current density is kept, and accordingly a long lifetime element can be realized. Moreover, a light-emitting device with low power consumption, which can be driven at low voltage, can be obtained.

By enabling the light-emitting units to emit light of different colors, light emission of a desired color can be obtained from the whole light-emitting element. For example, in the case of a light-emitting element having two light-emitting units, if the emission colors of the first light-emitting unit and the second light-emitting unit are made complementary to each other, white light can be obtained from the whole of the light-emitting element. Note that complementary colors mean colors having the relationship in which they become an achromatic color by being mixed. That is, white light emission can be obtained by mixing light from substances whose emission colors are complementary colors. This technique can be similarly applied to a light-emitting element having three light-emitting units. For example, white light emission can be obtained from a light-emitting element when emission colors of the first, second, and third light-emitting units are red, green, and blue, respectively.

Note that this embodiment can be appropriately combined with other embodiments.

Embodiment 3

In this embodiment, a light-emitting device including a light-emitting element of one embodiment of the present invention is described.

Figure 3A:
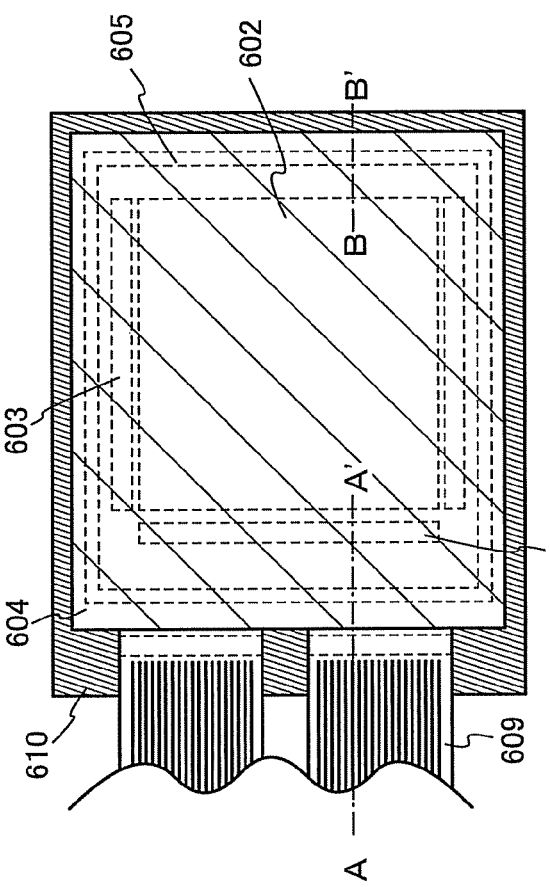
FIGS. 3A and 3B illustrate a light-emitting device of one embodiment of the present invention.
Figure 3B:
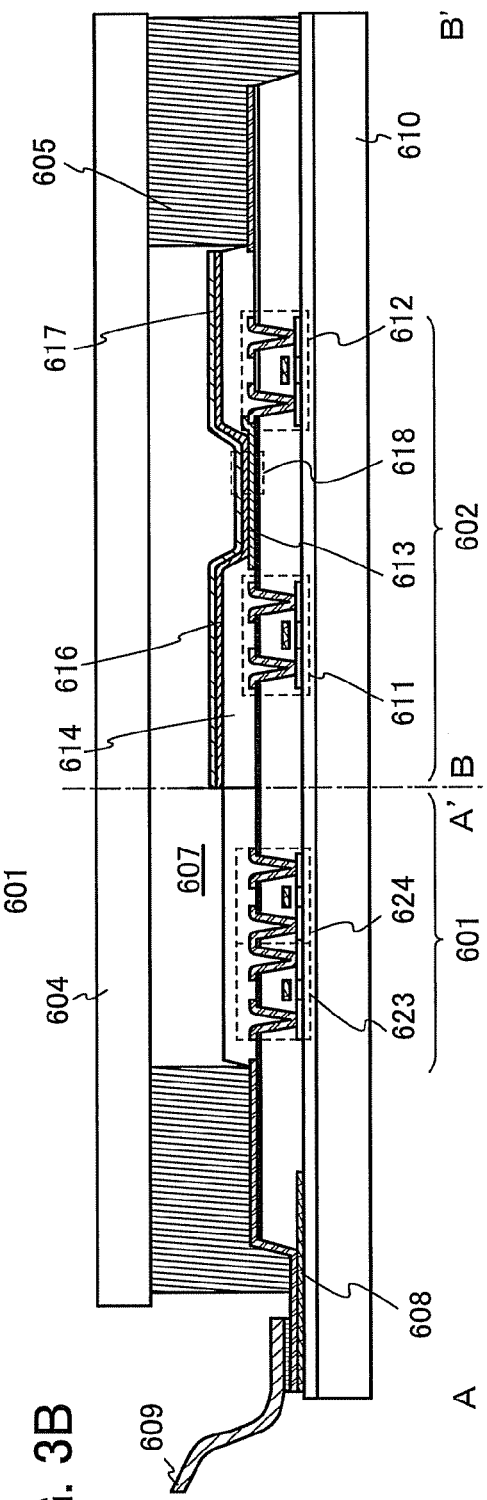

In this embodiment, a light-emitting device including a light-emitting element described in Embodiments 1 and 2 in a pixel portion will be described with reference to FIGS. 3A and 3B. FIG. 3A is a top view of the light-emitting device, and FIG. 3B is a cross sectional view taken along lines A-A' and B-B' of FIG. 3A. This light-emitting device includes a driver circuit portion (source side driver circuit) 601, a pixel portion 602, and a driver circuit portion (gate side driver circuit) 603 which are configured to control the light emission of the light-emitting element. A reference numeral 604 represents a sealing substrate, a reference numeral 605 represents a sealant, and the inside surrounded by the sealant 605 is a space 607.

A lead wiring 608 is a wiring for transmitting signals that are to be inputted to the source side driver circuit 601 and the gate side driver circuit 603 and receives a video signal, a clock signal, a start signal, a reset signal, and the like from a flexible printed circuit (FPC) 609 which is an external input terminal. Although only the FPC is shown here, the FPC may be provided with a printed wiring board (PWB). The light-emitting device described in the specification includes not only a light-emitting device itself but also a state in which an FPC or a PWB is attached thereto.

Next, a sectional structure will be described using FIG. 3B. Although the driver circuit portion and the pixel portion are formed over an element substrate 610, the source side driver circuit 601, which is one of the driver circuit portions, and one pixel in the pixel portion 602 are illustrated here.

Note that as the source side driving circuit 601, a CMOS circuit in which an n-channel TFT 623 and a p-channel TFT 624 are combined is formed. The driver circuit may be formed of various CMOS circuits, PMOS circuits, or NMOS circuits. In this embodiment, a driver-integrated type in which a driver circuit is formed over the substrate provided with the pixel portion is described; however, the present invention is not limited to this type, and the driver circuit can be formed outside the substrate.

The pixel portion 602 has a plurality of pixels, each of which includes a switching TFT 611, a current control TFT 612, and a first electrode 613 which is electrically connected to a drain of the current control TFT 612. An insulator 614 is formed to cover the edge of the first electrode 613. Here, the insulator 614 is formed using a positive photosensitive acrylic resin.

In order to favorably cover the edge of the first electrode 613, the insulator 614 is provided such that either an upper edge portion or a lower edge portion thereof has a curved surface with a curvature. For example, in the case of using a positive photosensitive acrylic as a material of the insulator 614, it is preferred that only the upper end portion of the insulator 614 has a curved surface with curvature (the radius of the curvature being 0.2 to 3 μm). Note that the insulator 614 can be formed using either a negative photoresist that becomes insoluble in an etchant after photo-irradiation or a positive photoresist that becomes insoluble in an etchant after photo-irradiation.

An EL layer 616 and a second electrode 617 are formed over the first electrode 613. Here, the structure described in Embodiment 1 can be applied to the first electrode 613 and the second electrode 617.

The EL layer 616 is formed by various methods such as an evaporation method using an evaporation mask, an inkjet method, a spin coating method, or the like. The structures described in Embodiments 1 and 2 can be applied to the EL layer 616. As a material included in the EL layer 616, any of low molecular compounds or high molecular compounds (including oligomers, dendrimers, or polymers) may be used. Further, not only organic compounds but also inorganic compounds can be used for the material for forming the EL layer.

The sealing substrate 604 is attached to the element substrate 610 with the sealant 605, whereby a light-emitting element 618 is provided in the space 607 surrounded by the element substrate 610, the sealing substrate 604, and the sealant 605. Note that the space 607 is filled with a filler and may be filled with the sealant 605 in addition to an inert gas (nitrogen, argon, and the like).

As a material for the sealant 605, an epoxy resin is preferably used. It is desirable to use a material that allows permeation of moisture or oxygen as little as possible. As the sealing substrate 604, a plastic substrate formed of FRP (fiberglass-reinforced plastics), PVF (poly(vinyl fluoride)), a polyester, an acrylic, or the like can be used besides a glass substrate or a quartz substrate.

As described above, the light-emitting device including the light-emitting element of one embodiment of the present invention can be obtained.

The light-emitting device described in this embodiment includes the light-emitting element described in Embodiments 1 and 2. In the light-emitting element described in Embodiments 1 and 2, the first electrode of high reflectivity is formed using an aluminum alloy, titanium, or the like which is relatively inexpensive. These materials are generally used in a process of manufacturing an element substrate having a transistor and the like, as described in this embodiment, and highly suitable for use in a process of manufacturing an element substrate. Accordingly, the manufacturing cost of a light-emitting element can be reduced. In particular, the light-emitting element as described in this embodiment can be effectively and preferably applied to an active matrix type light-emitting device Further, the light-emitting element described in Embodiments 1 and 2 has high emission efficiency, since it has a top emission structure in which light is extracted from the side opposite the substrate and includes the first electrode of high reflectivity. Furthermore, the light-emitting element is capable of efficient extraction of emitted light. In addition, a structure or a material for further improving the extraction efficiency can be provided over the second electrode. Accordingly, a light-emitting device that has high emission efficiency and is capable of emitting light with high luminance can be obtained.

As described in this embodiment, by applying one embodiment of the present invention to an active matrix type light-emitting device, a reduction in aperture ratio, which is caused by a transistor, a wiring, or the like formed over the substrate, can be prevented to achieve high aperture ratio.

Further, the light-emitting device described in this embodiment includes a light-emitting element having low drive voltage to reduce power consumption.

Figure 4A:
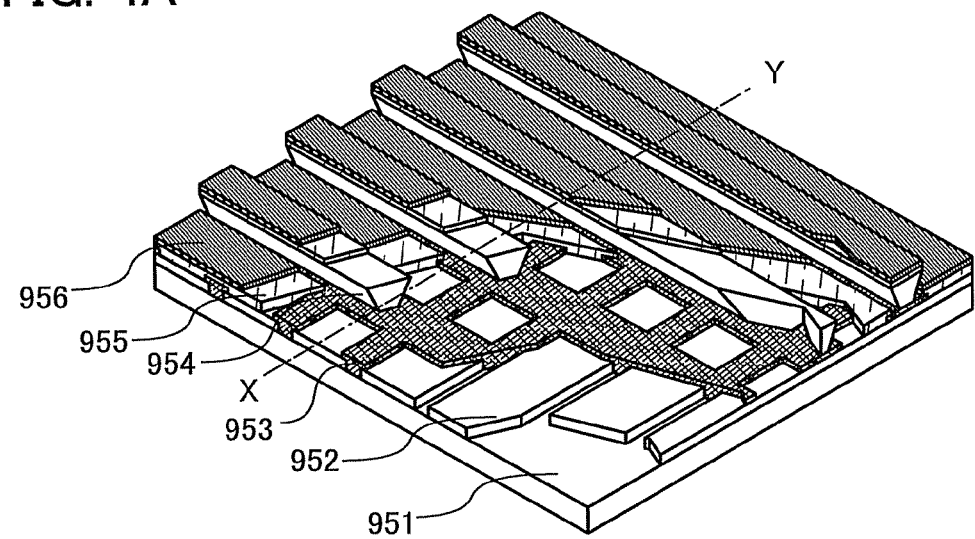
FIGS. 4A and 4B illustrate a light-emitting device of one embodiment of the present invention.
Figure 4B:
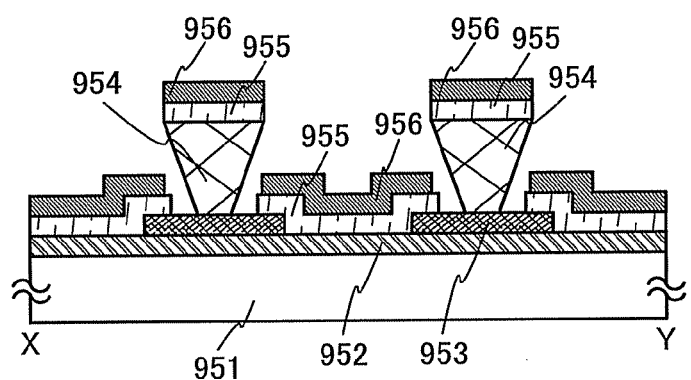

As described above, in this embodiment, an active matrix type light-emitting device in which operation of a light-emitting element is controlled by a transistor is described. Alternatively, a passive matrix type light-emitting device may also be used. FIGS. 4A and 4B illustrate a passive matrix type light-emitting device manufactured by applying one embodiment of the present invention. FIG. 4A is a perspective view of the light-emitting device, and FIG. 4B is a cross-sectional view taken along line X-Y in FIG. 4A. As shown in FIGS. 4A and 4B, an electrode 952 and an electrode 956 are provided over a substrate 951, and a layer (EL layer) 955 including an organic compound is provided between the electrode 952 and the electrode 956. The edge of the electrode 952 is covered with an insulating layer 953. A partition wall layer 954 is provided on the insulating layer 953. The sidewalls of the partition wall layer 954 are aslope so that a distance between both sidewalls is gradually narrowed toward the surface of the substrate 951. In other words, a cross section in the direction of a narrow side of the partition wall layer 954 has a trapezoidal shape, and a lower side (which faces a surface of the insulating layer 953 and is in contact with the insulating layer 953) is shorter than an upper side (which faces the surface of the insulating layer 953 and is not in contact with the insulating layer 953). The EL layer 955 and the electrode 956 can be patterned by providing the partition layer 954 in this manner. In addition, in a passive-matrix light-emitting device, a light-emitting device with low power consumption can be obtained by including a light-emitting element with low drive voltage according to one embodiment of the present invention. In addition, a light-emitting device that can emit light with high luminance can be obtained. Further, a light-emitting device that can be manufactured at low cost can be obtained.

This embodiment can be combined with any other embodiment as appropriate.

Embodiment 4

In this embodiment, an electronic device of one embodiment of the present invention which includes the light-emitting device described in Embodiment 3 in part thereof will be described. The electronic device of one embodiment of the present invention includes a display portion having the light-emitting element described in Embodiments 1 and 2 which has low power consumption. In addition, the electronic device includes a display portion that is capable of emitting light with high luminance. Further, this electronic device includes an inexpensive display portion.

Examples of electronic devices each manufactured using the light-emitting device of one embodiment of the present invention include cameras such as video cameras and digital cameras, goggle type displays, navigation systems, audio playback devices (e.g., car audio systems and other audio systems), computers, game machines, portable information terminals (e.g., mobile computers, mobile phones, portable game machines, and electronic books), image playback devices provided with recording media (i.e., devices that are capable of playing back recording media such as digital versatile discs (DVDs) and equipped with display devices that can display the image), and the like. Specific examples for such electronic devices are illustrated in FIGS. 5A to 5D.

Figure 5A:
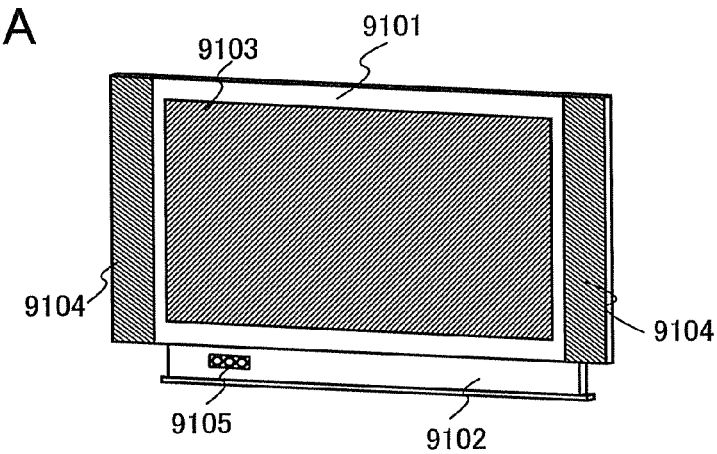
FIGS. 5A to 5D each illustrate an electronic device of one embodiment of the present invention.

FIG. 5A illustrates a television set according to this embodiment which includes a housing 9101, a supporting base 9102, a display portion 9103, speaker portions 9104, a video input terminal 9105, and the like. In the display portion 9103 of this television set, light-emitting elements similar to those described in Embodiments 1 and 2 are arranged in matrix. The features of the light-emitting element are exemplified by low drive voltage, low power consumption, and also high emission efficiency. The display portion 9103 which includes the light-emitting elements has similar features. Therefore, in the television device, low power consumption is attained. With such features, a power supply circuit can be significantly reduced or downsized in the television set; therefore, the housing 9101 and the supporting base 9102 can be lightened and downsized. Since the television set in accordance with this embodiment can realize low power consumption and a reduction in size and weight, products suitable for any residential environment can be provided.

Figure 5B:
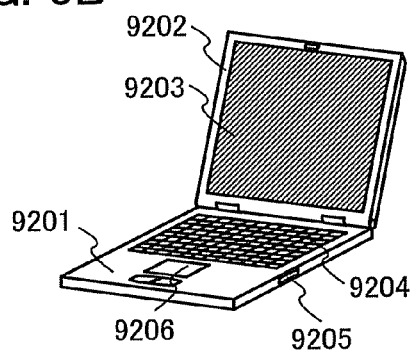

FIG. 5B illustrates a computer according to this embodiment which includes a main body 9201, a housing 9202, a display portion 9203, a keyboard 9204, an external connection port 9205, a pointing device 9206, and the like. In the display portion 9203 of this computer, light-emitting elements similar to those described in Embodiments 1 and 2 are arranged in matrix. The features of the light-emitting element are exemplified by low drive voltage, low power consumption, and also high emission efficiency. The display portion 9203 which includes the light-emitting elements has similar features. Therefore, in the computer, low power consumption is attained. With such features, a power supply circuit can be significantly reduced or downsized in the computer; therefore, the main body 9201 and the housing 9202 can be lightened and downsized. Since the computer in accordance with this embodiment can realize low power consumption and a reduction in size and weight, products suitable for any residential environment can be provided.

Figure 5C:
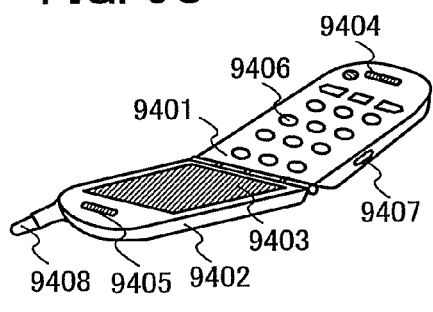

FIG. 5C illustrates a mobile phone according to this embodiment which includes a main body 9401, a housing 9402, a display portion 9403, an audio input portion 9404, an audio output portion 9405, an operation key 9406, an external connecting port 9407, an antenna 9408, and the like. In the display portion 9403 of this mobile phone, light-emitting elements similar to those described in Embodiments 1 and 2 are arranged in matrix. The features of the light-emitting element are exemplified by low drive voltage, low power consumption, and also high emission efficiency. The display portion 9403 which includes the light-emitting elements has similar features. Therefore, in the mobile phone, low power consumption is attained. With such features, a power supply circuit can be significantly reduced or downsized in the mobile phone; therefore, the main body 9401 and the housing 9402 can be lightened and downsized. Since the mobile phone in accordance with this embodiment can realize low power consumption and a reduction in size and weight, products suitable for any residential environment can be provided.

Figure 5D:
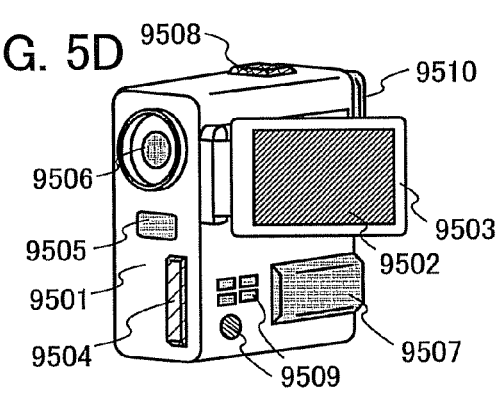

FIG. 5D illustrates a camera according to this embodiment which includes a main body 9501, a display portion 9502, a housing 9503, an external connecting port 9504, a remote controller receiving portion 9505, an image receiving portion 9506, a battery 9507, an audio input portion 9508, operation keys 9509, an eye piece portion 9510, and the like. In the display portion 9502 of this camera, light-emitting elements similar to those described in Embodiments 1 and 2 are arranged in matrix. The features of the light-emitting element are exemplified by low drive voltage, low power consumption, and also high emission efficiency. The display portion 9502 which includes the light-emitting elements has similar features. Therefore, in the camera, low power consumption is attained. With such features, a power supply circuit can be significantly reduced or downsized in the camera; therefore, the main body 9501 can be lightened and downsized. Since the camera in accordance with this embodiment can realize low power consumption and a reduction in size and weight, products suitable for any residential environment can be provided.

Figure 11A:
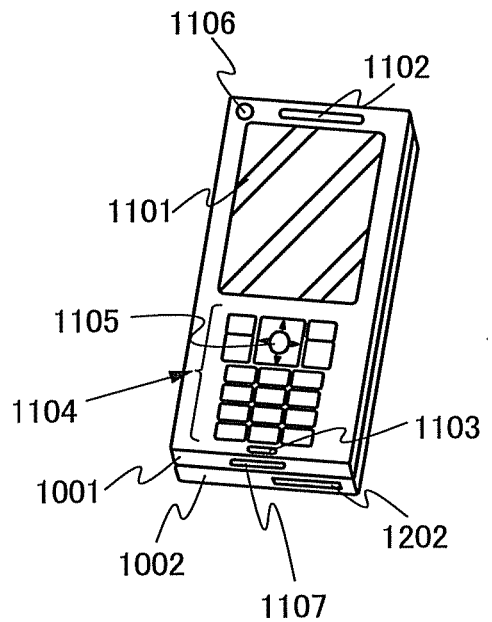
FIGS. 11A to 11C illustrate an electronic device of one embodiment of the present invention.
Figure 11B:
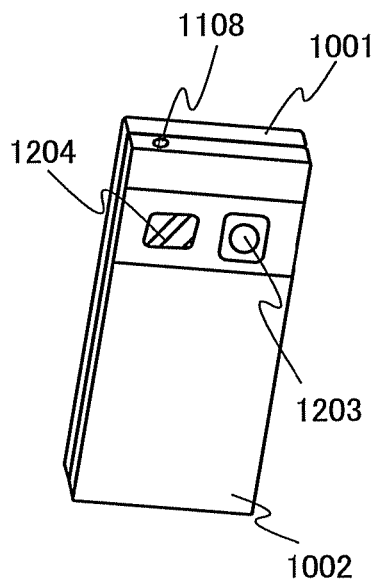
Figure 11C:
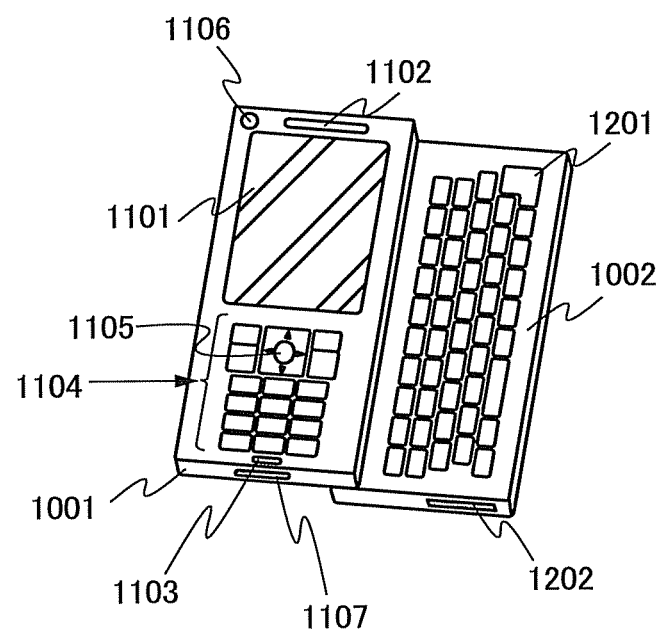

FIGS. 11A to 11C illustrate an example of a structure of a cellular phone, which is different from a structure of the cellular phone of FIG. 5C. FIG. 11A is a front view, FIG. 11B is a rear view, and FIG. 11C is a development view. The cellular phone in FIGS. 11A to 11C is a so-called smartphone, which has both functions of a phone and a portable information terminal and incorporates a computer to conduct a variety of data processing in addition to voice calls.

The cellular phone illustrated in FIGS. 11A to 11C has two housings 1001 and 1002. The housing 1001 includes a display portion 1101, a speaker 1102, a microphone 1103, operation keys 1104, a pointing device 1105, a camera lens 1106, an external connection terminal 1107, an earphone terminal 1108, and the like, while the housing 1002 includes a keyboard 1201, an external memory slot 1202, a camera lens 1203, a light 1204, and the like. In addition, an antenna is incorporated in the housing 1001.

Further, in addition to the above structure, the cellular phone may incorporate a non-contact IC chip, a small-sized memory device, or the like.

In the display portion 1101, the light-emitting device described in Embodiment 3 can be incorporated, and a display direction can be appropriately changed depending on the usage mode. The cellular phone is provided with the camera lens 1106 on the same surface as the display portion 1101; therefore, the cellular phone can be used as a videophone. Further, a still image and a moving image can be taken with the camera lens 1203 and the light 1204 using the display portion 1101 as a viewfinder. The speaker 1102 and the microphone 1103 can be used for video calls, recording, reproducing, and the like without being limited to voice calls. With the use of the operation keys 1104, making and receiving calls, inputting simple information such as e-mail or the like, scrolling the screen, moving the cursor, and the like are possible. Furthermore, the housing 1001 and the housing 1002 (FIG. 11A), which are overlapped with each other, are developed by sliding as illustrated in FIG. 11C, and can be used as a portable information terminal. In this case, smooth operation can be conducted using the keyboard 1201 and the pointing device 1105. The external connection terminal 1107 can be connected to an AC adaptor and various types of cables such as a USB cable, and charging, data communication with a computer, and the like are possible. Furthermore, a large amount of data can be stored and transferred by inserting a recording medium into the external memory slot 1202.

Further, in addition to the above functions, the cellular phone may include an infrared communication function, a television receiving function, or the like.

Figure 6:
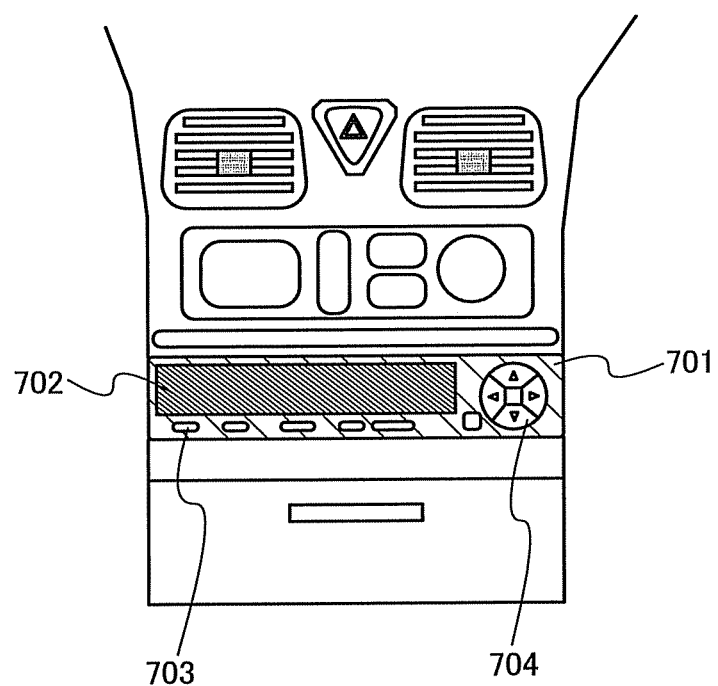
FIG. 6 illustrates an electronic device of one embodiment of the present invention.

FIG. 6 illustrates an audio reproducing device, specifically, a car audio system, which includes a main body 701, a display portion 702, and operation switches 703 and 704. The display portion 702 can be realized with the light-emitting device (of a passive matrix type or an active matrix type) described in Embodiment 3. Further, the display portion 702 may be formed using a segment type light-emitting device. In any case, the use of a light-emitting element according to an embodiment of the present invention makes it possible to form a bright display portion while achieving less power consumption, with the use of a vehicle power source (12 to 42 V). Further, although an in-car audio system is described in this embodiment, a light-emitting device according to an embodiment of the present invention may also be used in portable audio systems or audio systems for home use.

Figure 7:
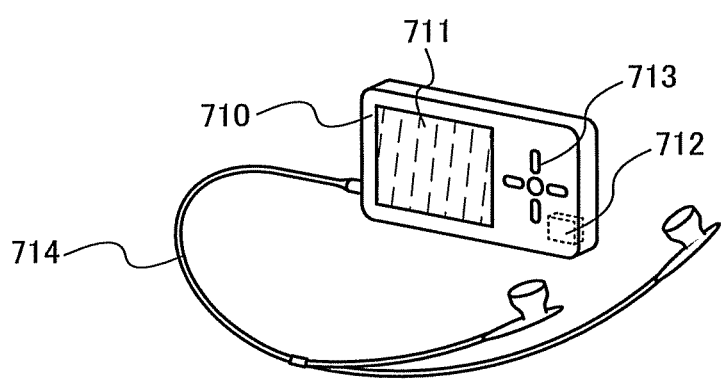
FIG. 7 illustrates an electronic device of one embodiment of the present invention.

FIG. 7 illustrates a digital player as an example of an audio reproducing device. The digital player illustrated in FIG. 7 includes a main body 710, a display portion 711, a memory portion 712, an operation portion 713, earphones 714, and the like. Note that headphones or wireless earphones can be used instead of the earphones 714. The display portion 711 can be realized with the light-emitting device (of a passive matrix type or an active matrix type) described in Embodiment 3. Further, the display portion 711 may be formed using a segment type light-emitting device. In any case, the use of the light-emitting element according to an embodiment of the present invention makes it possible to form a bright display portion which can display images even when using a secondary battery (a nickel-hydrogen battery or the like) while achieving less power consumption. As the memory portion 712, a hard disk or a nonvolatile memory is used. For example, by using a NAND-type nonvolatile memory with a recording capacity of 20 to 200 gigabytes (GB), and operating the operation portion 713, an image or a sound (music) can be recorded and reproduced. Note that in the display portion 702 and the display portion 711, white characters are displayed against a black background, and thus, power consumption can be reduced. This is particularly effective for portable audio systems.

As described above, a light-emitting device manufactured by applying one embodiment of the present invention has very wide applicability, and thus can be applied to electronic devices in all kinds of fields. Application of one embodiment of the present invention enables the manufacture of an electronic device that includes a display portion exhibiting low power consumption. In addition, it becomes possible to provide an electronic device having a display portion that is capable of emitting light with high luminance. An electronic device having an inexpensive display portion can also be provided.

In addition, the light-emitting device to which one embodiment of the present invention is applied can also be used as a lighting device. One mode using the light-emitting element to which one embodiment of the present invention is applied as a lighting device will be explained with reference to FIG. 8.

Figure 8:
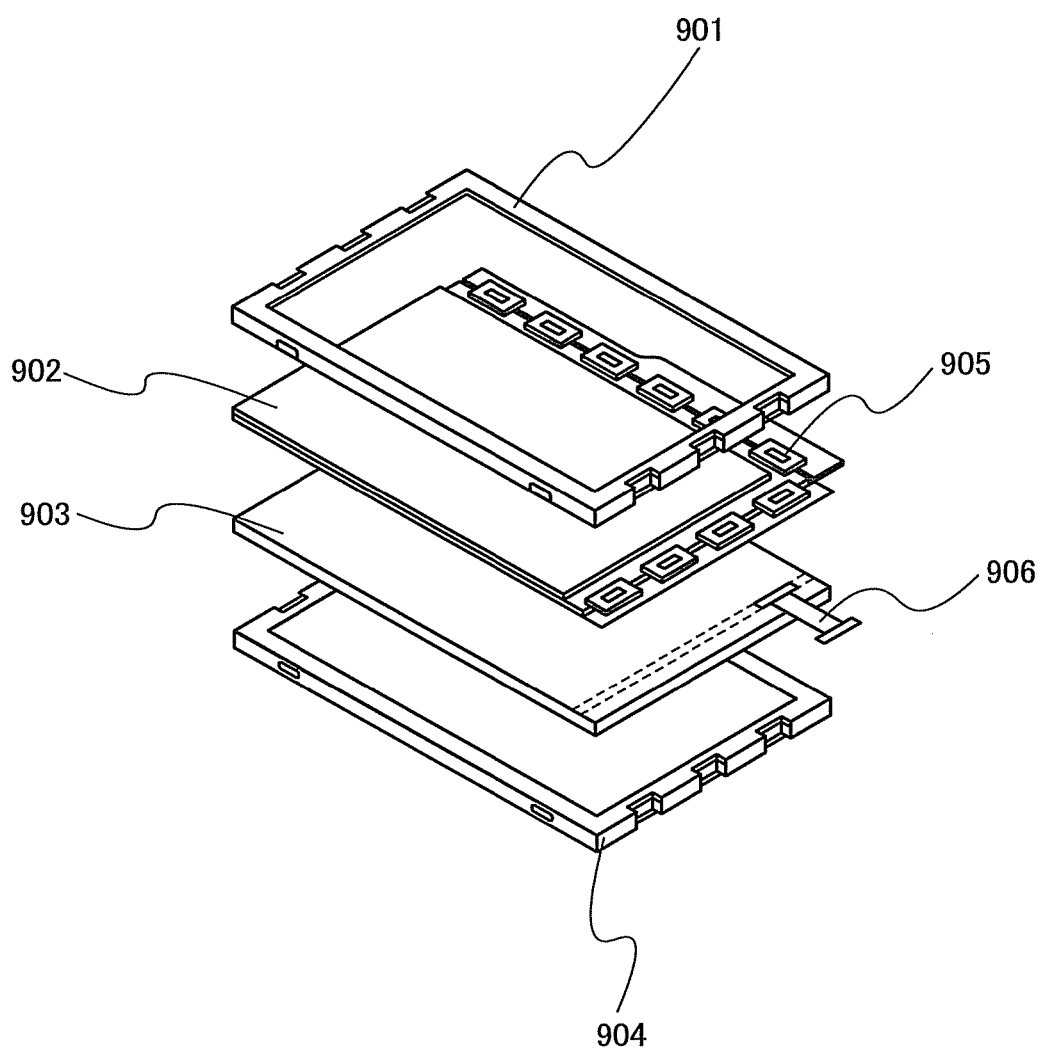
FIG. 8 illustrates an electronic device of one embodiment of the present invention.

FIG. 8 illustrates a liquid crystal display device using the light-emitting device to which one embodiment of the present invention is applied for a backlight, as an example of the electronic device using a light-emitting device according to one embodiment of the present invention for a lighting device. The liquid crystal display device illustrated in FIG. 8 includes a housing 901, a liquid crystal layer 902, a backlight 903 and a housing 904, and the liquid crystal layer 902 is connected to a driver IC 905. The light-emitting device to which one embodiment of the present invention is applied is used as the backlight 903, and current is supplied through a terminal 906.

The light-emitting device of one embodiment of the present invention is thin and exhibits low power consumption. Accordingly, by using the light-emitting device of one embodiment of the present invention as a backlight of a liquid crystal display device, the thickness and power consumption of the liquid crystal display device can also be reduced. In addition, the light-emitting device of one embodiment of the present invention is a surface emission lighting device and the area thereof can be increased. Thus, the area of the backlight can be readily increased, which contributes to an increase in the area of the liquid crystal display device. Furthermore, because of inexpensiveness of the light-emitting device according to one embodiment of the present invention, an inexpensive liquid crystal display device can be obtained.

Figure 9:
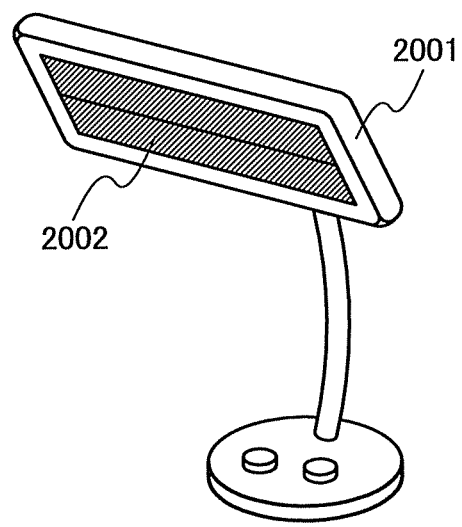
FIG. 9 illustrates a lighting device of one embodiment of the present invention.

FIG. 9 illustrates an example in which the light-emitting device to which one embodiment of the present invention is applied is used as a desk lamp which is a lighting device. The desk lamp illustrated in FIG. 9 includes a housing 2001 and a light source 2002. The light-emitting device to which one embodiment of the present invention is applied is used as the light source 2002. The light-emitting device to which one embodiment of the present invention is applied has low power consumption; therefore, a desk lamp also has low power consumption. Furthermore, because of the inexpensiveness of the light-emitting device according to one embodiment of the present invention, the table lamp is also inexpensive.

Figure 10:
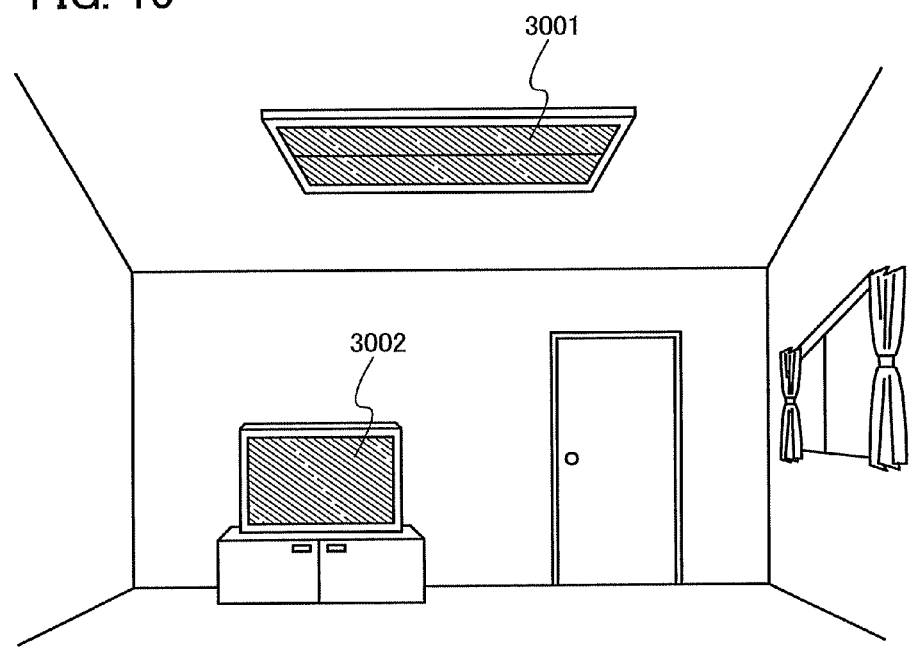
FIG. 10 illustrates a lighting device of one embodiment of the present invention.

FIG. 10 illustrates an example in which the light-emitting device to which one embodiment of the present invention is applied is used for an indoor lighting device 3001. Since the light-emitting device to which one embodiment of the present invention is applied can also have a large area, it can be used as a lighting device having a large area. Further, the light-emitting device to which one embodiment of the present invention is applied exhibits low power consumption; accordingly, is can be used as a lighting device having low power consumption. Thus, a television set 3002 according to one embodiment of the present invention similar to the television set described with reference to FIG. 5A can be installed in the room using the light-emitting device according to the present invention as the indoor lighting device 3001, so that pubic broadcasting and movies can be enjoyed. In such a case, since both devices have low power consumption, an environmental load can be reduced.

This embodiment can be combined with any other embodiment as appropriate.

Example 1

In this example, a structure of an electrode applied to one embodiment of the present invention will be exemplified. Hereinafter, unless otherwise mentioned, each aluminum alloy used in the examples has the composition as given below.

Aluminum-titanium alloy (hereinafter, designated as Al—Ti)
The titanium content in a target is 1 weight %.
Aluminum-neodymium alloy (hereinafter, designated as Al—Nd)
The neodymium content in a target is 2 atomic %.

Aluminum-nickel alloy (hereinafter, designated as Al—Ni—La)
The aluminum-nickel alloy used in examples of this specification includes lanthanum.
The nickel content in a target is 2 atomic %
The lanthanum content in a target is 0.35 atomic %.

Structural Example 1

To prepare Structural Example 1, a 40-nm-thick Al—Ti film was formed over a glass substrate by a sputtering method, using Al—Ti as a target (the titanium content in the target being 1 weight %). Next, using titanium (Ti) as a target, a 6-nm-thick Ti film was formed over the Al—Ti film by a sputtering method.

Comparative Example 1

To prepare Comparative Example 1, a 100-nm-thick Al—Ti film was formed over a glass substrate by a sputtering method, using Al—Ti as a target (the titanium content in the target being 1 weight %).

Comparative Example 2

To prepare Comparative Example 2, a 100-nm-thick Ti film was formed over a glass substrate by a sputtering method.

Figure 12:
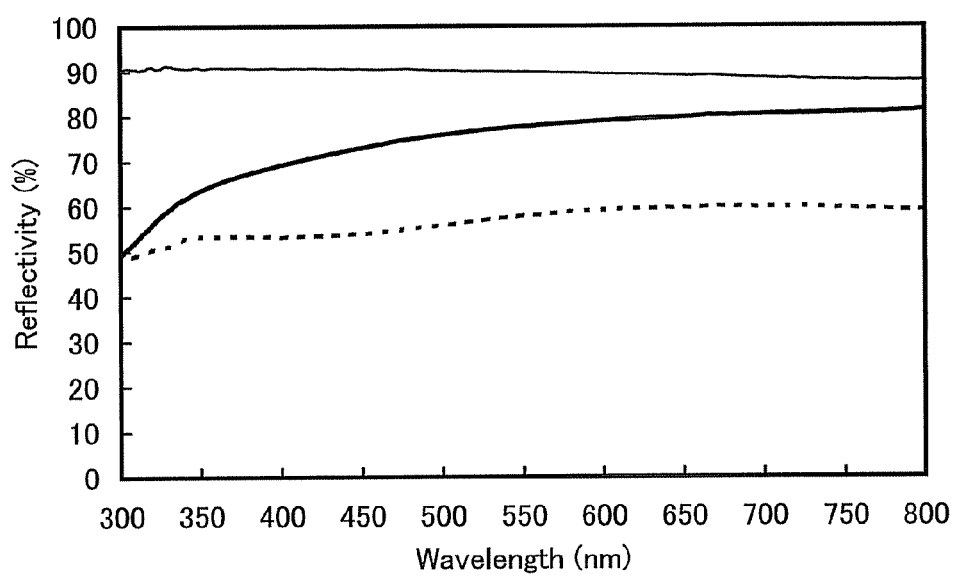
FIG. 12 shows reflectivities of electrodes formed in Example 1.

FIG. 12 shows measurement results of the reflectivities of the respective films prepared as above. The bold line indicates the reflectivity of Structural Example 1, the solid line indicates that of Comparative Example 1, and broken line indicates that of Comparative Example 2. As apparent from FIG. 12, the reflectivity of the Al—Ti film which is a film of an aluminum alloy is high, keeping a reflectivity of 85% or more in the wavelength region of 300 to 800 nm. In contrast, the reflectivity of the Ti film is of the order of 50 to 60% in the wavelength region of 300 to 800 nm.

The reflectivity of the stack of the Al—Ti film and the Ti film, which falls short of that of the Al—Ti film, is about 70 to 80% in the visible light region (wavelength region of 400 to 800 nm). It is thus understood that the stack of the Al—Ti film and the Ti film is suitable for use as a reflective electrode.

Further, the stack of the Al—Ti film and the Ti film was analyzed by EDX (energy dispersive x-ray spectroscopy), whereby oxygen was detected from part of the Ti film. Thus, at least the part of the Ti film becomes titanium oxide.

Example 2

In this example, description is provided for an example of an electrode applied to one embodiment of the present invention.

Structural Example 1

To prepare Structural Example 1, a 40-nm-thick Al—Ti film was formed over a glass substrate by a sputtering method, using Al—Ti as a target (the titanium content in the target being 1 weight %). Next, using titanium (Ti) as a target, a 6-nm-thick Ti film was formed over the Al—Ti film by a sputtering method.

Structural Example 2

To prepare Structural Example 2, a 300-nm-thick Al—Ni—La film was formed over a glass substrate by a sputtering method, using Al—Ni—La as a target (the nickel content being 2 atomic % and the lanthanum content being 0.35 atomic % in the target). Next, using titanium (Ti) as a target, a 6-nm-thick Ti film was formed over the Al—Ni—La film by a sputtering method.

Comparative Example 1

To prepare Comparative Example 1, a 100-nm-thick Al—Ti film was formed over a glass substrate by a sputtering method, using Al—Ti as a target (the titanium content in the target being 1 weight %).

Comparative Example 2

To prepare Comparative Example 2, a 100-nm-thick Ti film was formed over a glass substrate by a sputtering method.

Comparative Example 3

To prepare Comparative Example 3, a 40-nm-thick Al—Ti film was formed over a glass substrate by a sputtering method, using Al—Ti as a target (the titanium content in the target being 1 weight %). Next, using titanium (Ti) as a target, a 6-nm-thick Ti film was formed over the Al—Ti film by a sputtering method. Furthermore, a 10-nm-thick film of indium tin oxide containing silicon oxide (ITSO) was formed over the Ti film by a sputtering method.

Figure 28:
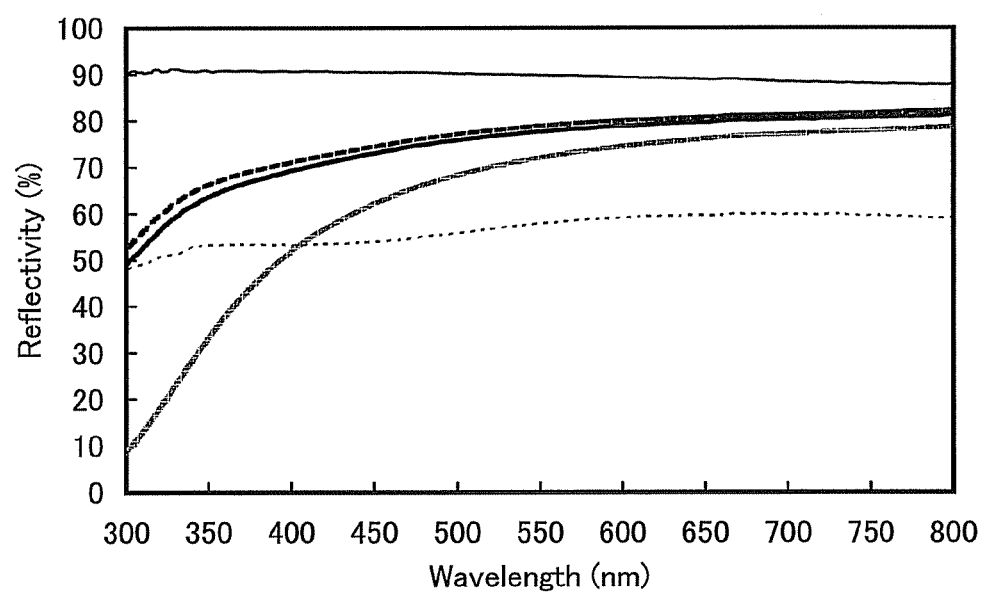
FIG. 28 reflectivities of electrodes formed in Example 1.

FIG. 28 shows measurement results of the reflectivities of the respective films prepared as above. The bold line indicates the reflectivity of Structural Example 1, the solid line indicates that of Structural Example 2, the bold broken line indicates that of Comparative Example 1, the broken line indicates that of Comparative Example 2, and the gray line indicates that of Comparative Example 3. As apparent from FIG. 28, the reflectivity of the Al—Ti film which is a film of an aluminum alloy is high, keeping a reflectivity of 85% or more in the wavelength region of 300 to 800 nm. In contrast, the reflectivity of the Ti film is of the order of 50 to 60% in the wavelength region of 300 to 800 nm. Further, the reflectivity of the stack of the Al—Ti film, the Ti film, and the ITSO film is about 50 to 75% in the visible light region (wavelength region of 400 to 800 nm), but significantly decreases as the wavelength decreases.

The reflectivity of the stack of the Al—Ti film and the Ti film and the stack of the Al—Ni—La film the Ti film, which falls short of that of the Al—Ti film, is about 70 to 80% in the visible light region (wavelength region of 400 to 800 nm). It is thus understood that the stack of the Al—Ti film and the Ti film and the stack of the Al—Ni—La film and the Ti film is suitable for use as a reflective electrode.

Example 3

Figure 13A:
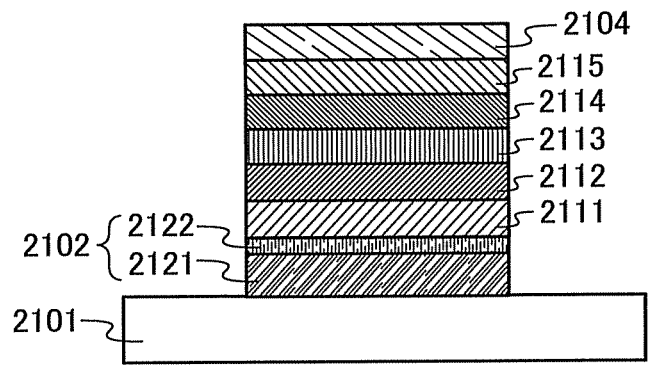
FIGS. 13A to 13C illustrate light-emitting elements of Examples 3 to 9.
Figure 13B:
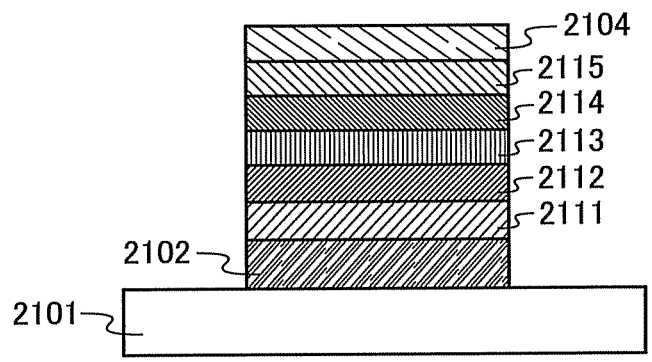

In this example, with reference to FIGS. 13A and 13B, description is made of an example of a light-emitting element to which one embodiment of the present invention is applied. FIG. 13A is used in the description of Light-emitting Elements 1 and 2, and FIG. 13B is used in the description of Comparative Light-emitting Elements 1 and 2. Structural formulae of materials used in this example are shown below.

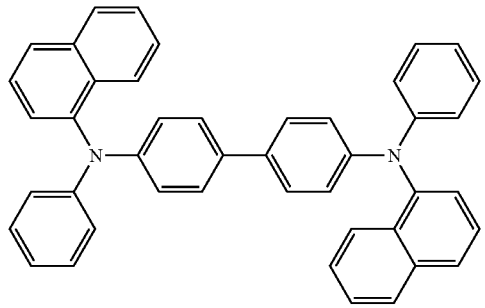

NPB

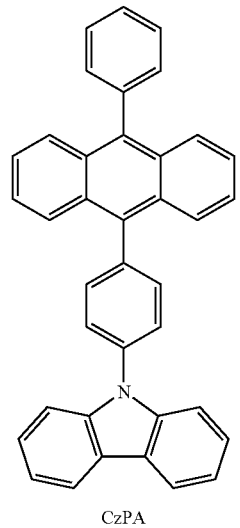

CzPA

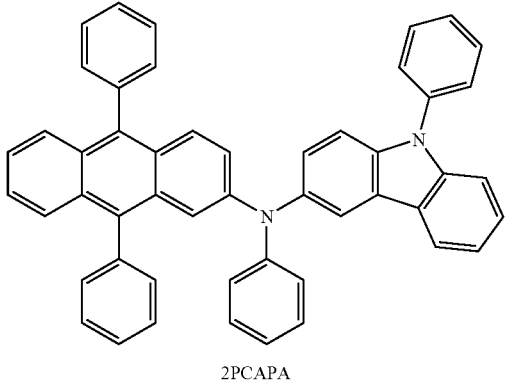

2PCAPA

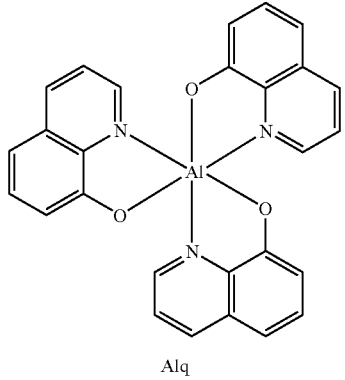

Alq

-continued

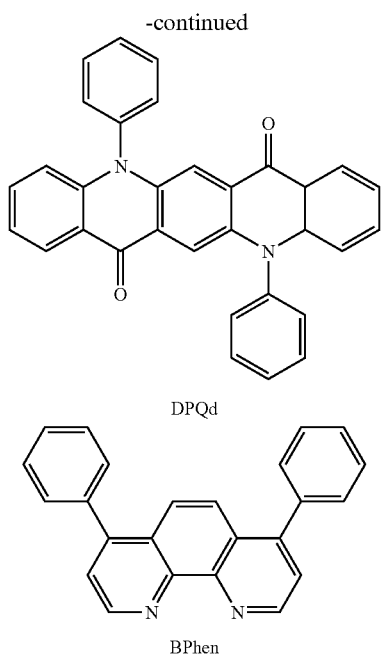

DPQd

BPhen

Hereinafter, methods for manufacturing the light-emitting elements of this example will be described.
(Light-Emitting Element 1)

A first electrode 2102 was formed over a glass substrate 2101. First, a 40-nm-thick Al—Ti film 2121 was aimed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed, and subjected to heat treatment at 250° C. for 1 hour in an $N_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an $N_2$ atmosphere.

The substrate 2101 was next washed again and subjected to heat treatment at 200° C. for 1 hour in an $N_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, a layer 2111 including a composite material of an organic compound and an inorganic compound was formed over the first electrode 2102. The thickness of the layer 2111 was set to 190 nm and the weight ratio of NPB to molybdenum(VI) oxide was adjusted to 2:0.222 (=NPB:molybdenum oxide). Note that the co-evaporation method is an evaporation method in which evaporation of a plurality of materials is carried out from a plurality of evaporation sources at the same time in one treatment chamber.

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form a hole-transport layer 2112.

Then, by co-evaporation of 9-[4-(10-phenyl-9-anthryl)phenyl]-9H-carbazole (abbreviated to CzPA) and N-(9,10-diphenyl-2-anthryl)-N,9-diphenyl-9H-carbazol-3-amine (abbreviated to 2PCAPA), a light-emitting layer 2113 was formed over the hole-transport layer 2112 to a thickness of 30 nm. Here, the weight ratio of CzPA to 2PCAPA was adjusted to 1:0.05 (=CzPA:2PCAPA).

Next, by co-evaporation of tris(8-quinolinolato)aluminum (III) (abbreviated to Alq) and N,N'-diphenylquinacridone (abbreviated to DPQd), a first electron-transport layer 2114A for controlling transport of electrons which has a thickness of 10 nm was formed over the light-emitting layer 2113. Here, the weight ratio of Alq to DPQd was adjusted to 1:0.005 (=Alq:DPQd).

Next, bathophenanthroline (abbreviated to BPhen) was deposited to a thickness of 20 nm over the first electron-transport layer 2114A by an evaporation method utilizing resistance heating, whereby a second electron-transport layer 2114B was formed.

Next, lithium fluoride (LiF) was deposited to a thickness of 1 nm over the second electron-transport layer 2114B by an evaporation method using resistance heating to form a buffer layer 2115.

Next, a second electrode 2104 was formed over the buffer layer 2115. First, by co-evaporation of magnesium (Mg) and silver (Ag), a 1-nm-thick film of a magnesium-silver alloy (hereinafter, referred to as Mg—Ag) was formed over the buffer layer 2115. Here, the volume ratio of Ag to Mg was adjusted to 1:9 (=Ag:Mg). Next, by an evaporation method using resistance heating, silver (Ag) was deposited to a thickness of 14 nm over the Mg—Ag film. Next, a 40-nm-thick ITO film was formed by a sputtering method, using indium oxide-tin oxide (ITO: indium tin oxide) as a target (the $SnO_2$ content in the target being 10 weight %).
(Light-Emitting Element 2)

Light-emitting Element 2 was formed in a manner similar to that of Light-emitting Element 1, except that a first electrode was formed using a stack of an Al—Nd film and a Ti film. In other words, a 40-nm-thick Al—Nd film was formed over a glass substrate by a sputtering method, using Al—Nd as a target (the neodymium content in the target being 2 atomic %). Next, using titanium (Ti) as a target, a 6-nm-thick Ti film was formed over the Al—Nd film by a sputtering method.
(Comparative Light-Emitting Element 1)

Instead of the Ti film of Light-emitting Element 1, a layer including a composite material was further formed to a thickness of 10 nm. That is, a 200-nm-thick layer including a composite material was formed over the Al—Ti film. Except that the Ti film was not formed and that the thickness of the layer including a composite material differs from that of Light-emitting Element 1, Comparative Light-emitting Element 1 was formed in a manner similar to that of Light-emitting Element 1.
(Comparative Light-Emitting Element 2)

Instead of the Ti film of Light-emitting Element 2, a layer including a composite material was further formed to a thickness of 10 nm. That is, a 200-nm-thick layer including a composite material was formed over the Al—Nd film. Except that the Ti film was not formed and that the thickness of the layer including a composite material differs from that of Light-emitting Element 2, Comparative Light-emitting Element 2 was formed in a manner similar to that of Light-emitting Element 2.

Table 1 shows element structures of Light-emitting Elements 1 and 2 and Comparative Light-emitting Elements 1 and 2 which were formed as described above.

including a composite material. Accordingly, injection of holes from the first electrode to the EL layer is inhibited to increase the drive voltage. In contrast, in each of Light-emitting Elements 1 and 2, the formation of the Ti film over the aluminum alloy film makes it possible to suppress oxidation of the aluminum alloy during the process. Besides, even if

TABLE 1

| | First Electrode | | Layer including composite material | Hole-transporting Layer | Light-emitting layer | Electron-transporting layer | | Buffer layer | Second electrode | | |
|---|---|---|---|---|---|---|---|---|---|---|---|
| Light-emitting Element 1 | Al—Ti 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=9:1 volume ratio) 1 nm | Ag 14 nm | ITO 40 nm |
| Light-emitting Element 2 | Al—Nd 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=9:1 volume ratio) 1 nm | Ag 14 nm | ITO 40 nm |
| Comparative light-emitting Element 1 | Al—Ti 40 nm | | NPB:Molybdenum oxide (=2:0.222) 200 nm | NPB 10 nm | CzPA:2PCAPA (=1:0.05) 30 nm | Alq:DPQd (=1:0.005) 10 nm | Bphen 20 nm | LiF 1 nm | Mg:Ag (=9:1 volume ratio) 1 nm | Ag 14 nm | ITO 40 nm |
| Comparative light-emitting Element 2 | Al—Nd 40 nm | | NPB:Molybdenum oxide (=2:0.222) 200 nm | NPB 10 nm | CzPA:2PCAPA (=1:0.05) 30 nm | Alq:DPQd (=1:0.005) 10 nm | Bphen 20 nm | LiF 1 nm | Mg:Ag (=9:1 volume ratio) 1 nm | Ag 14 nm | ITO 40 nm |

In a glove box containing a nitrogen atmosphere, Light-emitting Elements 1 and 2 and Comparative Light-emitting Elements 1 and 2 were sealed with a glass substrate so as not to be exposed to air. Then, operation characteristics of these light-emitting elements were measured. Note that the measurement was carried out at room temperature (in the atmosphere maintained at 25° C.).

Figure 14:
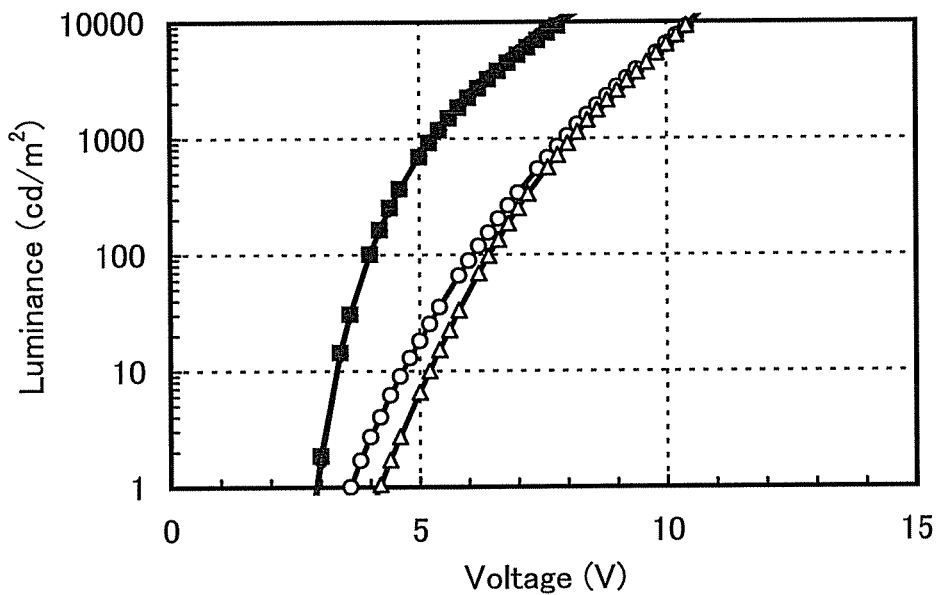
FIG. 14 shows voltage vs. luminance characteristics of the light-emitting elements formed in Example 3.
Figure 15:
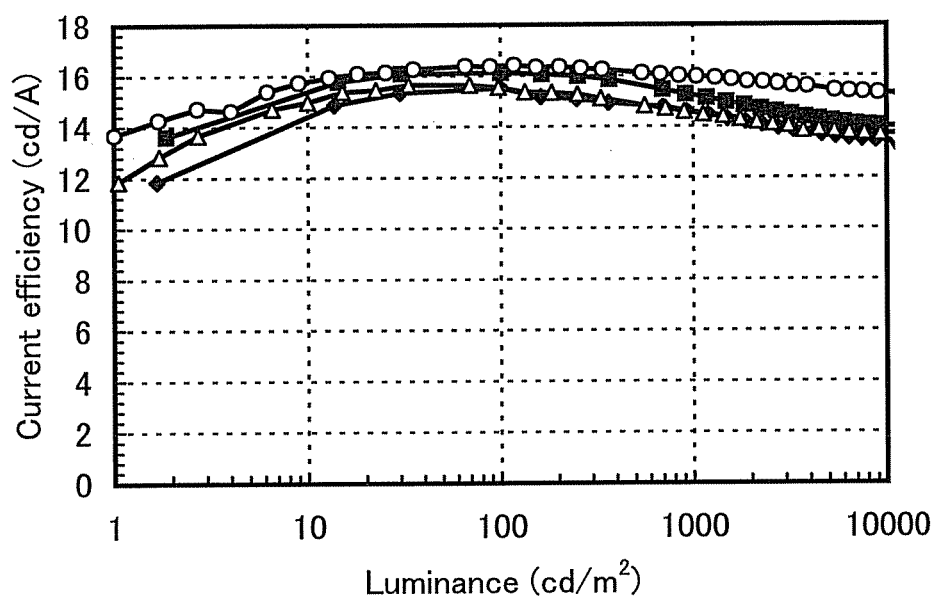
FIG. 15 shows luminance vs. current efficiency characteristics of the light-emitting elements formed in Example 3.

FIG. 14 shows voltage vs. luminance characteristics of Light-emitting Elements 1 (■) and 2 (♦) and Comparative Light-emitting Elements 1 (○) and 2(Δ). In addition, FIG. 15 shows luminance vs. current efficiency characteristics. Further, Table 2 shows the voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

oxygen enters the aluminum alloy, forming the Ti film over the aluminum alloy by a sputtering method results in a favorable state of contact between the aluminum alloy and the Ti film; therefore, an increase in voltage due to oxidation of the aluminum alloy is suppressed. Even oxidation of the Ti film has no adverse effect on hole injection to the EL layer through the layer including a composite material, so that holes are smoothly injected from the first electrode to the EL layer to reduce the drive voltage.

Therefore, application of one embodiment of the present invention can provide a light-emitting element having low drive voltage while maintaining high emission efficiency.

In addition, as shown in Table 2, the light-emitting elements to which one embodiment of the present invention is applied have higher power efficiency than the comparative

TABLE 2

| | Voltage (V) | Current (mA) | Current density (mA/cm$^2$) | Chromaticity x | Chromaticity y | Luminance (cd/m$^2$) | Current efficiency (cd/A) | Power efficiency (lm/W) |
|---|---|---|---|---|---|---|---|---|
| Light-emitting element 1 | 5.2 | 0.24 | 6.01 | 0.20 | 0.68 | 917 | 15.3 | 9.2 |
| Light-emitting element 2 | 5.2 | 0.254 | 6.34 | 0.28 | 0.66 | 926 | 14.6 | 8.8 |
| Comparative element 1 | 8.0 | 0.262 | 6.54 | 0.25 | 0.68 | 1044 | 16.0 | 6.3 |
| Comparative element 2 | 8.0 | 0.248 | 6.19 | 0.21 | 0.68 | 903 | 14.6 | 5.7 |

As can be seen from the CIE chromaticity coordinates in Table 2, each light-emitting element provides green light emission. Further, FIG. 15 and Table 2 show that all the light-emitting elements exhibit similar current efficiencies. Nevertheless, as can be seen from FIG. 14 and Table 2, Comparative Light-emitting Elements 1 and 2 show marked increases in drive voltage compared to Light-emitting Elements 1 and 2. This is because, in Comparative Light-emitting Elements 1 and 2, an exposed surface of the aluminum alloy is oxidized during the process including washing, heat treatment, and the like before the formation of the layer light-emitting elements. Thus, by application of one embodiment of the present invention, a light-emitting element having low power consumption can be obtained.

Example 4

In this example, with reference to FIG. 13A, description is made of an example of a light-emitting element to which one embodiment of the present invention is applied. Hereinafter, methods for manufacturing the light-emitting elements of this example will be described.

(Light-Emitting Element 3)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an $N_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an $N_2$ atmosphere.

The substrate 2101 was next washed again and subjected to heat treatment at 200° C. for 1 hour in an $N_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, a layer 2111 including a composite material of an organic compound and an inorganic compound was formed over the first electrode 2102. The thickness of the layer 2111 was set to 190 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Then, by co-evaporation of 9-[4-(10-phenyl-9-anthryl)phenyl]-9H-carbazole (abbreviated to CzPA) and N-(9,10-diphenyl-2-anthryl)-N,9-diphenyl-9H-carbazol-3-amine (abbreviated to 2PCAPA), the light-emitting layer 2113 was formed over the hole-transport layer 2112 to a thickness of 30 nm. Here, the weight ratio of CzPA to 2PCAPA was adjusted to 1:0.05 (=CzPA:2PCAPA).

Next, by co-evaporation of tris(8-quinolinolato)aluminum (III) (abbreviated to Alq) and N,N-diphenylquinacridone (abbreviated to DPQd), the first electron-transport layer 2114A for controlling transport of electrons which has a thickness of 10 nm was formed over the light-emitting layer 2113. Here, the weight ratio of Alq to DPQd was adjusted to 1:0.005 (=Alq:DPQd).

Next, bathophenanthroline (abbreviated to BPhen) was deposited to a thickness of 20 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 3:7 (=Ag:Mg). Next, a 70-nm-thick ITO film was formed by a sputtering method, using indium oxide-tin oxide (ITO: indium tin oxide) as a target (the $SnO_2$ content in the target being 10 weight %).

(Light-Emitting Element 4)

Except that the volume ratio of Ag to Mg of the Mg—Ag film was set to 5:5 (=Ag:Mg), Light-emitting Element 4 was formed in a manner similar to that of Light-emitting Element 3.

(Light-Emitting Element 5)

Except that the volume ratio of Ag to Mg of the Mg—Ag film was set to 7:3 (=Ag:Mg), Light-emitting Element 5 was formed in a manner similar to that of Light-emitting Element 3.

(Light-Emitting Element 6)

Except that the volume ratio of Ag to Mg of the Mg—Ag film was set to 8:2 (=Ag:Mg), Light-emitting Element 6 was formed in a manner similar to that of Light-emitting Element 3.

(Light-Emitting Element 7)

Except that the volume ratio of Ag to Mg of the Mg—Ag film was set to 9:1 (=Ag:Mg), Light-emitting Element 7 was formed in a manner similar to that of Light-emitting Element 3.

Table 3 shows element structures of Light-emitting Elements 3 to 7 manufactured as described above.

TABLE 3

| | First Electrode | | Layer including composite material | Hole-transporting Layer | Light-emitting layer | Electron-transporting layer | | Buffer layer | Second electrode | |
|---|---|---|---|---|---|---|---|---|---|---|
| Light-emitting Element 3 | Al—Ti 40 nm | Ti 6 nm | NPB:Molybdenum (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=7:3 volume ratio) 10 nm | ITO 70 nm |
| Light-emitting Element 4 | Al—Ti 40 nm | Ti 6 nm | NPB:Molybdenum (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=5:5 volume ratio) 10 nm | ITO 70 nm |
| Light-emitting Element 5 | Al—Ti 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=3:7 volume ratio) 10 nm | ITO 70 nm |
| Light-emitting Element 6 | Al—Ti 40 nm | Ti 6 nm | NPB:Molybdenum (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=2:8 volume ratio) 10 nm | ITO 70 nm |

TABLE 3-continued

|  | First Electrode | | Layer including composite material | Hole-transporting Layer | Light-emitting layer | Electron-transporting layer | Buffer layer | Second electrode | |
|---|---|---|---|---|---|---|---|---|---|
| Light-emitting Element 7 | Al—Ti 40 nm | Ti 6 nm | NPB:Molybdenum (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=9:1 volume ratio) 10 nm | ITO 70 nm |

In a glove box containing a nitrogen atmosphere, Light-emitting Elements 3 to 7 were sealed with a glass substrate so as not to be exposed to air. Then, operation characteristics of these light-emitting elements were measured. Note that the measurement was carried out at room temperature (in the atmosphere maintained at 25° C.).

Figure 16:
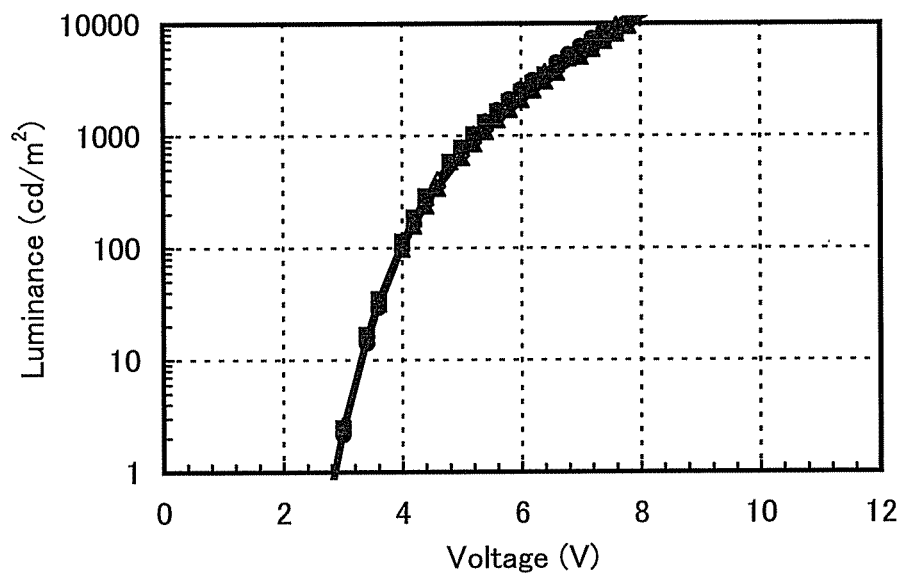
FIG. 16 shows voltage vs. luminance characteristics of the light-emitting elements formed in Example 4.

FIG. 16 shows voltage vs. luminance characteristics of Light-emitting Elements 3 (●), 4 (Δ), 5 (■), 6 (◇), and 7 (▲).

Figure 17:
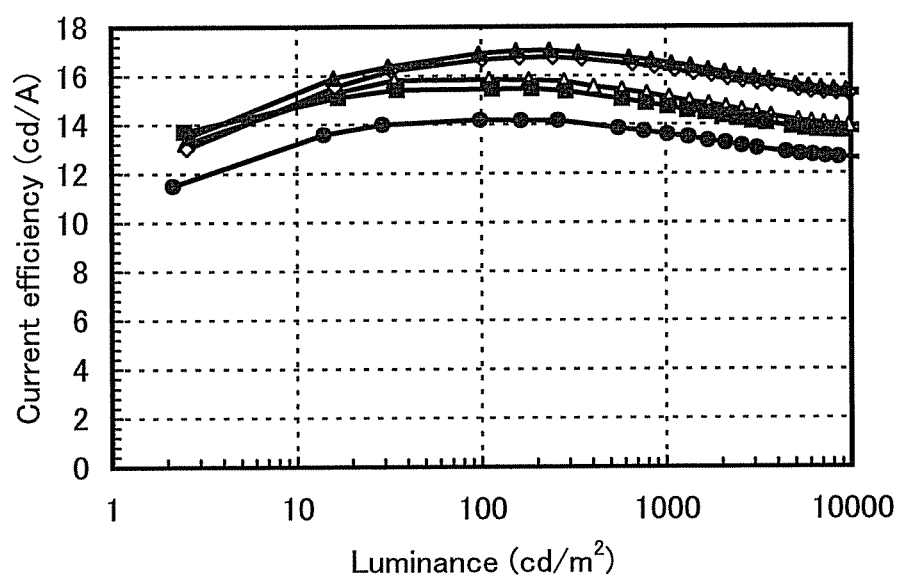
FIG. 17 shows luminance vs. current efficiency characteristics of the light-emitting elements formed in Example 4.

In addition, FIG. 17 shows luminance vs. current efficiency characteristics. Further, Table 4 shows the voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

TABLE 4

|  | Voltage (V) | Current (mA) | Current density (mA/cm$^2$) | Chromaticity x | Chromaticity y | Luminance (cd/m$^2$) | Current efficiency (cd/A) | Power efficiency (lm/W) |
|---|---|---|---|---|---|---|---|---|
| Light-emitting element 3 | 5.2 | 0.30 | 7.50 | 0.17 | 0.71 | 1020 | 13.6 | 8.2 |
| Light-emitting element 4 | 5.2 | 0.28 | 6.91 | 0.19 | 0.71 | 1044 | 15.1 | 9.1 |
| Light-emitting element 5 | 5.2 | 0.28 | 6.97 | 0.17 | 0.71 | 1026 | 14.7 | 8.9 |
| Light-emitting element 6 | 5.4 | 0.28 | 6.90 | 0.19 | 0.72 | 1121 | 16.2 | 9.4 |
| Light-emitting element 7 | 5.4 | 0.26 | 6.52 | 0.19 | 0.72 | 1075 | 16.5 | 9.6 |

As can been seen from the CIE chromaticity coordinates in Table 4, each light-emitting element emits green light within the range where x=0.17 to 0.19 and y=0.71 to 0.72 as the CIE chromaticity coordinates (x, y). In other words, green light emission having a chromaticity near the green-color chromaticity defined by NTSC (National Television Standards Committee), i.e., (x, y)=(0.21, 0.71), was able to be obtained.

Further, as apparent from FIG. 16 and Table 4, all the light-emitting elements exhibit similar drive voltages. This is because, as described in Example 2, the first electrode to which one embodiment of the present invention is applied can smoothly inject holes from the first electrode to the EL layer.
(Light-Emitting Element 15)

Figure 18:
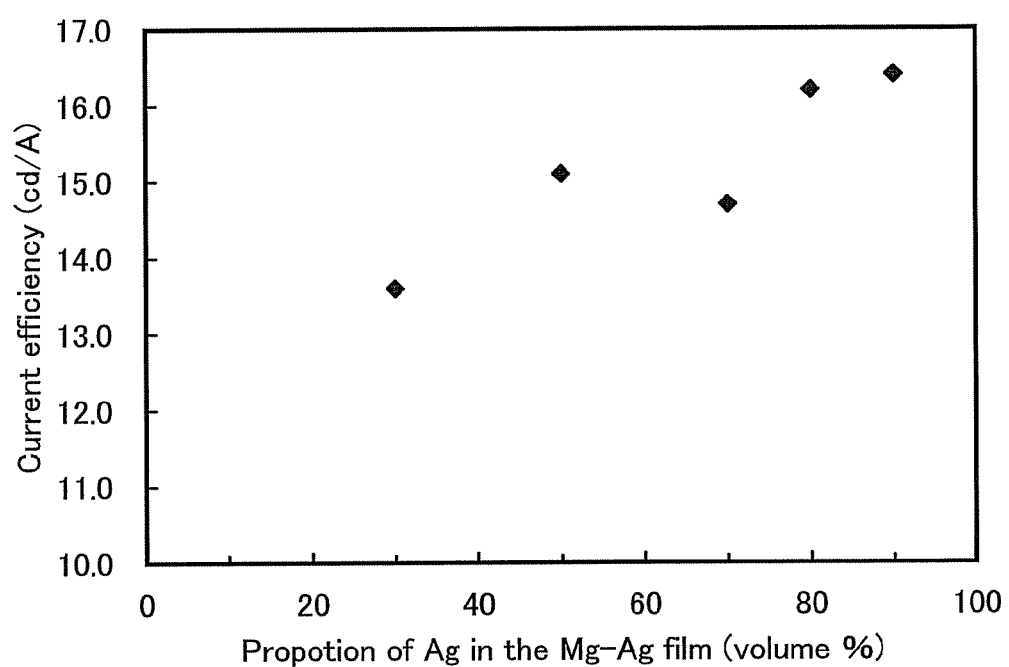
FIG. 18 shows the relationship between the proportion of Ag in a Mg—Ag film and current efficiency.

Moreover, FIG. 17 and Table 4 indicate that, as the proportion of Ag in the Mg—Ag film increases, the current efficiency improves. FIG. 18 shows the relationship between the proportion of Ag in the Mg—Ag film and the current efficiency. As apparent from FIG. 18, with the increase in the proportion of Ag in the Mg—Ag film, the current efficiency increases, but when the ratio of silver to magnesium equals or exceeds 8:2 (=Ag:Mg), the increase in current efficiency is saturated. Hence, the proportion of Ag in the Mg—Ag film is preferably set so that the ratio of Ag to Mg is 8:2 or higher.

As described above, application of one embodiment of the present invention can provide a light-emitting element having low drive voltage while maintaining high emission efficiency. In addition, a light-emitting element having low power consumption can be obtained.

Example 5

In this example, with reference to FIG. 13A, description is made of an example of a light-emitting element to which one embodiment of the present invention is applied. Structural formulae of materials used in this example are shown below. Note that the structural formulae of the materials which have already been shown are omitted.

Hereinafter, methods for manufacturing the light-emitting elements of this example will be described.

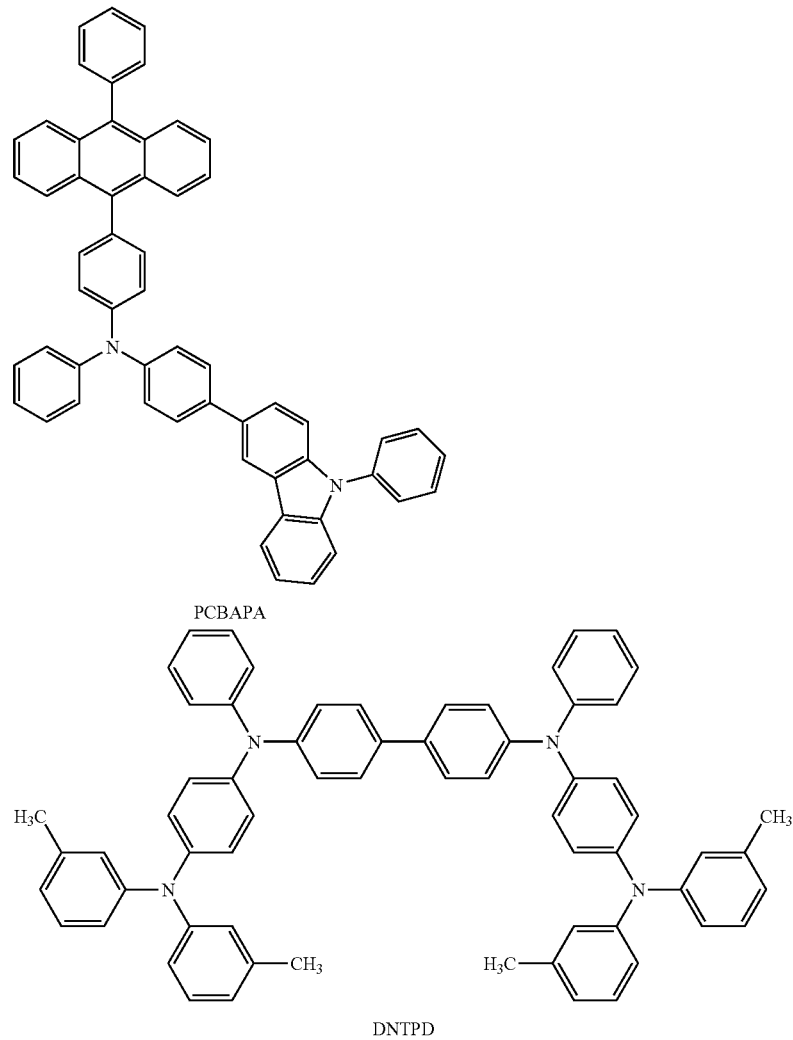

(Light-Emitting Element 8)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an $N_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an $N_2$ atmosphere.

The substrate 2101 was next washed again and subjected to heat treatment at 200° C. for 1 hour in an $N_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, a layer 2111 including a composite material of an organic compound and an inorganic compound was formed over the first electrode 2102. The thickness of the layer 2111 was set to 10 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Next, 4-(10-phenyl-9-anthryl)-4'-(9-phenyl-9H-carbazol-3-yl)triphenylamine (abbreviated to PCBAPA) was deposited to a thickness of 10 nm over the hole-transport layer 2112 by an evaporation method utilizing resistance heating, whereby a first light-emitting layer 2113A was formed. Then, by co-evaporation of 9-[4-(10-phenyl-9-anthryl)phenyl]-9H-carbazole (abbreviated to CzPA) and 4-(10-phenyl-9-anthryl)-4'-(9-phenyl-9H-carbazol-3-yl)triphenylamine (abbreviated to PCBAPA), a second light-emitting layer 2113B having a thickness of 30 nm was formed over the first light-emitting layer 2113A. The weight ratio of CzPA to PCBAPA was adjusted to 1:0.1 (=CzPA:PCBAPA).

Next, tris(8-quinolinolato)aluminum(III) (abbreviated to Alq) was deposited to a thickness of 10 nm over the second light-emitting layer 2113B by an evaporation method utilizing resistance heating, whereby the first electron-transport layer 2114A was formed. Next, bathophenanthroline (abbreviated to BPhen) was deposited to a thickness of 10 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 10:1 (=Ag:Mg). Next, a 70-nm-thick ITO film was formed by a sputtering method, using indium oxide-tin oxide (ITO: indium tin oxide) as a target (the $SnO_2$ content in the target being 10 weight %).

(Comparative Light-Emitting Element 8)

Instead of the layer including a composite material of Light-emitting Element 8, N,N-bis[4-[bis(3-methylphenyl)amino]phenyl]-N,N'-diphenyl-[1,1'-biphenyl]-4,4'-diamine (abbreviated to DNTPD), which was widely used as a material for a hole-injection layer, was deposited to a thickness of 10 nm as a hole-injection layer. Except the hole-injection layer, Comparative Light-emitting Element 8 was formed in a manner similar to that of Light-emitting Element 8.

Table 5 shows element structures of Light-emitting Element 8 and Comparative Light-emitting Element 8 which were formed as described above.

TABLE 5

| | First Electrode | | Hole-transporting Layer | | Light-emitting layer | | Electron-transporting layer | | Buffer layer | Second electrode | |
|---|---|---|---|---|---|---|---|---|---|---|---|
| | | | Layer including composite material | | | | | | | | |
| Light-emitting element 8 | Al—Ti 40 nm | Ti 6 nm | NPB:Molybdenum oxide (=2:0.222) 10 nm Hole-injection layer | NPB 10 nm | PCBAPA 10 nm | CzPA:PCBAPA (=1:0.1) 30 nm | Alq 10 nm | Bphen 10 nm | LiF 1 nm | Mg:Ag (=1:10 volume ratio) 10 nm | ITO 70 nm |
| Comparative Light-emitting element 8 | Al—Ti 40 nm | Ti 6 nm | DNTPD 10 nm | NPB 10 nm | PCBAPA 10 nm | CzPA:PCBAPA (=1:0.01) 30 nm | Alq 10 nm | Bphen 10 nm | LiF 1 nm | Mg:Ag (=1:10 volume ratio) 10 nm | ITO 70 nm |

In a glove box containing a nitrogen atmosphere, Light-emitting Element 8 and Comparative Light-emitting Element 8 were sealed with a glass substrate so as not to be exposed to air. Then, operation characteristics of these light-emitting elements were measured. Note that the measurement was carried out at room temperature (in the atmosphere maintained at 25° C.).

Figure 19:
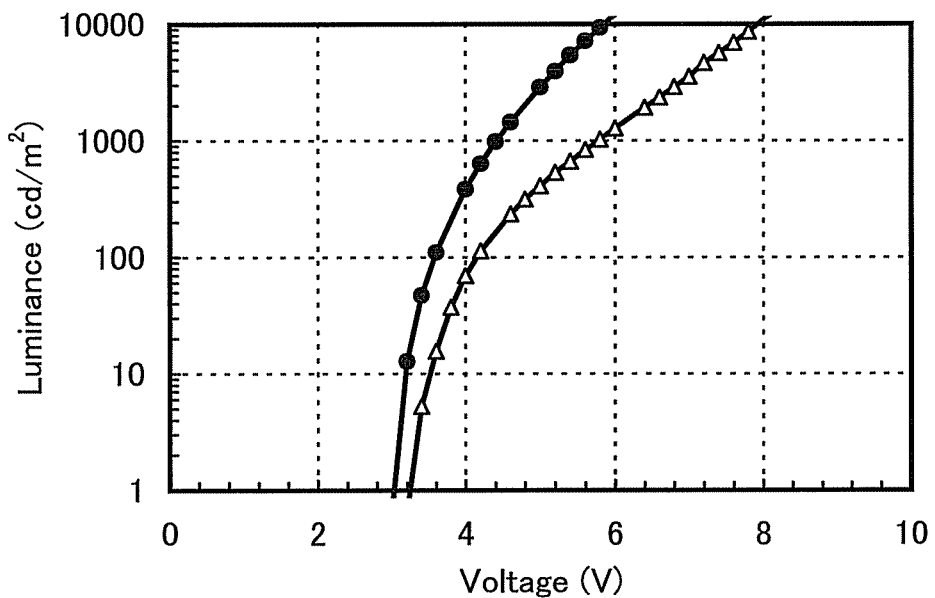
FIG. 19 shows voltage vs. luminance characteristics of the light-emitting elements formed in Example 5.
Figure 20:
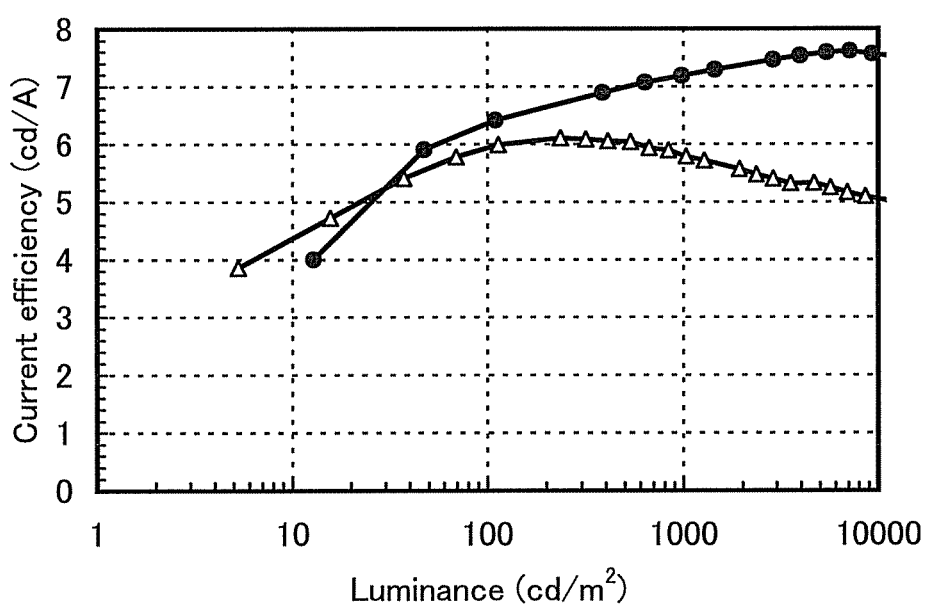
FIG. 20 shows luminance vs. current efficiency characteristics of the light-emitting elements formed in Example 5.

FIG. 19 shows voltage vs. luminance characteristics of Light-emitting Element 8 (●) and Comparative Light-emitting Element 8 (Δ). In addition, FIG. 20 shows luminance vs. current efficiency characteristics. Further, Table 6 shows the voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

TABLE 6

|  | Voltage (V) | Current (mA) | Current density (mA/cm$^2$) | Chromaticity x | Chromaticity y | Luminance (cd/m$^2$) | Current efficiency (cd/A) | Power efficiency (lm/W) |
| --- | --- | --- | --- | --- | --- | --- | --- | --- |
| Light-emitting element 8 | 4.4 | 0.545 | 13.6 | 0.13 | 0.24 | 980 | 7.2 | 5.1 |
| Comparative light-emitting element 8 | 5.8 | 0.712 | 17.8 | 0.13 | 0.23 | 1030 | 5.8 | 3.1 |

From the CIE chromaticity coordinates in Table 6, it is understood that Light-emitting Element 8 and Comparative Light-emitting Element 8 both emit blue light. Moreover, as can be seen from FIG. 19 and Table 6, Comparative Light-emitting Element 8 shows a marked increase in drive voltage compared to Light-emitting Element 8. This indicates that, in a typical hole-injection layer, holes are difficult to inject from a first electrode. In one embodiment of the present invention, the composite material including an organic compound and an inorganic compound is used for the layer in contact with the first electrode. The use of the composite material facilitates hole injection from the first electrode, which leads to a reduction in drive voltage.

In addition, from FIG. 20 and Table 6, the current efficiency of Comparative Light-emitting Element 8 also decreases compared to Light-emitting Element 8. This indicates that holes are not easily injected from the first electrode; accordingly, a carrier balance is lost to reduce current efficiency.

As described above, application of one embodiment of the present invention can provide a light-emitting element having low drive voltage while maintaining high emission efficiency.

In addition, as shown in Table 6, the light-emitting elements to which one embodiment of the present invention is applied have higher power efficiency than the comparative light-emitting elements. Thus, by application of one embodiment of the present invention, a light-emitting element having low power consumption can be obtained.

Example 6

In this example, with reference to FIG. 13A, description is made of an example of a light-emitting element to which one embodiment of the present invention is applied. Structural formulae of materials used in this example are shown below. Note that structural formulae of the materials which have already been shown are omitted.

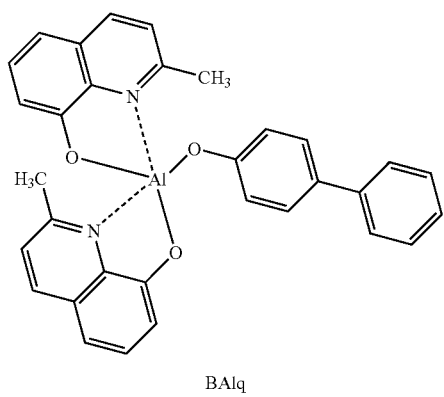

BAlq

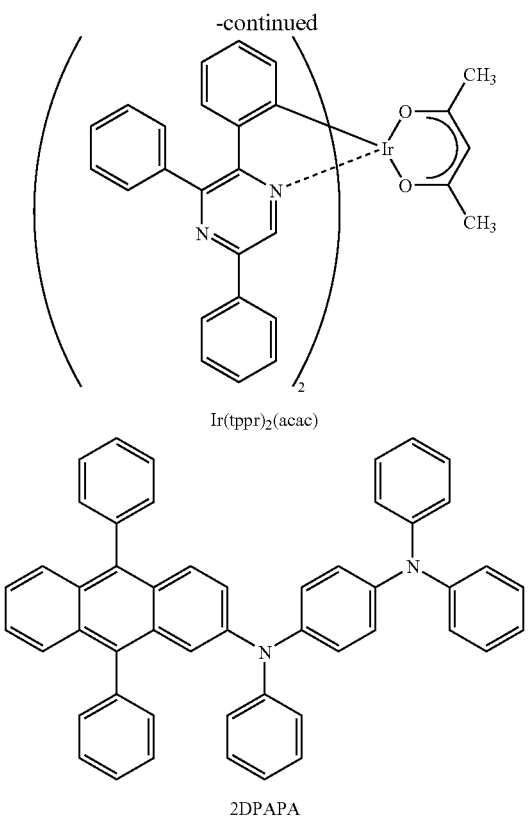

Ir(tppr)$_2$(acac)

2DPAPA

Hereinafter, methods for manufacturing the light-emitting elements of this example will be described.

(Light-Emitting Element 9)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an N$_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an N$_2$ atmosphere.

The substrate 2101 was next washed again and subjected to heat treatment at 200° C. for 1 hour in an N$_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, a layer 2111 including a composite material of an organic compound and an inorganic compound was formed over the first electrode 2102. The thickness of the layer 2111 was set to 40 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Then, by co-evaporation of bis(2-methyl-8-quinolinolato) (4-phenylphenolato)aluminum(III) (abbreviated to BAlq), 4,4'-bis[N-(1-naphthyl)-N-phenylamino]biphenyl (abbreviated to NPB), and (acetylacetonato)bis(2,3,5-triphenylpyrazinato)iridium(III) (abbreviated to Ir(tppr)$_2$(acac)), the light-emitting layer 2113 was formed over the hole-transport layer 2112 to a thickness of 50 nm. Here, the weight ratio of BAlq to NPB and Ir(tppr)$_2$(acac) was adjusted to 1:0.15: 0.06 (=BAlq:NPB:Ir(tppr)$_2$(acac)).

Next, tris(8-quinolinolato)aluminum(III) (abbreviated to Alq) was deposited to a thickness of 10 nm over the light-emitting layer 2113 by an evaporation method utilizing resistance heating, whereby the first electron-transport layer 2114A was formed. Next, bathophenanthroline (abbreviated to BPhen) was deposited to a thickness of 30 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 10:1 (=Ag:Mg). Next, a 100-nm-thick ITO film was formed by a sputtering method, using indium oxide-tin oxide (ITO: indium tin oxide) as a target (the SnO$_2$ content in the target being 10 weight %).

(Light-Emitting Element 10)

In a similar way to that of Light-emitting Element 9, the first electrode 2102 was formed, heat treatment and the like were performed, and then the layer 2111 including a composite material was formed over the first electrode 2102. The ratio of NPB to molybdenum oxide in the layer including a composite material was adjusted to be the same as Light-emitting Element 9, and the thickness thereof was set to 30 nm.

Over the layer 2111 including a composite material, NPB was deposited to a thickness of 10 nm to form the hole-transport layer 2112.

Then, by co-evaporation of 9-[4-(10-phenyl-9-anthryl) phenyl]-9H-carbazole (abbreviated to CzPA) and N-(9,10-diphenyl-2-anthryl)-N,N',N'-triphenyl-1,4-phenylenediamine (abbreviated to 2DPAPA), the light-emitting layer 2113 was formed over the hole-transport layer 2112 to a thickness of 30 nm. Here, the weight ratio of CzPA to 2DPAPA was adjusted to 1:0.1 (=CzPA:2DPAPA).

Next, over the light-emitting layer 2113, Alq was deposited to a thickness of 10 nm to form the first electron-transport layer 2114A. Then, BPhen was deposited to a thickness of 20 nm to form the second electron-transport layer 2114B. Over the second electron-transport layer 2114B, LiF was deposited to a thickness of 1 nm to form the buffer layer 2115.

Next, the second electrode 2104 was formed over the buffer layer 2115. The ratio of Mg to Ag in the Mg—Ag film was adjusted to be the same as Light-emitting Element 9, and the thickness thereof was set to 10 nm. Then, an ITO film was formed to a thickness of 70 nm.

(Light-Emitting Element 11)

In a similar way to that of Light-emitting Element 9, the first electrode 2102 was formed, heat treatment and the like were performed, and then the layer 2111 including a composite material was formed over the first electrode 2102. The ratio of NPB to molybdenum oxide in the layer including a composite material was adjusted to be the same as Light-emitting Element 9, and the thickness thereof was set to 20 nm.

Over the layer 2111 including a composite material, NPB was deposited to a thickness of 10 nm to form the hole-transport layer 2112.

Next, 4-(10-phenyl-9-anthryl)-4'-(9-phenyl-9H-carbazol-3-yl)triphenylamine (abbreviated to PCBAPA) was deposited to a thickness of 10 nm over the hole-transport layer 2112 by an evaporation method utilizing resistance heating, whereby a first light-emitting layer 2113A was formed. Then, by co-evaporation of 9-[4-(10-phenyl-9-anthryl)phenyl]-9H-carbazole (abbreviated to CzPA) and 4-(10-phenyl-9-anthryl)-4'-(9-phenyl-9H-carbazol-3-yl)triphenylamine (abbreviated to PCBAPA), a second light-emitting layer 2113B having a thickness of 30 nm was formed over the first light-emitting layer 2113A. The weight ratio of CzPA to PCBAPA was adjusted to 1:0.1 (=CzPA:PCBAPA).

Next, over the second light-emitting layer 2113B, BPhen was deposited to a thickness of 10 nm to form an electron-transport layer 2114A. Over the electron-transport layer 2114, LiF was deposited to a thickness of 1 nm to form the buffer layer 2115.

Next, the second electrode 2104 was formed over the buffer layer 2115. The ratio of Mg to Ag in the Mg—Ag film was adjusted to be the same as Light-emitting Element 9, and the thickness thereof was set to 10 nm. Then, an ITO film was formed to a thickness of 70 nm.

Table 7 shows element structures of Light-emitting Elements 9 to 11 manufactured as described above.

TABLE 7

| | First Electrode | | Layer including composite material | Hole-transporting Layer | Light-emitting layer | Electron-transporting layer | | Buffer layer | Second electrode | |
|---|---|---|---|---|---|---|---|---|---|---|
| Light-emitting | Al—Ti 40 nm | Ti 6 nm | NPB:Molybdenum oxide | NPB 10 nm | BAlq:NPB:Ir(tppr)2acac (=1:0.15:0.06) | Alq 10 nm | Bphen 30 nm | LiF 1 nm | Mg:Ag (=1:10) | ITO 100 nm |

TABLE 7-continued

| | First Electrode | | Layer including composite material | Hole-transporting Layer | Light-emitting layer | | | Electron-transporting layer | | Buffer layer | Second electrode | |
|---|---|---|---|---|---|---|---|---|---|---|---|---|
| element 9 | | | (=2:0.222) 40 nm | | 50 nm | | | | | | volume ratio) 10 nm | |
| Light-emitting element 10 | Al—Ti 40 nm | Ti 6 nm | NPB:Molybdenum oxide (=2:0.222) 30 nm | NPB 10 nm | CzPA:2DPAPA (=1:0.1) 30 nm | | | Alq 10 nm | Bphen 20 nm | LiF 1 nm | Mg:Ag (=1:10 volume ratio) 10 nm | ITO 70 nm |
| Light-emitting element 11 | Al—Ti 40 nm | Ti 6 nm | NPB:Molybdenum oxide (=2:0.222) 20 nm | NPB 10 nm | PCBAPA 10 nm | CzPA:PCBAPA (=1:0.1) 30 nm | | | Bphen 10 nm | LiF 1 nm | Mg:Ag (=1:10 volume ratio) 10 nm | ITO 70 nm |

In a glove box containing a nitrogen atmosphere, Light-emitting Elements 9 to 11 were sealed with a glass substrate so as not to be exposed to air. Then, operation characteristics of these light-emitting elements were measured. Note that the measurement was carried out at room temperature (in the atmosphere maintained at 25° C.).

Figure 21:
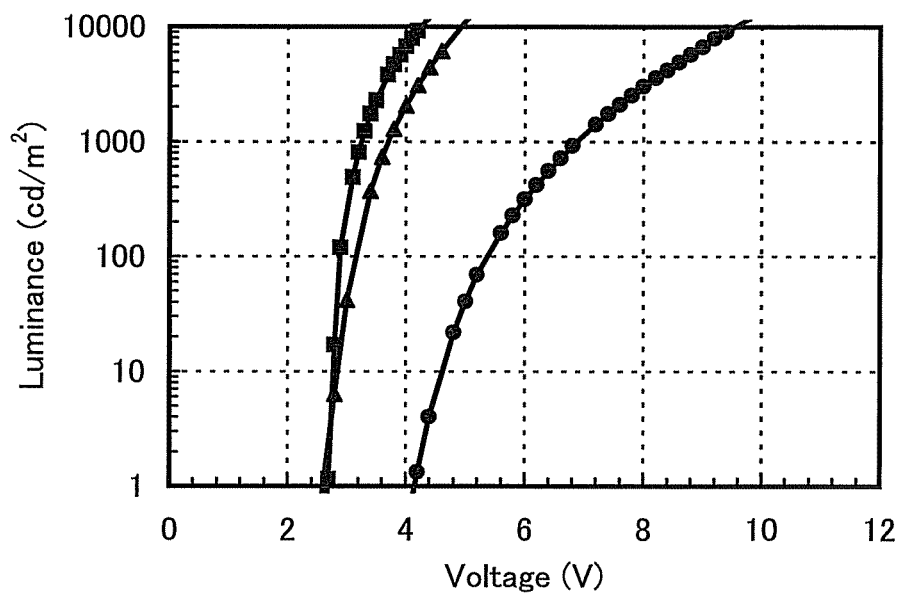
FIG. 21 shows voltage vs. luminance characteristics of the light-emitting elements formed in Example 6.
Figure 22:
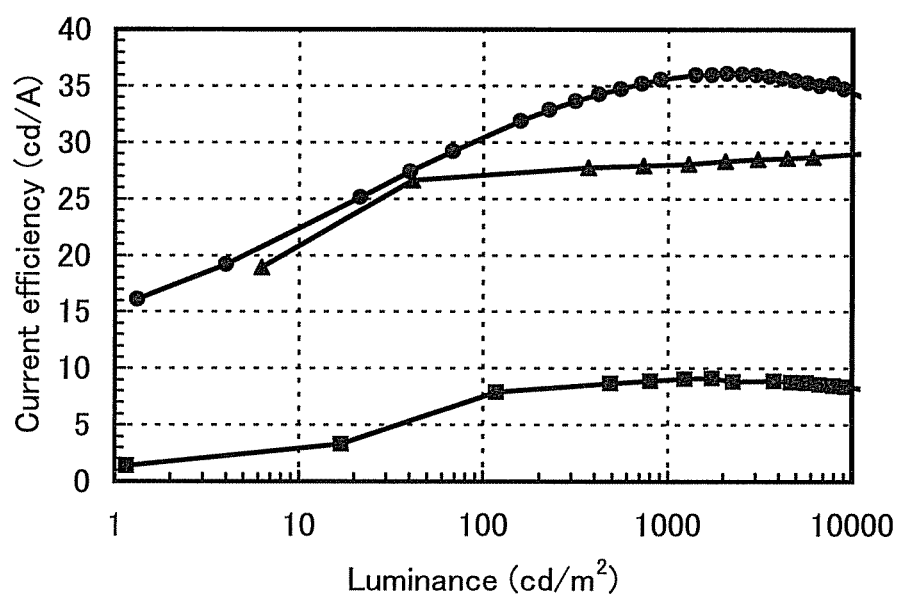
FIG. 22 shows luminance vs. current efficiency characteristics of the light-emitting elements formed in Example 6.
Figure 23:
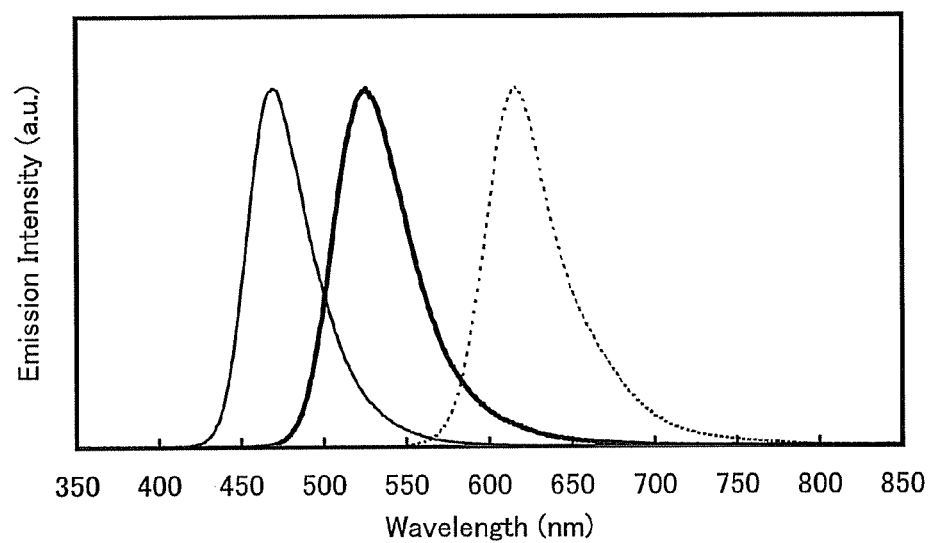
FIG. 23 shows emission spectra of the light-emitting elements formed in Example 6.

FIG. 21 shows voltage vs. luminance characteristics of Light-emitting Elements 9 (●), 10 (▲), and 11 (■). In addition, FIG. 22 shows luminance vs. current efficiency characteristics. FIG. 23 shows emission spectra obtained by injecting a current of 1 mA to the Light-emitting Elements 9 (solid line), 10 (bold line), and 11 (broken line). Further, Table 8 shows the voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

TABLE 9

| | | Chromaticity x | Chromaticity y | Current efficiency (cd/A) |
|---|---|---|---|---|
| Light-emitting element 9 | Red (Phosphorescence) | 0.66 | 0.34 | 35.5 |
| Light-emitting element 10 | Green (fluorescence) | 0.28 | 0.67 | 27.9 |
| Light-emitting element 11 | Blue (fluorescence) | 0.14 | 0.16 | 8.9 |
| Comparative example 1 | Red (Phosphorescence) | 0.67 | 0.33 | 24.0 |
| Comparative example 2 | Green (fluorescence) | 0.29 | 0.64 | 21 |
| | Blue (fluorescence) | 0.14 | 0.17 | 7 |

TABLE 8

| | Voltage (V) | Current (mA) | Current density (mA/cm$^2$) | Chromaticity x | Chromaticity y | Luminance (cd/m$^2$) | Current efficiency (cd/A) | Power efficiency (lm/W) |
|---|---|---|---|---|---|---|---|---|
| Light-emitting element 9 | 6.8 | 0.103 | 2.57 | 0.66 | 0.34 | 912 | 35.5 | 16.4 |
| Light-emitting element 10 | 3.6 | 0.105 | 2.63 | 0.28 | 0.67 | 735 | 27.9 | 24.4 |
| Light-emitting element 11 | 3.2 | 0.362 | 9.04 | 0.14 | 0.16 | 803 | 8.9 | 8.7 |

As apparent from the CIE chromaticity coordinates in Table 8 and emission spectra in FIG. 23, Light-emitting Elements 9, 10, and 11 emit red light, green light, and blue light, respectively. Moreover, Table 8 and FIG. 21 indicate that Light-emitting Elements 9 to 11 have low drive voltage.

Further, as shown in Table 8 and FIG. 22, all the light-emitting elements formed in this example exhibit high current efficiency. In particular, the current efficiency of Light-emitting Element 9 (emitting red light) is extremely high. Table 9 shows properties of the light-emitting elements of this example and the light-emitting elements of Comparative Examples. Note that the values reported in the publications are cited as those of Comparative Examples 1 and 2 (as the values of Comparative Example 1, see *OLED & Organic Electronics* (Novaled A G, 2008, p. 9) and as the values of Comparative Example 2, see "Electronic materials, organic EL" (Idemitsu Kosan Co., Ltd., http://www.idemitsu.co.jp/denzai/el/index.html [accessed Nov. 18, 2008])).

Further, as also shown in Table 9, all the light-emitting elements formed in this example exhibit high current efficiency. In particular, the current efficiency of Light-emitting Element 9 (emitting red light) is much higher than the values reported by other companies. Therefore, application of one embodiment of the present invention can provide a light-emitting element having high emission efficiency.

In addition, as can be seen from Table 8 and FIG. 21, the light-emitting elements to which one embodiment of the present invention is applied have low drive voltage and accordingly high power efficiency. Thus, by application of one embodiment of the present invention, a light-emitting element having low power consumption can be obtained.

Example 7

In this example, with reference to FIG. 13A, description is made of an example of a light-emitting element to which one embodiment of the present invention is applied. Hereinafter, methods for manufacturing the light-emitting elements of this example will be described.

(Light-Emitting Element 12)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an $N_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an $N_2$ atmosphere.

The substrate 2101 was next washed again and subjected to heat treatment at 200° C. for 1 hour in an $N_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, the layer 2111 including a composite material of an organic compound and an inorganic compound was formed over the first electrode 2102. The thickness of the layer 2111 was set to 45 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Then, by co-evaporation of bis(2-methyl-8-quinolinolato)(4-phenylphenolato)aluminum(III) (abbreviated to BAlq) 4,4'-bis[N-(1-naphthyl)-N-phenylamino]biphenyl (abbreviated to NPB), and (acetylacetonato)bis(2,3,5-triphenylpyrazinato)iridium(III) (abbreviated to Ir(tppr)$_2$(acac)), the light-emitting layer 2113 was formed over the hole-transport layer 2112 to a thickness of 50 nm. Here, the weight ratio of BAlq to NPB and Ir(tppr)$_2$(acac) was adjusted to 1:0.15:0.06 (=BAlq:Ir(tppr)$_2$(acac)).

Next, tris(8-quinolinolato)aluminum(III) (abbreviated to Alq) was deposited to a thickness of 10 nm over the light-emitting layer 2113 by an evaporation method utilizing resistance heating, whereby the first electron-transport layer 2114A was formed. Next, bathophenanthroline (abbreviated to BPhen) was deposited to a thickness of 30 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 10:1 (=Ag:Mg). Next, a 100-nm-thick ITO film was formed by a sputtering method, using indium oxide-tin oxide (ITO: indium tin oxide) as a target (the $SnO_2$ content in the target being 10 weight %).

(Comparative Light-Emitting Element 13)

In a similar way to that of Light-emitting Element 12, the first electrode 2102 was formed, heat treatment and the like were performed, and then the layer 2111 including a composite material was formed over the first electrode 2102. The ratio of NPB to molybdenum oxide in the layer including a composite material was adjusted to be the same as Light-emitting Element 12, and the thickness thereof was set to 30 nm.

Over the layer 2111 including a composite material, NPB was deposited to a thickness of 10 nm to form the hole-transport layer 2112.

Then, by co-evaporation of 9-[4-(10-phenyl-9-anthryl)phenyl]-9H-carbazole (abbreviated to CzPA) and N-(9,10-diphenyl-2-anthryl)-N,9-diphenyl-9H-carbazol-3-amine (abbreviated to 2PCAPA), the light-emitting layer 2113 was formed over the hole-transport layer 2112 to a thickness of 30 nm. Here, the weight ratio of CzPA to 2PCAPA was adjusted to 1:0.1 (=CzPA:2PCAPA).

Next, over the light-emitting layer 2113, Alq was deposited to a thickness of 10 nm to form the first electron-transport layer 2114A. Then, BPhen was deposited to a thickness of 20 nm to form the second electron-transport layer 2114B. Over the second electron-transport layer 2114B, LiF was deposited to a thickness of 1 nm to form the buffer layer 2115.

Next, the second electrode 2104 was formed over the buffer layer 2115. The ratio of Mg to Ag in the Mg—Ag film was adjusted to be the same as Light-emitting Element 12, and the thickness thereof was set to 10 nm. Then, an ITO film was formed to a thickness of 100 nm.

(Light-Emitting Element 14)

In a similar way to that of Light-emitting Element 12, the first electrode 2102 was formed, heat treatment and the like were performed, and then the layer 2111 including a composite material was formed over the first electrode 2102. The ratio of NPB to molybdenum oxide in the layer including a composite material was adjusted to be the same as Light-emitting Element 12, and the thickness thereof was set to 10 nm.

Over the layer 2111 including a composite material, NPB was deposited to a thickness of 10 nm to form the hole-transport layer 2112.

Next, 4-(10-phenyl-9-anthryl)-4'-(9-phenyl-9H-carbazol-3-yl)triphenylamine (abbreviated to PCBAPA) was deposited to a thickness of 10 nm over the hole-transport layer 2112 by an evaporation method utilizing resistance heating, whereby a first light-emitting layer 2113A was formed. Then, by co-evaporation of 9-[4-(10-phenyl-9-anthryl)phenyl]-9H-carbazole (abbreviated to CzPA) and 4-(10-phenyl-9-anthryl)-4'-(9-phenyl-9H-carbazol-3-yl)triphenylamine (abbreviated to PCBAPA), a second light-emitting layer 2113B having a thickness of 30 nm was formed over the first light-emitting layer 2113A. The weight ratio of CzPA to PCBAPA was adjusted to 1:0.1 (=CzPA:PCBAPA).

Next, over the second light-emitting layer 2113B, BPhen was deposited to a thickness of 10 nm to form an electron-transport layer 2114A. Over the electron-transport layer 2114, LiF was deposited to a thickness of 1 nm to form the buffer layer 2115.

Next, the second electrode 2104 was formed over the buffer layer 2115. The ratio of Mg to Ag in the Mg—Ag film was adjusted to be the same as Light-emitting Element 2, and the thickness thereof was set to 10 nm. Then, an ITO film was formed to a thickness of 70 nm.

Table 10 shows element structures of Light-emitting Elements 12 to 14 manufactured as described above.

Element 14, blue light emission having a chromaticity near the blue-color chromaticity defined by NTSC (National Television Standards Committee), i.e., (x, y)=(0.14, 0.08), was able to be obtained.

TABLE 10

| | First Electrode | | Layer including composite material | Hole-transporting Layer | Light-emitting layer | | Electron-transporting layer | | Buffer layer | Second electrode | |
|---|---|---|---|---|---|---|---|---|---|---|---|
| Light-emitting element 12 | Al—Ti 40 nm | Ti 6 nm | NPB:Molybdenum oxide (=2:0.222) 45 nm | NPB 10 nm | BAlq:NPB:Ir(tppr)2acac (=1:0.15:0.06) 50 nm | | Alq 10 nm | Bphen 30 nm | LiF 1 nm | Mg:Ag (=1:10 volume ratio) 10 nm | ITO 100 nm |
| Light-emitting element 13 | Al—Ti 40 nm | Ti 6 nm | NPB:Molybdenum oxide (=2:0.222) 30 nm | NPB 10 nm | CzPA:2PCAPA (=1:0.1) 30 nm | | Alq 10 nm | Bphen 20 nm | LiF 1 nm | Mg:Ag (=1:10 volume ratio) 10 nm | ITO 100 nm |
| Light-emitting element 14 | Al—Ti 40 nm | Ti 6 nm | NPB:Molybdenum oxide (=2:0.222) 10 nm | NPB 10 nm | PCBAPA 10 nm | CzPA:PCBAPA (=1:0.1) 30 nm | | Bphen 10 nm | LiF 1 nm | Mg:Ag (=1:10 volume ratio) 10 nm | ITO 70 nm |

In a glove box containing a nitrogen atmosphere, Light-emitting Elements 12 to 14 were sealed with a glass substrate so as not to be exposed to air. Then, operation characteristics of these light-emitting elements were measured. Note that the measurement was carried out at room temperature (in the atmosphere maintained at 25° C.).

Figure 24:
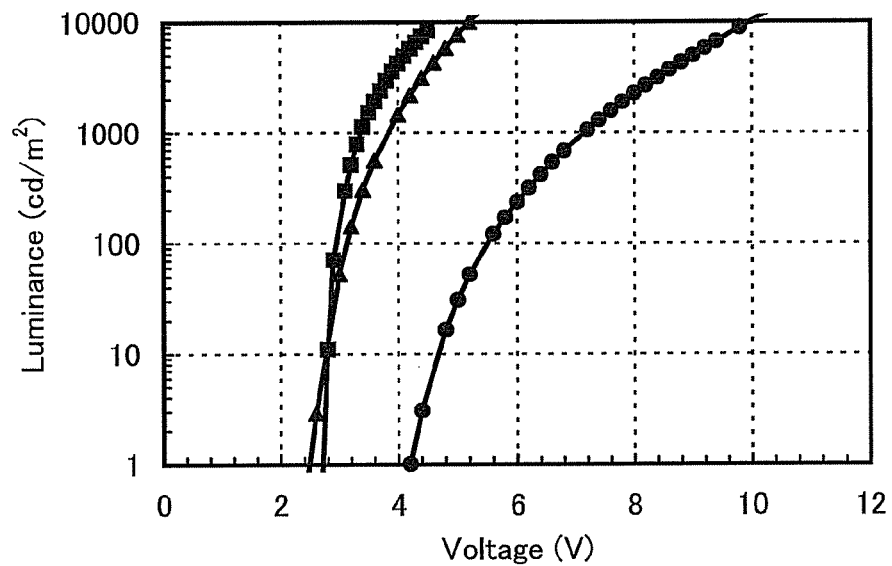
FIG. 24 shows voltage vs. luminance characteristics of the light-emitting elements formed in Example 7.
Figure 25:
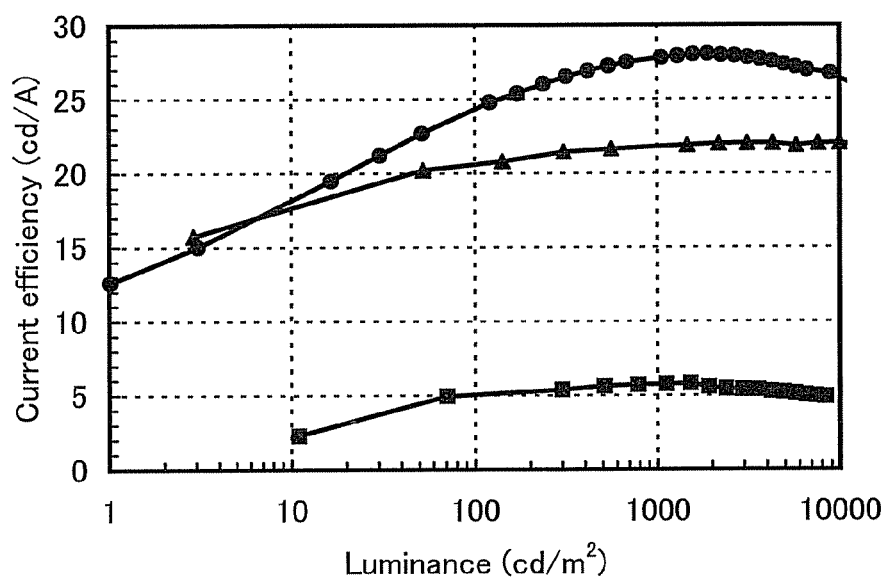
FIG. 25 shows luminance vs. current efficiency characteristics of the light-emitting elements formed in Example 7.
Figure 26:
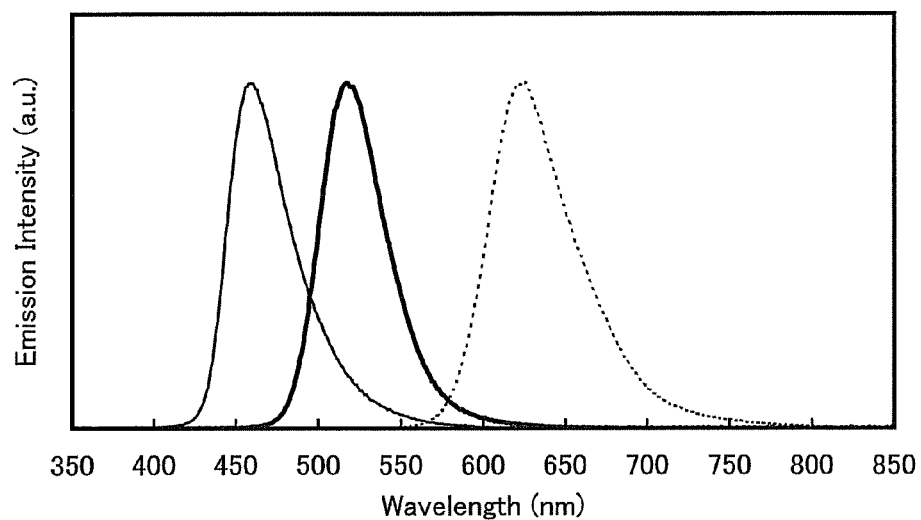
FIG. 26 shows emission spectra of the light-emitting elements Ruined in Example 7.
Figure 27:
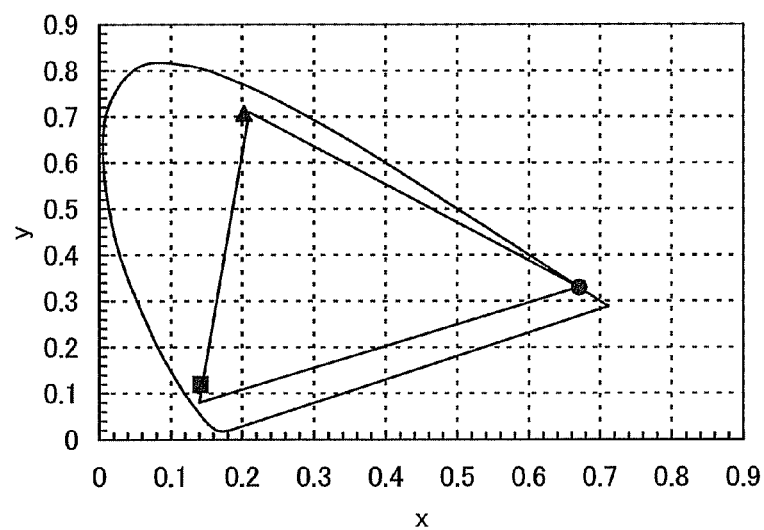
FIG. 27 shows the CIE chromaticity coordinates (x, y) of the light-emitting elements formed in Example 7.

FIG. 24 shows voltage vs. luminance characteristics of Light-emitting Elements 12 (●), 13 (▲) to 14 (■). In addition, FIG. 25 shows luminance vs. current efficiency characteristics. FIG. 26 shows emission spectra obtained by injecting a current of 1 mA to the Light-emitting Elements 12 (broken line), 13 (bold line), and 14 (solid line). In addition, FIG. 27 shows the CIE chromaticity coordinates (x, y) at a luminance of around 1000 cd/m². Further, Table 11 shows the voltage (V), current (mA), current density (mA/cm²), CIE chromaticity coordinates (x, y), current efficiency (cd/A), and power efficiency (lm/W) of each light-emitting element at a luminance of around 1000 cd/m².

From FIG. 27, Light-emitting Elements 12 to 14 formed in this example are found to occupy 99.7% of the NTSC color gamut. This means that the light-emitting elements to which one embodiment of the present invention is applied can exhibit light emission with excellent color purity. Hence, by applying the light-emitting element according to one embodiment of the present invention to a display device, the display device can have excellent color reproducibility.

Further, as also shown in Table 11 and FIG. 25, all the light-emitting elements formed in this example exhibit high current efficiency. Therefore, application of one embodiment of the present invention can provide a light-emitting element having high emission efficiency.

In addition, as can be seen from Table 11 and FIG. 24, the light-emitting elements to which one embodiment of the present invention is applied have low drive voltage and accordingly high power efficiency. Thus, by application of

TABLE 11

| | Voltage (V) | Current (mA) | Current density (mA/cm²) | Chromaticity x | Chromaticity y | Luminance (cd/m²) | Current efficiency (cd/A) | Power efficiency (lm/W) |
|---|---|---|---|---|---|---|---|---|
| Light-emitting element 12 | 7.2 | 0.152 | 3.81 | 0.67 | 0.33 | 1058 | 27.8 | 12.1 |
| Light-emitting element 13 | 3.6 | 0.103 | 2.58 | 0.20 | 0.71 | 559 | 21.7 | 18.9 |
| Light-emitting element 14 | 3.4 | 0.779 | 19.48 | 0.14 | 0.12 | 1122 | 5.8 | 5.3 |

As apparent from Table 11, the emission spectra in FIG. 26, and FIG. 27, Light-emitting Elements 12, 13, and 14 emit red light, green light, and blue light, respectively. With Light-emitting Element 12, red light emission having a chromaticity near the red-color chromaticity defined by NTSC (National Television Standards Committee, shown as a triangle in FIG. 27), i.e., (x, y)=(0.67, 0.33), was able to be obtained. With Light-emitting Element 13, green light emission having a chromaticity near the green-color chromaticity defined by NTSC (National Television Standards Committee), i.e., (x, y)=((0.21, 0.71), was able to be obtained. With Light-emitting one embodiment of the present invention, a light-emitting element having low power consumption can be obtained.

Example 8

In this example, with reference to FIG. 13A, description is made of an example of a light-emitting element to which one embodiment of the present invention is applied. Hereinafter, methods for manufacturing the light-emitting elements of this example will be described.

(Light-Emitting Element 15)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an $N_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an $N_2$ atmosphere.

The substrate 2101 was next washed again and subjected to heat treatment at 200° C. for 1 hour in an $N_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about $10^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, the layer 2111 including a composite material of an organic compound and an inorganic compound was formed over the first electrode 2102. The thickness of the layer 2111 was set to 200 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Then, by co-evaporation of 9-[4-(10-phenyl-9-anthryl) phenyl]-9H-carbazole (abbreviated to CzPA) and N-(9,10-diphenyl-2-anthryl)-N,N',N'-triphenyl-1,4-phenylenediamine (abbreviated to 2DPAPA), the light-emitting layer 2113 was formed over the hole-transport layer 2112 to a thickness of 30 nm. Here, the weight ratio of CzPA to 2DPAPA was adjusted to 1:0.1 (=CzPA:2DPAPA).

Next, by co-evaporation of tris(8-quinolinolato)aluminum (III) (abbreviated to Alq) and N,N-diphenylquinacridone (abbreviated to DPQd), the first electron-transport layer 2114A for controlling transport of electrons which has a thickness of 10 nm was formed over the light-emitting layer 2113. Here, the weight ratio of Alq to DPQd was adjusted to 1:0.005 (=Alq:DPQd).

Next, bathophenanthroline (abbreviated to BPhen) was deposited to a thickness of 20 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 9:1 (=Ag:Mg). Next, a 70-nm-thick ITO film was formed by a sputtering method, using indium oxide-tin oxide (ITO: indium tin oxide) as a target (the $SnO_2$ content in the target being 10 weight %).

(Light-Emitting Element 16)

The first electrode was formed using a stack of an Al—Ni—La film and a Ti film. In other words, a 300-nm-thick Al—Ni—La film was formed over a glass substrate by a sputtering method, using Al—Ni—La as a target (the nickel content being 2 atomic % and the lanthanum content being 0.35 atomic % in the target). Next, using titanium (Ti) as a target, a 6-nm-thick Ti film was formed over the Al—Ni—La film by a sputtering method. Further, the volume ratio of Ag to Mg in the Mg—Ag film was adjusted to 10:1 (=Ag:Mg). Except for these, Light-emitting Element 16 was formed in a manner similar to that of Light-emitting Element 15.

Table 12 shows element structures of Light-emitting Elements 15 and 16 which were formed as described above.

TABLE 12

| | First Electrode | | Layer including composite material | Hole-transporting Layer | Light-emitting layer | Electron-transporting layer | Buffer layer | Second electrode | |
|---|---|---|---|---|---|---|---|---|---|
| Light-emitting element 15 | Al—Ti 40 nm | Ti 6 nm | NPB:Molybdenum oxide (=2:0.222) 200 nm | NPB 10 nm | CzPA:2DPAPA (=1:0.1) 30 nm | Alq:DPQd (=1:0.005) 10 nm | Bphen 20 nm | LiF 1 nm | Mg:Ag (=1:9 volume ratio) 10 nm | ITO 70 nm |
| Light-emitting element 16 | Al—Ni—La 300 nm | Ti 6 nm | NPB:Molybdenum oxide (=2:0.222) 2O0 nm | NPB 10 nm | CzPA:2DPAPA (=1:0.1) 30 nm | Alq:DPQd (=1:0.005) 10 nm | Bphen 20 nm | LiF 1 nm | Mg:Ag (=1:10 volume ratio) 10 nm | ITO 70 nm |

In a glove box containing a nitrogen atmosphere, Light-emitting Elements 15 and 16 were with a glass substrate so as not to be exposed to air. Then, operation characteristics of these light-emitting elements were measured. Note that the measurement was carried out at room temperature (in the atmosphere maintained at 25° C.).

Figure 29:
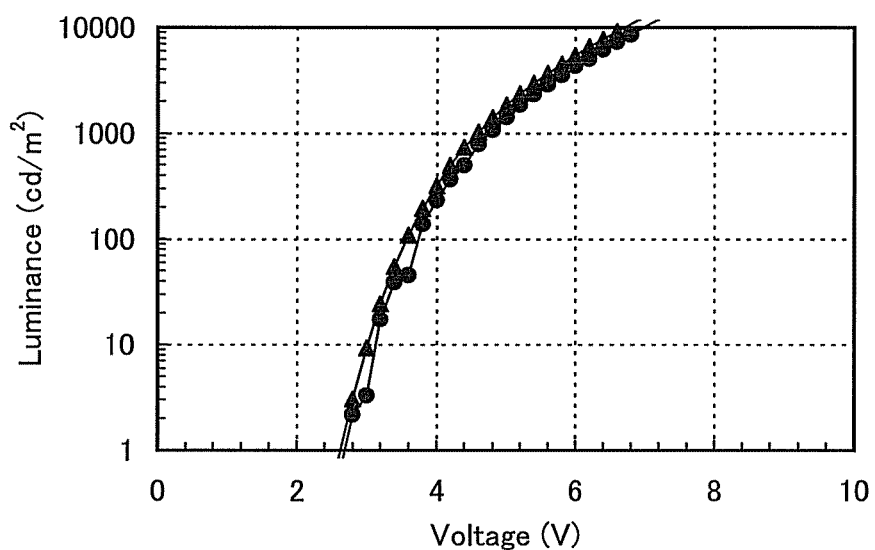
FIG. 29 shows voltage vs. luminance characteristics of the light-emitting elements formed in Example 8.
Figure 30:
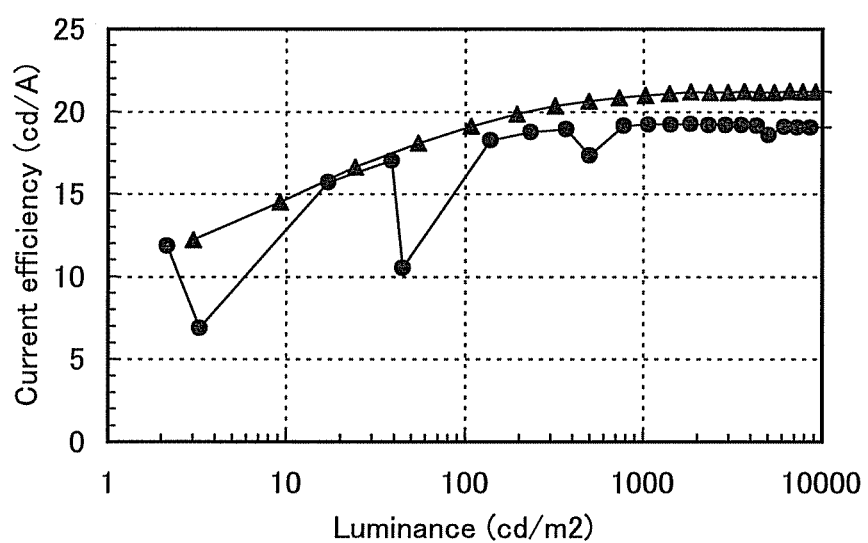
FIG. 30 shows luminance vs. current efficiency characteristics of the light-emitting elements formed in Example 8.

FIG. 29 shows voltage vs. luminance characteristics of Light-emitting Elements 15 (●) and 16 (▲). In addition, FIG. 30 shows luminance vs. current efficiency characteristics. Further, Table 13 shows voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

TABLE 13

|  | Voltage (V) | Current (mA) | Current density (mA/cm$^2$) | Chromaticity x | Chromaticity y | Luminance (cd/m$^2$) | Current efficiency (cd/A) | Power efficiency (lm/W) |
|---|---|---|---|---|---|---|---|---|
| Light-emitting element 15 | 4.8 | 0.224 | 5.60 | 0.25 | 0.71 | 1074 | 19.2 | 12.6 |
| Light-emitting element 16 | 4.6 | 0.196 | 4.90 | 0.25 | 0.71 | 1027 | 21.0 | 14.3 |

From the CIE chromaticity coordinates in Table 13, it is understood that Light-emitting Elements 15 and 16 both emit green light. Further, as apparent from Table 13, FIG. 29, and FIG. 30, Light-emitting Elements 15 and 16 exhibit similar current efficiencies and drive voltages. Thus, in one embodiment of the present invention, each of an Al—Ti film and an Al—Ni—La film can be preferably used as a material for the first electrode. Also, as shown in Table 13 and FIG. 29, the light-emitting elements formed in this example have low drive voltage and thus have high power efficiency. Therefore, application of one embodiment of the present invention can provide a light-emitting element having low power consumption.

Example 9

Figure 13C:
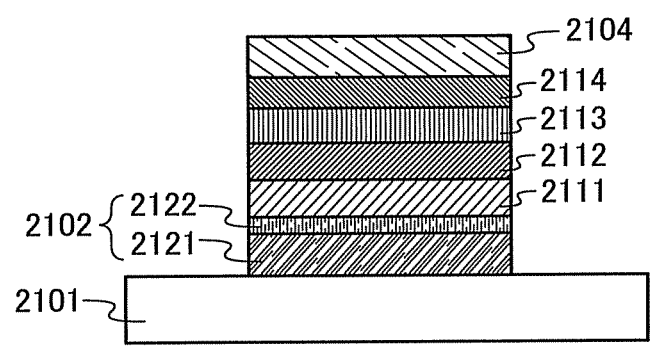

In this example, with reference to FIGS. 13A and 13C, description is made of an example of a light-emitting element to which one embodiment of the present invention is applied. FIG. 13A is used in the description of Light-emitting Elements 17 and 18, and FIG. 13C is used in the description of Light-emitting Element 19. Hereinafter, methods for manufacturing the light-emitting elements of this example will be described.

(Light-Emitting Element 17)

A first electrode 2102 was formed over a glass substrate 2101. First, a 40-nm-thick Al—Ti film 2121 was formed over the glass substrate by a sputtering method, using Al—Ti as a target (the titanium content in the target being 1 weight %). Next, using titanium (Ti) as a target, a 6-nm-thick Ti film 2122 was formed over the Al—Ti film 2121 by a sputtering method.

Then, the substrate 2101 was washed and subjected to heat treatment at 250° C. for 1 hour in an N$_2$ atmosphere.

Next, to form a partition, photosensitive polyimide was applied, exposed to light, and developed. Accordingly, a partition having an opening portion that was 2 mm square was formed. The area of the first electrode was thus 2 mm square. This was followed by heat treatment at 300° C. for 1 hour in an N$_2$ atmosphere.

The substrate 2101 was next washed again and subjected to heat treatment at 200° C. for 1 hour in an N$_2$ atmosphere. After that, UV ozone cleaning was carried out.

Next, the substrate 2101 was fixed to a substrate holder provided in a vacuum evaporation apparatus such that the side on which the first electrode 2102 was formed faced downward. The substrate 2101 was moved to a heating chamber, in which the pressure was then reduced to about 10$^{-4}$ Pa. Vacuum heat treatment was performed at 170° for 30 minutes.

Then, the substrate 2101 was moved to a film formation chamber. By co-evaporation of 4,4'-bis[N-(1-naphthyl)-N-phenylamino]biphenyl (abbreviated to NPB) and molybdenum(VI) oxide, the layer 2111 including a composite material of an organic compound and an inorganic compound was formed over the first electrode 2102. The thickness of the layer 2111 was set to 190 nm and the weight ratio of NPB to molybdenum(VI) oxide was adjusted to 2:0.222 (=NPB:molybdenum oxide).

Next, 4,4'-bis[N-(1-naphthyl)-N-phenylamino]biphenyl (abbreviated to NPB) was deposited to a thickness of 10 nm over the layer 2111 including a composite material by an evaporation method utilizing resistance heating to form the hole-transport layer 2112.

Then, by co-evaporation of 9-[4-(10-phenyl-9-anthryl)phenyl]-9H-carbazole (abbreviated to CzPA) and N-(9,10-diphenyl-2-anthryl)-N,9-diphenyl-9H-carbazol-3-amine (abbreviated to 2PCAPA), the light-emitting layer 2113 was formed over the hole-transport layer 2112 to a thickness of 30 nm. Here, the weight ratio of CzPA to 2PCAPA was adjusted to 1:0.05 (=CzPA:2PCAPA).

Next, by co-evaporation of tris(8-quinolinolato)aluminum (III) (abbreviated to Alq) and N,N'-diphenylquinacridone (abbreviated to DPQd), the first electron-transport layer 2114A for controlling transport of electrons which has a thickness of 10 nm was formed over the light-emitting layer 2113. Here, the weight ratio of Alq to DPQd was adjusted to 1:0.005 (=Alq:DPQd).

Next, bathophenanthroline (abbreviated to BPhen) was deposited to a thickness of 20 nm over the first electron-transport layer 2114A by an evaporation method utilizing resistance heating, whereby the second electron-transport layer 2114B was formed.

Next, lithium fluoride (LiF) was deposited to a thickness of 1 nm over the second electron-transport layer 2114B by an evaporation method using resistance heating to form the buffer layer 2115.

Next, the second electrode 2104 was formed over the buffer layer 2115. First, by co-evaporation of magnesium (Mg) and silver (Ag), a 10-nm-thick film of magnesium-silver (hereinafter, referred to as Mg—Ag) was formed over the buffer layer 2115. Here, the volume ratio of Ag to Mg was adjusted to 9:1 (=Ag:Mg). Next, a 70-nm-thick ITO film was formed by a sputtering method, using indium oxide-tin oxide (ITO: indium tin oxide) as a target (the SnO$_2$ content in the target being 10 weight %).

(Light-Emitting Element 18)

Light-emitting Element 18 was formed in a manner similar to that of Light-emitting Element 17, except that the second electrode was formed using an Ag film. In other words, as the second electrode 2104, a 10-nm-thick Ag film was formed.

(Light-Emitting Element 19)

Light-emitting Element 19 was formed in a manner similar to that of Light-emitting Element 17, except that the buffer layer was not formed. In other words, the second electrode 2104 was formed over the second electron-transport layer 2114B.

Table 14 shows element structures of Light-emitting Elements 17 to 19 manufactured as described above.

TABLE 14

| | First Electrode | | Layer including composite material | Hole-transporting Layer | Light-emitting layer | | Electron-transporting layer | Buffer layer | | Second electrode |
|---|---|---|---|---|---|---|---|---|---|---|
| Light-emitting element 17 | Al—Ti 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Mg:Ag (=1:9 volume ratio) 10 nm | ITO 70 nm |
| Light-emitting element 18 | Al—Ti 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | LiF 1 nm | Ag 10 nm | ITO 70 nm |
| Light-emitting element 19 | Al—Ti 40 nm | Ti 6 nm | NPB:Molybdenum oxide (=2:0.222) 190 nm | NPB 10 nm | CzPA:2PCAPA (=1:0.05) 30 nm | Alq:DPQd (=1:0.005) 10 nm | Bphen 20 nm | | Mg:Ag (=1:9 volume ratio) 10 nm | ITO 70 nm |

In a glove box containing a nitrogen atmosphere, Light-emitting Elements 17 to 19 were sealed with a glass substrate so as not to be exposed to air. Then, operation characteristics of these light-emitting elements were measured. Note that the measurement was carried out at room temperature (in the atmosphere maintained at 25° C.).

Figure 31:
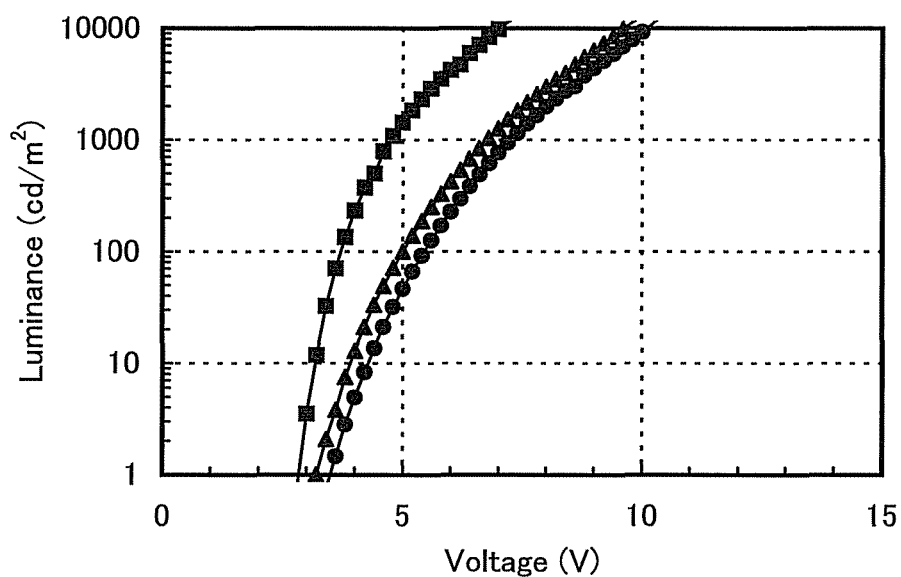
FIG. 31 shows voltage vs. luminance characteristics of the light-emitting elements formed in Example 9.
Figure 32:
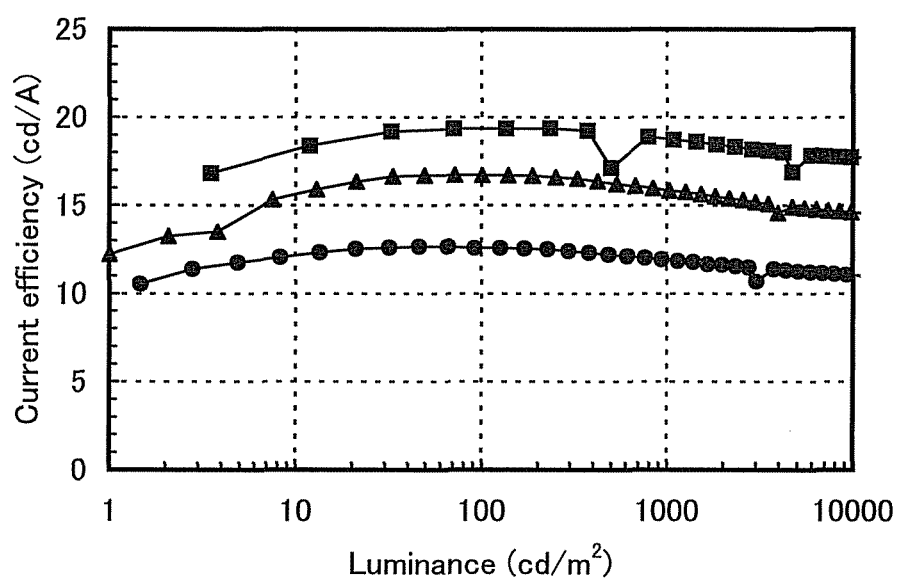
FIG. 32 shows luminance vs. current efficiency characteristics of the light-emitting elements formed in Example 9.

FIG. 31 shows voltage vs. luminance characteristics of Light-emitting Elements 17 (■), 18 (●), and 19 (▲). In addition, FIG. 32 shows luminance vs. current efficiency characteristics. Further, Table 15 shows voltage (V), current (mA), current density (mA/cm$^2$), CIE chromaticity coordinates (x, y), current efficiency (cd/A), and power efficiency (lm/W) of each light-emitting element at a luminance of around 1000 cd/m$^2$.

TABLE 15

| | Voltage (V) | Current (mA) | Current density (mA/cm$^2$) | Chromaticity x | Chromaticity y | Luminance (cd/m$^2$) | Current efficiency (cd/A) | Power efficiency (lm/W) |
|---|---|---|---|---|---|---|---|---|
| Light-emitting element 17 | 4.8 | 0.23 | 5.79 | 0.24 | 0.71 | 1085 | 18.7 | 12.3 |
| Light-emitting element 18 | 7.2 | 0.32 | 7.89 | 0.24 | 0.72 | 941 | 11.9 | 5.21 |
| Light-emitting element 19 | 6.8 | 0.26 | 6.53 | 0.24 | 0.71 | 1034 | 15.8 | 7.32 |

As can be seen from the CIE chromaticity coordinates in Table 15, each light-emitting element provides green light emission. In addition, as can be seen from Table 15 and FIG. 31, Light-emitting Elements 17 shows a marked decrease in drive voltage compared to Light-emitting Element 18. Furthermore, as can be seen from Table 15 and FIG. 32, the current efficiency of Light-emitting Elements 17 significantly increases compared to Light-emitting Element 18. This indicates that the use of a Mg—Ag film for the cathode facilitates electron injection to the EL layer. Thus, in one embodiment of the present invention, a Mg—Ag film is preferably used as the cathode. The use of a Mg—Ag film facilitates electron injection from the second electrode, which leads to a reduction in drive voltage and an increase in current efficiency. As described above, application of one embodiment of the present invention can provide a light-emitting element having low drive voltage while maintaining high emission efficiency.

Moreover, as can be seen from Table 15, FIG. 31 and FIG. 32, Light-emitting Elements 17 exhibits lower drive voltage and higher current efficiency than Light-emitting Element 19. This is because the provision of the buffer layer facilitates electron injection. Thus, in the present invention, the light-emitting element preferably includes the buffer layer. Therefore, by application of one embodiment of the present invention, a light-emitting element having high emission efficiency and low power consumption can be obtained.

Figure 33:
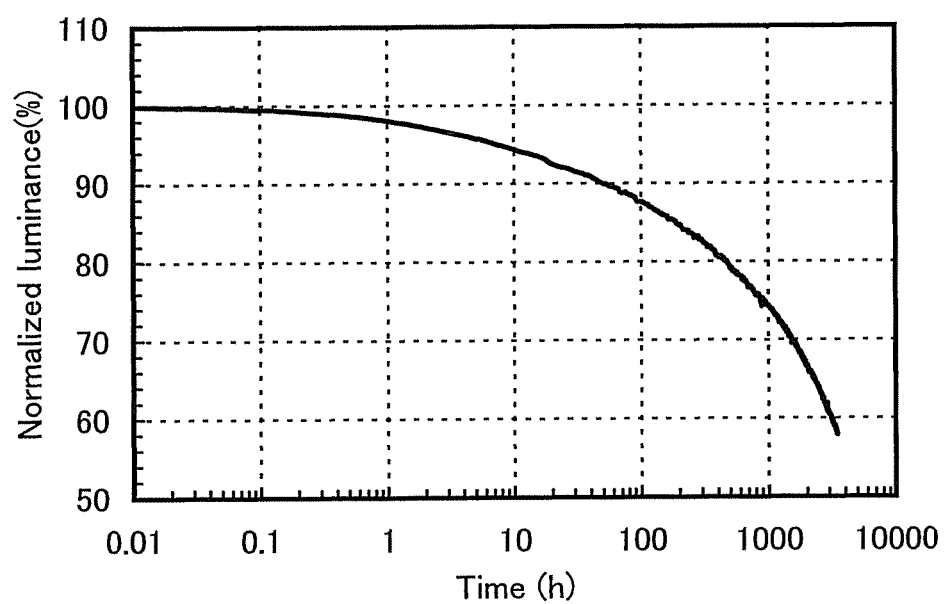
FIG. 33 shows driving test results of the light-emitting element formed in Example 9.

Next, a reliability test of Light-emitting Element 17 was carried out. Results of the reliability test are shown in FIG. 33. In FIG. 33, the vertical axis represents normalized luminance (%) on the assumption that an initial luminance is 100%, and the horizontal axis represents driving time (h) of the light-emitting elements. The reliability tests were carried out by driving Light-emitting Element 17 of this example at a constant current density under the conditions that an initial luminance was set at 5000 cd/m$^2$. FIG. 33 shows that Light-emitting Element 17 keeps 79% of the initial luminance after the driving for approximately 500 hours. Therefore, it is confirmed that Light-emitting Element 17 shows high reliability. Furthermore, the results of the reliability tests show that a light-emitting element to which one embodiment of the present invention is applied is effective in realizing a light-emitting element with long lifetime.

This application is based on Japanese Patent Application serial no. 2008-296047 filed with Japan Patent Office on Nov. 19, 2008, the entire contents of which are hereby incorporated by reference.

What is claimed is:
1. A light-emitting element comprising:
a reflective anode over a substrate, the reflective anode comprising a film of an alloy including aluminum and a titanium film including titanium oxide;
a layer including a composite material over the reflective anode;

a light-emitting layer over the layer including the composite material;
a buffer layer over the light-emitting layer; and
a cathode having a light-transmitting property over the buffer layer,
wherein the film of the alloy including aluminum includes nickel and lanthanum,
wherein the titanium film including titanium oxide is provided between the film of the alloy including aluminum and the layer including the composite material,
wherein the titanium film including titanium oxide is in direct contact with the layer including the composite material,
wherein the composite material includes a metal oxide and an organic compound,
wherein the cathode is a stack of a film of an alloy including magnesium and silver and a film having a light-transmitting property, and
wherein the buffer layer is in contact with the film including magnesium and silver.

2. The light-emitting element according to claim 1,
wherein the film having a light-transmitting property is any one of an indium oxide-tin oxide film, an indium oxide-tin oxide film including silicon or silicon oxide, an indium oxide-zinc oxide film, an indium oxide film including tungsten oxide and zinc oxide, a molybdenum oxide film, a tin oxide film, a zinc oxide film, a magnesium oxide film, a silicon oxide film, an aluminum oxide film, a titanium oxide film, a zirconium oxide film, a silicon nitride film, an aluminum nitride film, a titanium nitride film, a zirconium nitride film, a silicon carbide film, and an aluminum carbide film.

3. The light-emitting element according to claim 1,
wherein the buffer layer includes at least one of an alkali metal, an alkaline earth metal, and a rare-earth metal.

4. The light-emitting element according to claim 1,
wherein a volume ratio of silver to magnesium in the film of an alloy including magnesium and silver is 8:2 or higher.

5. The light-emitting element according to claim 1,
wherein the film of an alloy including aluminum is a film of an alloy of aluminum and titanium, a film of an alloy of aluminum and neodymium, or a film of an alloy of aluminum and nickel.

6. The light-emitting element according to claim 1,
wherein the metal oxide is molybdenum oxide.

7. A light-emitting element according to claim 1,
wherein the light-emitting element is incorporated into a light-emitting device, and
wherein the light-emitting device further comprises a control circuit configured to control light emission from the light-emitting element.

8. A light-emitting element according to claim 1,
wherein the light-emitting element is incorporated into a display portion of an electronic device, and
wherein the display portion further comprises a control circuit configured to control light emission from the light-emitting element.

9. A light-emitting element according to claim 7, wherein the light-emitting element is incorporated into a lighting device.

* * * * *